US012805131B2

(12) United States Patent
Shin et al.

(10) Patent No.: US 12,805,131 B2
(45) Date of Patent: Nov. 17, 2026

(54) DISPLAY APPARATUS AND METHOD OF MANUFACTURING THE SAME

(71) Applicant: Samsung Display Co., LTD., Yongin-si (KR)

(72) Inventors: Dongchul Shin, Yongin-si (KR); Seongwon Kim, Yongin-si (KR); Jangyeol Yoon, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 280 days.

(21) Appl. No.: 18/405,786

(22) Filed: Jan. 5, 2024

(65) Prior Publication Data

US 2024/0251614 A1 Jul. 25, 2024

(30) Foreign Application Priority Data

Jan. 20, 2023 (KR) ........................ 10-2023-0009024

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/124* (2023.02); *H10K 2102/311* (2023.02)

(58) Field of Classification Search
CPC ............. H10K 59/131; H10K 59/1201; H10K 59/124; H10K 2102/311; H10K 50/844; H10K 71/80; H10K 59/12; H10K 71/00; H10K 77/111; H10K 59/122; H10K 59/126; H10K 59/30; H10K 59/8051;
(Continued)

(56) References Cited

U.S. PATENT DOCUMENTS

| | | | |
|---|---|---|---|
| 9,536,860 | B2 | 1/2017 | Yoon et al. |
| 9,806,272 | B2 | 10/2017 | Seo et al. |

(Continued)

FOREIGN PATENT DOCUMENTS

| | | | |
|---|---|---|---|
| CN | 110603644 A | 12/2019 | |
| KR | 1020160145898 A | 12/2016 | |

(Continued)

OTHER PUBLICATIONS

Bian et al., "Theoretical and experimental studies of laser lift-off of nonwrinkled ultrathin polyimide film for flexible electronics," Applied Surface Science 499 (2020), 11 pages.

*Primary Examiner* — Tong-Ho Kim
(74) *Attorney, Agent, or Firm* — CANTOR COLBURN LLP

(57) ABSTRACT

A method of manufacturing a display apparatus includes preparing a carrier substrate including a display area, a connection area, a dummy area, and a cut area, forming inorganic pattern layers in the display area or the connection area of the carrier substrate, forming a substrate layer on the inorganic pattern layers, forming a first insulating layer on the substrate layer, removing the first insulating layer and the substrate layer arranged in the cut area, and separating the substrate layer from the carrier substrate. The inorganic pattern layers overlap at least one of the display area and the connection area.

18 Claims, 44 Drawing Sheets

(51) Int. Cl.
*H10K 59/124* (2023.01)
*H10K 102/00* (2023.01)

(58) Field of Classification Search
CPC .. H10K 59/8052; H10K 59/873; H10K 59/88; G09F 9/301; G09F 9/335
USPC ........................................................... 257/91
See application file for complete search history.

(56) References Cited

U.S. PATENT DOCUMENTS

| | | | |
|---|---|---|---|
| 10,310,560 B2 | 6/2019 | Choi et al. | |
| 2018/0046221 A1* | 2/2018 | Choi ...................... | H05B 33/22 |
| 2019/0229282 A1* | 7/2019 | Zhang .................. | H10K 77/111 |
| 2021/0335951 A1 | 10/2021 | Wang et al. | |
| 2023/0088187 A1* | 3/2023 | Sui ....................... | H10K 59/131<br>257/40 |
| 2023/0172040 A1 | 6/2023 | Chung et al. | |

FOREIGN PATENT DOCUMENTS

| | | | |
|---|---|---|---|
| KR | 101810050 | B1 | 12/2017 |
| KR | 1020200126190 | A | 11/2020 |
| KR | 102271598 | B1 | 7/2021 |
| KR | 1020230081811 | A | 6/2023 |
| WO | 2021022490 | A1 | 2/2021 |

* cited by examiner

DISPLAY APPARATUS AND METHOD OF MANUFACTURING THE SAME

This application claims priority to Korean Patent Application No. 10-2023-0009024, filed on Jan. 20, 2023, and all the benefits accruing therefrom under 35 U.S.C. § 119, the content of which in its entirety is herein incorporated by reference.

BACKGROUND

1. Field

Embodiments relate to a display apparatus and a method of manufacturing the display apparatus.

2. Description of the Related Art

Mobile electronic apparatuses are widely used. As mobile electronic apparatuses, recently, tablet personal computers are being widely used as well as miniaturized electronic apparatuses such as mobile phones.

To provide various functions, e.g., to provide a user with visual information, such as images, the mobile electronic apparatuses include a display apparatus. Recently, as parts which drive a display apparatus are miniaturized, a portion of the display apparatus in electronic apparatuses is being gradually increased.

Recently, flexible display apparatuses that are bendable, foldable, or rollable in a roll shape are being studied and developed. In addition, research and development into stretchable display apparatuses that may change into various shapes are actively progressed.

SUMMARY

Embodiments include a display apparatus with improved flexibility.

Additional features will be set forth in part in the description which follows and, in part, will be apparent from the description, or may be learned by practice of the presented embodiments of the disclosure.

In an embodiment of the disclosure, a method of manufacturing a display apparatus includes preparing a carrier substrate including a display area, a connection area, a dummy area, and a cut area, forming inorganic pattern layers in the display area or the connection area of the carrier substrate, forming a substrate layer on the inorganic pattern layers, forming a first insulating layer on the substrate layer, removing the first insulating layer and the substrate layer arranged in the cut area, and separating the substrate layer from the carrier substrate. The inorganic pattern layers overlap at least one of the display area and the connection area.

In an embodiment, the inorganic pattern layers may include a first inorganic pattern layer, In an embodiment, the first inorganic pattern layer may overlap the display area, extend along a circumference of the display area, and be provided in a closed loop shape.

In an embodiment, at least two of the inorganic pattern layers may overlap the display area.

In an embodiment, the method may further include, between the forming the inorganic pattern layers and the forming the substrate layer, plasma-treating the inorganic pattern layers.

In an embodiment, the method may further include, between the preparing the carrier substrate and the forming the inorganic pattern layers, forming a blocking layer in the dummy area of the carrier substrate.

In an embodiment, the method may further include, between the forming the first insulating layer and the removing the first insulating layer and the substrate layer arranged in the connection area forming a first electrode on the first insulating layer in the display area, and forming a pixel-defining layer in a portion of the display area and a portion of the dummy area.

In an embodiment, the method may further include, after the removing the first insulating layer and the substrate layer arranged in the cut area, forming an emission layer on the first electrode, and forming a second electrode on the emission layer.

In an embodiment, the method may further include, after the forming the second electrode on the emission layer, forming an encapsulation layer on the second electrode.

In an embodiment, the encapsulation layer may be formed in an entirety of the display area, the connection area, the dummy area, and the cut area, and the encapsulation layer may include a first inorganic layer and a second inorganic layer.

In an embodiment, the separating the substrate layer may include irradiating a laser beam to a rear surface of the carrier substrate and separating the substrate layer from the carrier substrate, and in the separating the substrate layer, the substrate layer may be separated from an inorganic pattern layer of the inorganic pattern layers.

In an embodiment of the disclosure, a display apparatus including a display panel in which a penetration-opening is defined includes a substrate layer including a first display portion, a second display portion, and a connection portion extending to the first display portion and the second display portion, a pixel disposed on the first display portion, and a wiring disposed on the connection portion. Concave portions are provided in a rear surface of the substrate layer. The concave portions overlap at least one of the first display portion, the second display portion, and the connection portion.

In an embodiment, the concave portions may include a first concave portion, and the first concave portion may overlap the first display portion, extend along a circumference of the first display portion, and be provided in a closed loop shape.

In an embodiment, the concave portions may include a first concave portion and a second concave portion. The first concave portion may overlap the first display portion, extend along a circumference of the first display portion, and be provided in a closed loop shape, and the second concave portion may overlap the first display portion, extend along a circumference of the first display portion, and be provided in a closed loop shape.

In an embodiment, at least two of the concave portions may overlap the first display portion.

In an embodiment, the concave portions may include a first concave portion. The first concave portion may overlap a central portion of the first display portion.

In an embodiment, the concave portions may not overlap the first display portion and may overlap the connection portion.

In an embodiment, the display apparatus may further include a first insulating layer disposed on the substrate layer of the first display portion and including a first tip protruding toward the penetration-opening.

In an embodiment, the display apparatus may further include a second insulating layer disposed on the first insulating layer, and a third insulating layer disposed on the second insulating layer and including a second tip protruding toward the penetration-opening.

In an embodiment, the display apparatus may further include an encapsulation layer disposed on the first display portion, the second display portion, and the connection portion.

In an embodiment, the encapsulation layer may include a first inorganic layer and a second inorganic layer.

These and/or other features will become apparent and more readily appreciated from the following description of the embodiments, the accompanying drawings, and claims.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
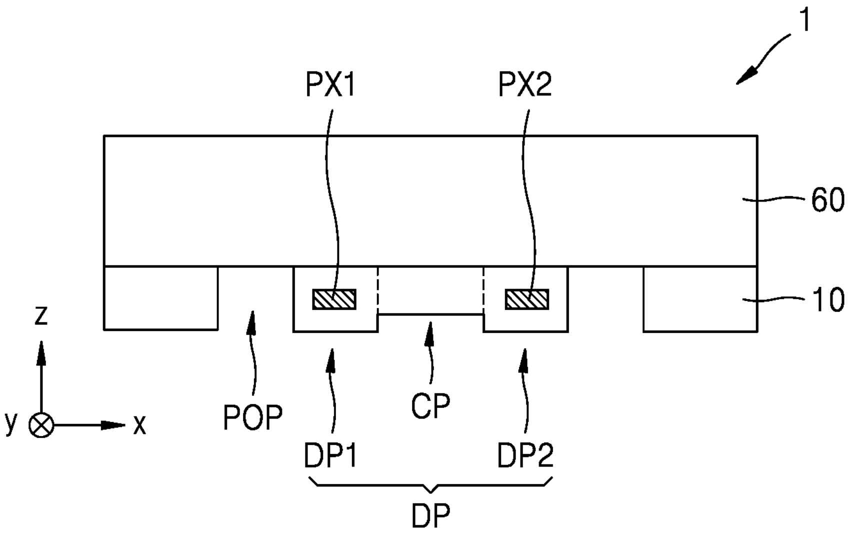
FIG. 1 is a schematic cross-sectional view of an embodiment of a display apparatus.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, illustrative embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the specification, "A and/or B" means A or B, or A and B. In the specification, "at least one of A and B" means A or B, or A and B.

As used herein, when a wiring is referred to as "extending in a first direction or a second direction", it means that the wiring not only extends in a straight line shape but also extends in a zigzag or in a curve in the first direction or the second direction.

As used herein, "in a plan view" means that an objective portion is viewed from above, and "in a cross-sectional view" means that a cross-section of an objective portion taken vertically is viewed from a lateral side. As used herein, "overlapping" includes overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

Hereinafter, embodiments of the disclosure are described in detail with reference to the accompanying drawings. When description is made with reference to the drawings, like reference numerals are used for like or corresponding elements.

Figure 2:
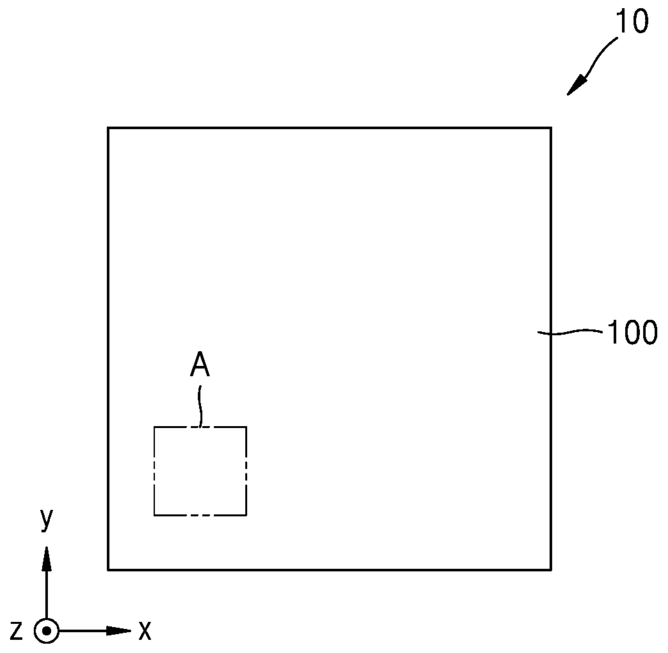
FIG. 2 is a schematic plan view of an embodiment of the display apparatus.

FIG. 1 is a schematic cross-sectional view of an embodiment of a display apparatus 1, and FIG. 2 is a schematic plan view of an embodiment of the display apparatus 1.

Referring to FIG. 1, the display apparatus 1 may include a display panel 10 and a cover window 60. The cover window 60 may be disposed on the display panel 10.

The display panel 10 may display images. The display panel 10 may include a plurality of pixels, e.g., a first pixel PX1 and a second pixel PX2. The display panel 10 may display images using the plurality of pixels.

Each of the plurality of pixels may include a display element. The display panel 10 may be an organic light-emitting display panel using an organic light-emitting diode (e.g., OLED in FIG. 3) including an organic emission layer. In an alternative embodiment, the display panel 10 may be a light-emitting diode display panel using a light-emitting diode. The size of a light-emitting diode may be micro scale or nano scale. In an embodiment, a light-emitting diode may be a micro light-emitting diode. In an alternative embodiment, the light-emitting diode may be a nanorod light-emitting diode. The nanorod light-emitting diode may include gallium nitride (GaN). In an embodiment, a color-converting layer may be disposed on the nano-rod light-emitting diode. The color-converting layer may include quantum dots. In an alternative embodiment, the display panel 10 may be a quantum-dot light-emitting display panel using a quantum-dot light-emitting diode including a quantum-dot emission layer. In an alternative embodiment, the display panel 10 may be an inorganic light-emitting display panel using an inorganic light-emitting element including an inorganic semiconductor. Hereinafter, the case where the display panel 10 is an organic light-emitting display panel that uses organic light-emitting diodes as display elements is mainly described in detail.

The display panel 10 may include a display portion DP, a connection portion CP, and a penetration-opening POP. The display portion DP may include a first display portion DP1 and a second display portion DP2. In addition, because the display panel 10 includes a substrate layer 100 (refer to FIG. 8), it may be understood that the substrate layer 100 includes the display portion DP, the connection portion CP, and the penetration-opening POP.

The first pixel PX1 may be arranged in the first display portion DP1, and the second pixel PX2 may be arranged in the second display portion DP2. The connection portion CP may be arranged between the first display portion DP1 and the second display portion DP2 to connect the first display portion DP1 and the second display portion DP2 to each other. A pixel may not be arranged in the connection portion CP.

The penetration-opening POP (or a cut portion) may be defined in the display panel 10. The penetration-opening POP may pass through the display panel 10. The penetration-opening POP may be a region in which elements of the display panel 10 are not arranged. The display panel 10 may include a plurality of penetration-openings POP. Accordingly, the display panel 10 may easily stretch and/or contract.

The cover window 60 may protect the display panel 10. In an embodiment, the cover window 60 may protect the display panel 10 while easily bending according to external force without cracks or the like. The cover window 60 may be attached to the display panel 10 by a transparent adhesive member such as an optically clear adhesive ("OCA").

The cover window 60 may include glass, sapphire, or plastic. The cover window 60 may be ultra-thin glass ("UTG") or colorless polyimide ("CPI"), for example. In an embodiment, the cover window 60 may have a structure in which a flexible polymer layer is disposed on one surface of a glass substrate, or include only a polymer layer.

Referring to FIG. 2, the display panel 10 may include the substrate layer 100 and a multi-layer disposed on the substrate layer 100. In an embodiment, the display panel 10 may include the penetration-opening POP (refer to FIG. 1). The substrate layer 100 and the multi-layer may not be arranged in the penetration-opening POP. That is, the penetration-opening POP may be an empty region of the display panel 10. The penetration-opening POP may be provided in plural in the display panel 10. Because the plurality of penetration-openings POP are provided in the display panel 10, the flexibility of the display apparatus 1 (refer to FIG. 1) including the display panel 10 may be improved.

The substrate layer 100 may include polymer resin polyethersulfone, polyarylate, polyetherimide, polyethylene naphthalate, polyethylene terephthalate, polyphenylene sulfide, polyimide, polycarbonate, cellulose tri acetate, cellulose acetate propionate, or the like. The substrate layer 100 including polymer resin is flexible, rollable, or bendable. The substrate layer 100 may have a single structure including polymer resin. In the case where the substrate layer 100 is provided to have a single structure, the flexibility of the display apparatus 1 including the substrate layer 100 may be improved. However, the disclosure is not limited thereto. The substrate layer 100 may have a multi-layered structure including a base layer and a barrier layer, and the base layer includes polymer resin.

Figure 3:
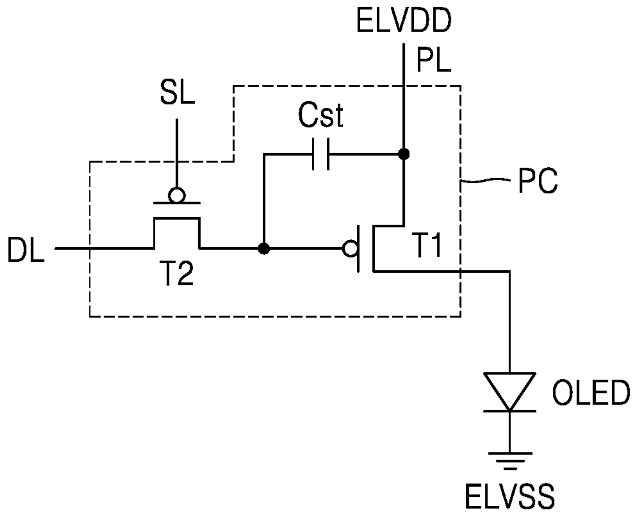
FIG. 3 is a schematic equivalent circuit diagram of an embodiment of a pixel circuit applicable to a display apparatus.

FIG. 3 is a schematic equivalent circuit diagram of an embodiment of a pixel circuit PC applicable to a display apparatus.

Referring to FIG. 3, the pixel circuit PC may be connected to a display element, e.g., an organic light-emitting diode OLED. The pixel circuit PC may include a driving thin-film transistor T1, a switching thin-film transistor T2, and a storage capacitor Cst. The organic light-emitting diode OLED may emit red, green, or blue light, or emit red, green, blue, or white light.

The switching thin-film transistor T2 is connected to a scan line SL and a data line DL, and transfers a data voltage or a data signal to the driving thin-film transistor T1 according to a switching voltage or a switching signal input from the scan line SL, the data voltage or the data signal being input from the data line DL. The storage capacitor Cst may be connected to the switching thin-film transistor T2 and a driving voltage line PL and may store a voltage corresponding to a difference between a voltage transferred from the switching thin-film transistor T2 and a first power voltage ELVDD supplied to the driving voltage line PL.

The driving thin-film transistor T1 may be connected to the driving voltage line PL and the storage capacitor Cst and may control a driving current according to the voltage stored in the storage capacitor Cst, the driving current flowing from the driving voltage line PL to the organic light-emitting diode OLED. The organic light-emitting diode OLED may emit light having a preset brightness corresponding to the driving current. An opposite electrode of the organic light-emitting diode OLED may receive a second power voltage ELVSS.

Though it is shown in FIG. 3 that the pixel circuit PC includes two thin-film transistors and one storage capacitor, the disclosure is not limited thereto, and in another embodiment, the pixel circuit PC may include three or more thin-film transistors.

Figure 4:
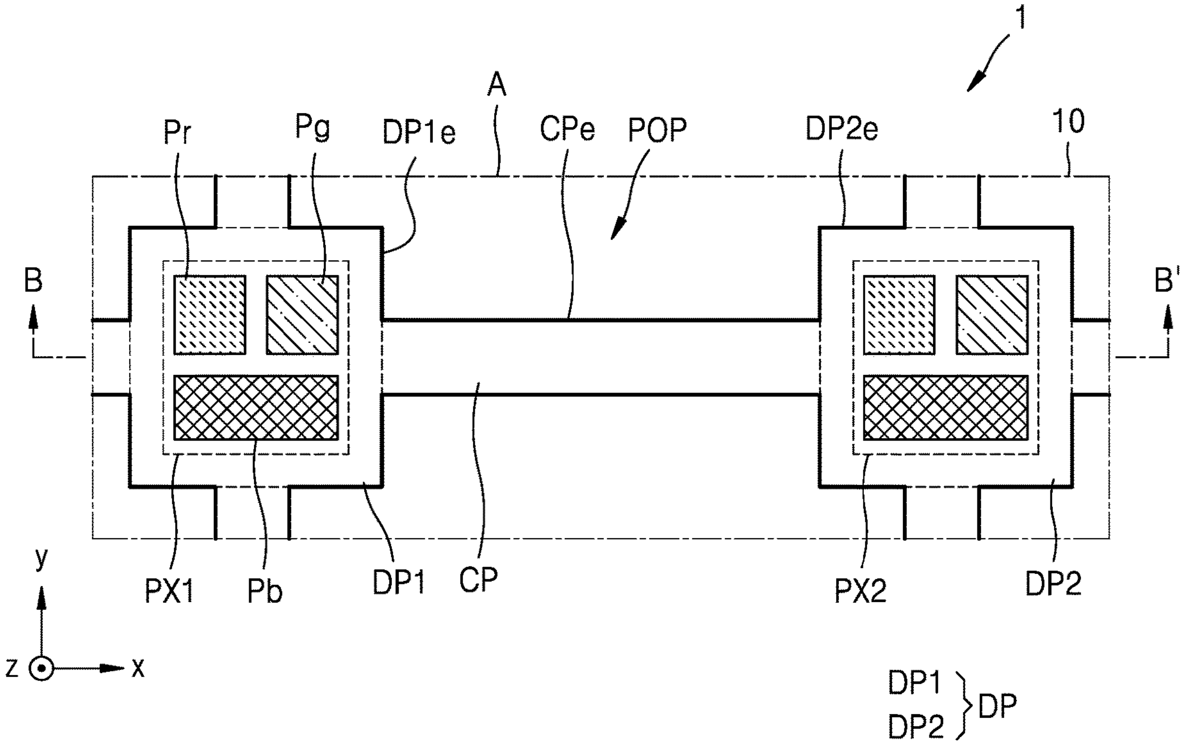
FIG. 4 is a schematic plan view of an embodiment of the display apparatus.

FIG. 4 is a schematic plan view of an embodiment of the display apparatus. FIG. 4 is an enlarged view of a region A of FIG. 2.

Referring to FIG. 4, the display panel 10 of the display apparatus 1 may include the display portion DP and the connection portion CP. The display portion DP may include the first display portion DP1 and the second display portion DP2. In an embodiment, the display panel 10 may include a plurality of first display portions DP1 and a plurality of second display portions DP2. In addition, the display panel 10 may include a plurality of connection portions CP.

The first pixel PX1 may be arranged in the first display portion DP1. The first display portion DP1 may be apart from the second display portion DP2 with the connection portion CP therebetween. The first display portion DP1 may be extended to the connection portion CP. In an embodiment, the first display portion DP1 may be extended to at least one of the connection portions CP.

The second pixel PX2 may be arranged in the second display portion DP2. The second display portion DP2 may be apart from the first display portion DP1. The second display portion DP2 may be extended to the connection portion CP. In an embodiment, the second display portion DP2 may be extended to at least one of the connection portions CP. The second display portion DP2 may have the same or similar structure as the first display portion DP1.

The connection portion CP may extend from the first display portion DP1 to the second display portion DP2. The first display portion DP1 and the second display portion DP2 may be extended to each other by the connection portion CP. In an embodiment, in the case where the display apparatus 1 includes the plurality of connection portions CP, the plurality of connection portions CP may be extended to the first display portion DP1 and/or the second display portion DP2. Some of the plurality of connection portions CP may connect the first display portion DP1 and/or the second display portion DP2 to another display portion.

One of the plurality of connection portions CP may extend in a first direction. Another of the plurality of connection portions CP may extend in a second direction crossing the first direction. In an embodiment, the first direction and the second direction may be perpendicular to each other. In an embodiment, the first direction may be a +x direction or a −x direction in FIG. 4, and the second direction may be a +y direction or a −y direction in FIG. 4. In an alternative embodiment, the first direction and the second direction may form an acute angle to each other or an obtuse angle to each other. Hereinafter, the case where the first direction (e.g., the +x direction or the −x direction) and the second direction (the +y direction or the −y direction) are perpendicular to each other is mainly described in detail.

In an embodiment, the first display portion DP1 and the connection portion CP may be defined as one basic unit. In this case, the basic unit may be repeatedly arranged in the first direction (e.g., the +x direction or the −x direction) and/or the second direction (the +y direction or the −y direction), and it may be understood that the display panel 10 includes basic units that are repeatedly arranged and extended or connected to each other.

The penetration-opening POP may be defined in the display panel 10. The penetration-opening POP may pass through the display panel 10. Accordingly, the penetration-opening POP may be a region in which elements of the display panel 10 are not arranged. The display panel 10 may include the plurality of penetration-openings POP. Accordingly, the flexibility of the display panel 10 may be improved.

At least a portion of the penetration-opening POP may be defined by an edge DP1*e* of the first display portion DP1, an edge DP2*e* of the second display portion DP2, and an edge CPe of the connection portion CP. In an embodiment, the penetration-opening POP may have a closed curve shape. In an alternative embodiment, the penetration-opening POP may have a shape in which at least a portion thereof is open.

The width of the connection portion CP in the +y direction or a −y direction may be less than the width of the first display portion DP1 in the +y direction or a −y direction and the width of the second display portion DP2 in the +y direction or a −y direction, for example. Accordingly, even when strain occurs in the connection portion CP, a maximum of strain occurring in the connection portion CP may be reduced.

Each of the first pixel PX1 and the second pixel PX2 may include a red sub-pixel Pr, a green sub-pixel Pg, and a blue sub-pixel Pb. The red sub-pixel Pr, the green sub-pixel Pg, and the blue sub-pixel Pb may respectively emit red light, green light, and blue light. In an alternative embodiment, each of the first pixel PX1 and the second pixel PX2 may include a red sub-pixel Pr, a green sub-pixel Pg, a blue sub-pixel Pb, and white sub-pixel. The red sub-pixel Pr, the green sub-pixel Pg, the blue sub-pixel Pb, and the white sub-pixel may respectively emit red light, green light, blue light, and white light. Hereinafter, the case where each of the first pixel PX1 and the second pixel PX2 includes the red sub-pixel Pr, the green sub-pixel Pg, and the blue sub-pixel Pb is mainly described in detail.

In an embodiment, the red sub-pixel Pr and the green sub-pixel Pg may be arranged in a quadrangular shape, the blue sub-pixel Pb may be arranged in a quadrangular shape having long sides in the first direction (e.g., the +x direction or the −x direction). In other words, a side of the red sub-pixel Pr and a side of the green sub-pixel Pg may be arranged to face a long side of the blue sub-pixel Pb. In an embodiment, the red sub-pixel Pr and the green sub-pixel Pg may be arranged in a first row, and the blue sub-pixel Pb may be arranged in a second row adjacent to the first row.

In an alternative embodiment, a sub-pixel configuration structure of the first pixel PX1 may be provided in an S-stripe structure. In an embodiment, the blue sub-pixel Pb may be arranged in a first column, and the red sub-pixel Pr and the green sub-pixel Pg may be arranged in a second column adjacent to the first column. In this case, the blue sub-pixel Pb may be arranged in a quadrangular shape having long sides in the second direction (e.g., the +y direction or the −y direction), and the red sub-pixel Pr and the green sub-pixel Pg may be arranged in a quadrangular shape.

In an alternative embodiment, a sub-pixel configuration structure of the first pixel PX1 may be provided in a stripe structure. In an embodiment, the red sub-pixel Pr, the green sub-pixel Pg, and the blue sub-pixel Pb may be arranged side-by-side in the first direction (e.g., the +x direction or the −x direction) or the second direction (e.g., the +y direction or the −y direction). In an alternative embodiment, a sub-pixel configuration structure of the first pixel PX1 may be provided in a Pentile™ structure.

The edge CPe of the connection portion CP may extend in an extension direction of the connection portion CP. In an embodiment, in the case where the connection portion CP extends in the first direction (e.g., the +x direction or the −x direction), the edge CPe of the connection portion CP may also extend in the first direction (e.g., the +x direction or the −x direction). In addition, in the case where the connection portion CP extends in the second direction (e.g., the +y direction or the −y direction), the edge CPe of the connection portion CP may also extend in the second direction (e.g., the +y direction or the −y direction).

Figure 5:
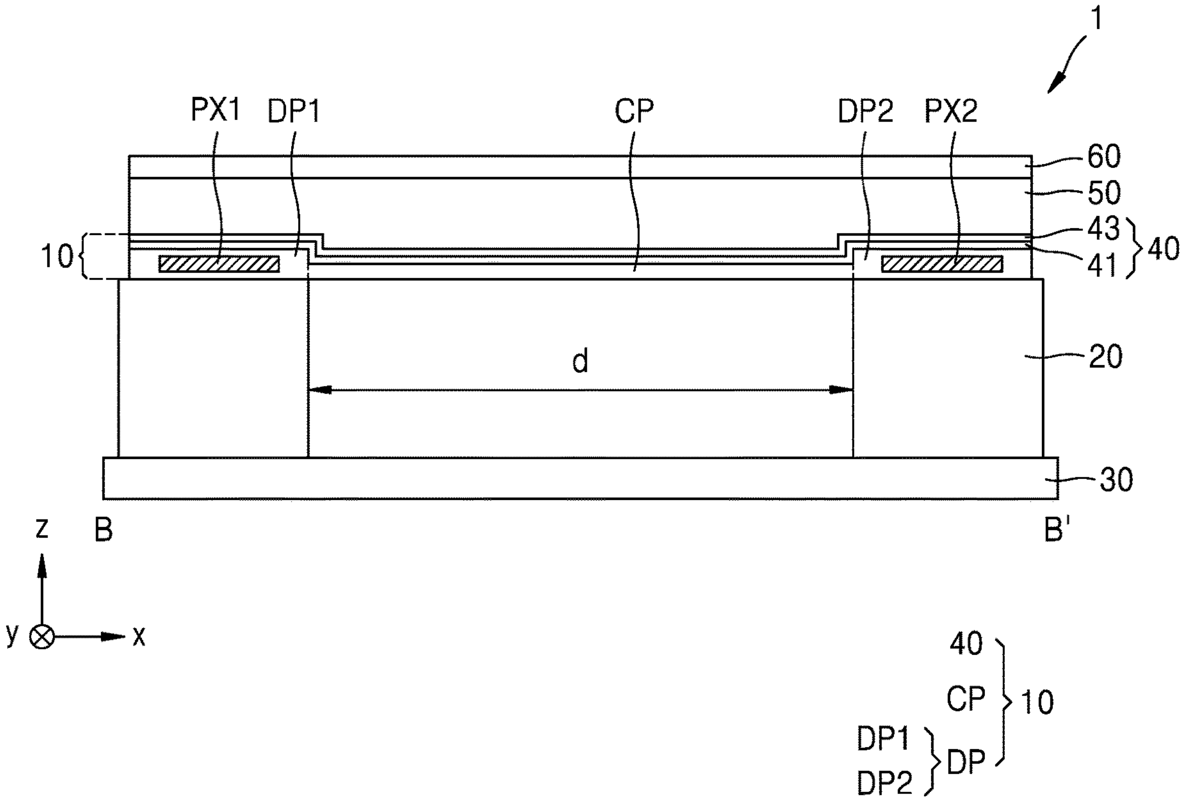
FIGS. 5 and 6 are schematic cross-sectional views of an embodiment of a display apparatus.
Figure 6:
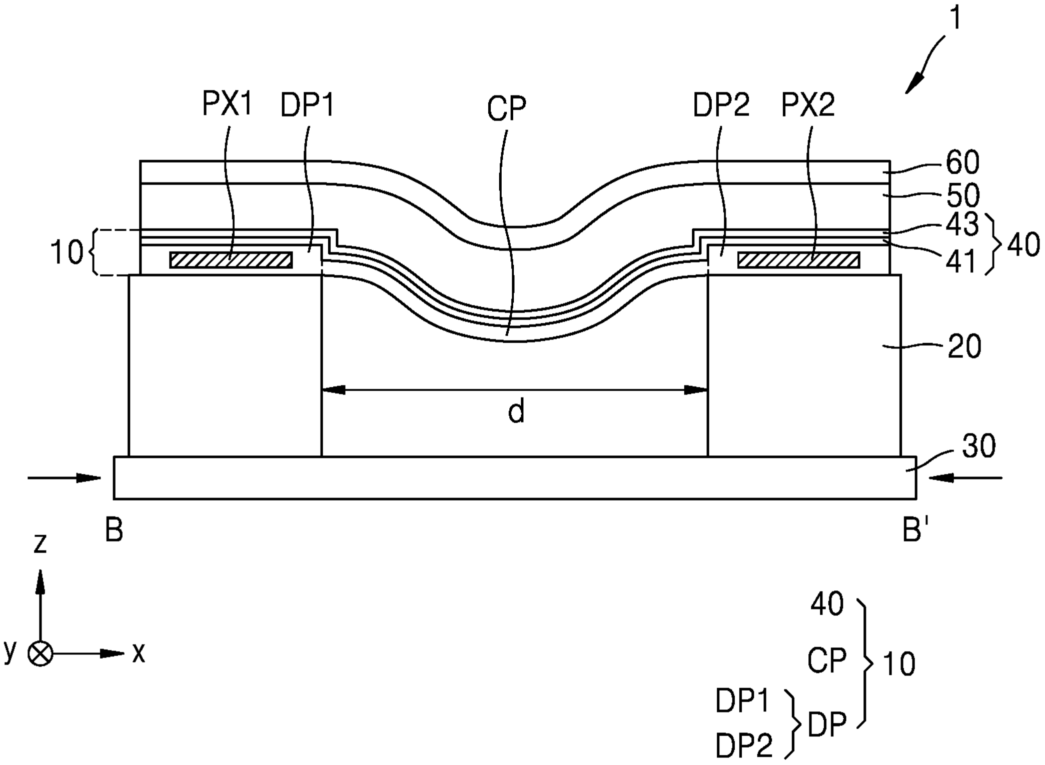

FIGS. 5 and 6 are schematic cross-sectional views of an embodiment of the display apparatus 1.

Specifically, FIGS. 5 and 6 are cross-sectional views of the display apparatus 1, taken along line B-B' of FIG. 4. FIG. 5 shows the display apparatus 1 before external force is applied to the display apparatus 1, and FIG. 6 shows the display apparatus 1 after external force is applied to the display apparatus 1.

Referring to FIG. 5, the display apparatus 1 may include the display panel 10, a pillar layer 20, a flexible substrate 30, an optical functional layer 50, and the cover window 60.

The display panel 10 may include the display portion DP, the connection portion CP, and the encapsulation layer 40. The display portion DP may include the first display portion DP1 and the second display portion DP2. In addition, the first pixel PX1 may be arranged in the first display portion DP1, and the second pixel PX2 may be arranged in the second display portion DP2. The first display portion DP1 and the second display portion DP2 may be respectively portions which display images through the first pixel PX1 and the second pixel PX2. The connection portion CP may connect the first display portion DP1 and the second display portion DP2 to each other. The first display portion DP1 and the second display portion DP2 may be extended to each other by the connection portion CP.

Figure 8:
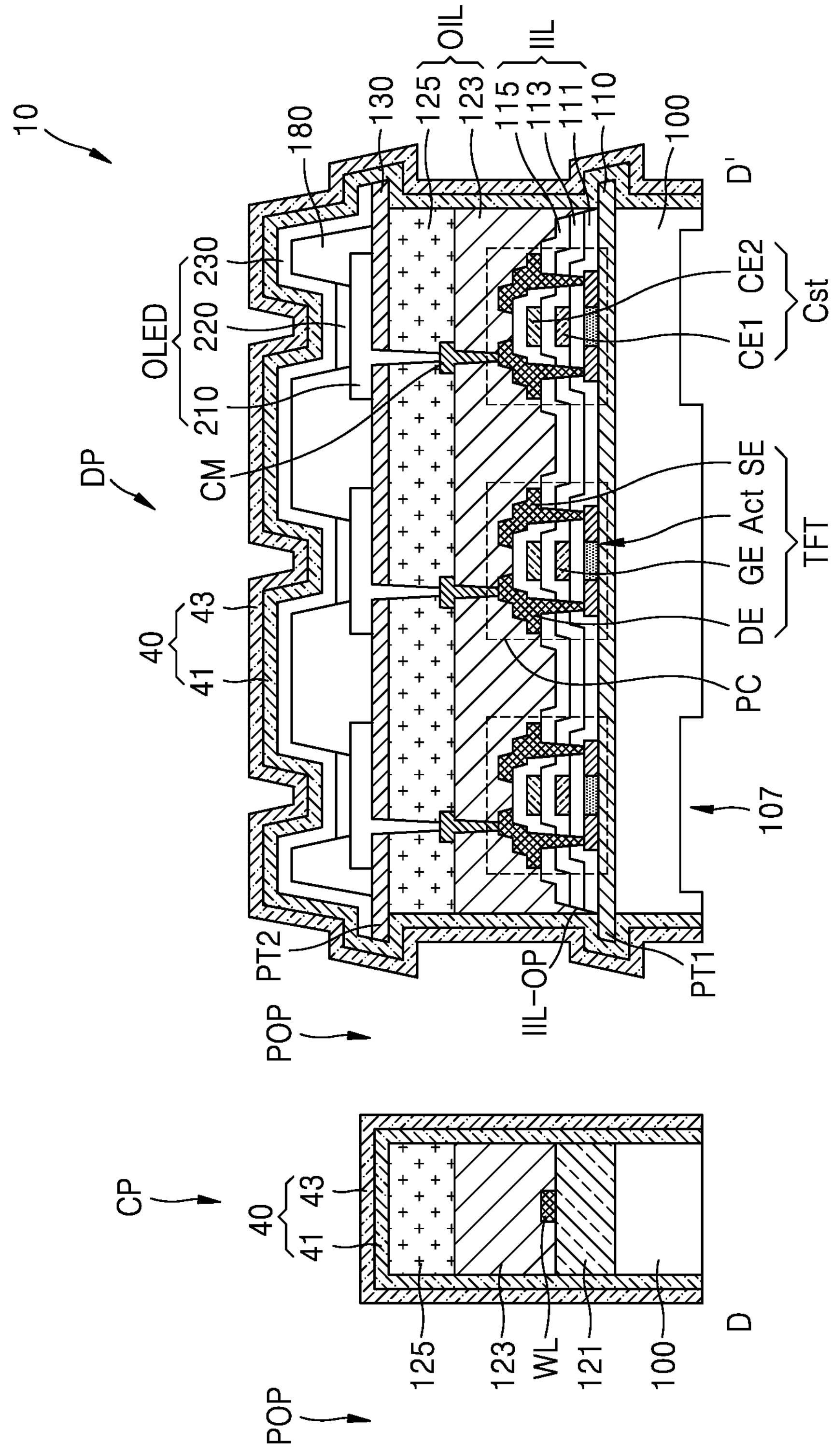
FIG. 8 is a schematic cross-sectional view of an embodiment of a display panel.

As shown in FIG. 8 described below, the display portion DP of the display panel 10 may include insulating layers. Some of the insulating layers included in the first display portion DP1 may be omitted from the connection portion CP. Accordingly, because some of the insulating layers may be omitted from the connection portion CP, the thickness of the connection portion CP in the +z or −z direction may be less than the thickness of the display portion DP in the +z or −z direction.

The pillar layer 20 may be disposed under the display panel 10. The pillar layer 20 may support the display panel 10. Even when external force is applied to the display apparatus 1, the shape of the pillar layer 20 may not be transformed.

In an embodiment, the pillar layer 20 may be disposed under the display portion DP of the display panel 10. That is, the pillar layer 20 may overlap the display portion DP and may not overlap the connection portion CP. A plurality of pillar layers 20 may be apart from each other. The plurality of pillar layers 20 may be respectively disposed under the plurality of display portions DP apart from each other.

The flexible substrate 30 may be disposed under the pillar layer 20. The flexible substrate 30 may overlap the display portion DP and the connection portion CP. The flexible substrate 30 may include a flexible material. The flexible substrate 30 may be more flexible than the pillar layer 20.

The encapsulation layer 40 may be disposed on the display portion DP and the connection portion CP. In an embodiment, the encapsulation layer 40 may be a thin-film encapsulation layer. The encapsulation layer 40 may cover the first pixel PX1 and the second pixel PX2. In an embodiment, the encapsulation layer 40 may include at least one inorganic layer. The at least one inorganic layer may include at least one inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$), and be formed by chemical vapor deposition ("CVD"). Zinc oxide ($ZnO_x$) may be zinc oxide (ZnO) and/or zinc peroxide ($ZnO_2$).

In an embodiment, as shown in FIG. 5, the encapsulation layer 40 may be disposed on the display portion DP and the connection portion CP. The encapsulation layer 40 may include a first inorganic layer 41 and a second inorganic layer 43. In an alternative embodiment, although not shown, the encapsulation layer 40 may include the first inorganic layer 41, the second inorganic layer 43, and an organic layer therebetween. In the case where the encapsulation layer 40 includes the organic layer, the organic layer may be disposed on only the display portion DP and may not be disposed on the connection portion CP. That is, only the first inorganic layer 41 and the second inorganic layer 43 may be disposed on the connection portion CP. In an alternative embodiment, the encapsulation layer 40 may include only one inorganic layer. In this case, the inorganic layer may include a single layer or a multi-layer.

The optical functional layer 50 may be disposed on the encapsulation layer 40. The optical functional layer 50 may include an anti-reflection layer. The anti-reflection layer may reduce reflectivity of light (external light) incident toward the display apparatus 1 from outside. In an embodiment, the optical functional layer 50 may include a polarizing film. In an alternative embodiment, the optical functional layer 50 may be a filter plate including a black matrix and color filters.

Although not shown in FIG. 5, a touchscreen layer may be disposed between the encapsulation layer 40 and the optical functional layer 50. The touchscreen layer may obtain coordinate information corresponding to an external input, e.g., a touch event. The touchscreen layer may include a touch electrode and touch lines connected to the touch electrode. The touchscreen layer may sense an external input by a self-capacitance method or a mutual capacitance method.

The cover window 60 may be disposed on the optical functional layer 50. The cover window 60 may protect the display panel 10.

As shown in FIG. 6, in the case where external force is applied to the display apparatus 1 (e.g., external force is applied to the flexible substrate 30), the shape and/or position of some of members of the display apparatus 1 may be changed. In an embodiment, in the case where pressure is applied to the flexible substrate 30, a distance between the display portions DP of the display panel 10 or a distance d between the pillar layers 20 may be reduced. In addition, the connection portion CP of the display panel 10 may be bent. At least a portion of the encapsulation layer 40, at least a portion of the optical functional layer 50, and/or a portion of the cover window 60 may be bent.

As described above, in the case where external force is applied to the display apparatus 1, the distance between the display portions DP of the display panel 10 or the distance d between the pillar layers 20 may change, and there may be no change in the shape of each of the display portions DP and the pillar layers 20. Accordingly, because the shape of each of the display portions DP and the pillar layers 20 does not change, the first and second pixels PX1 and PX2 arranged in the display portion DP may be protected. While the first and second pixels PX1 and PX2 are protected, the display apparatus 1 may change in various shapes.

Figure 7:
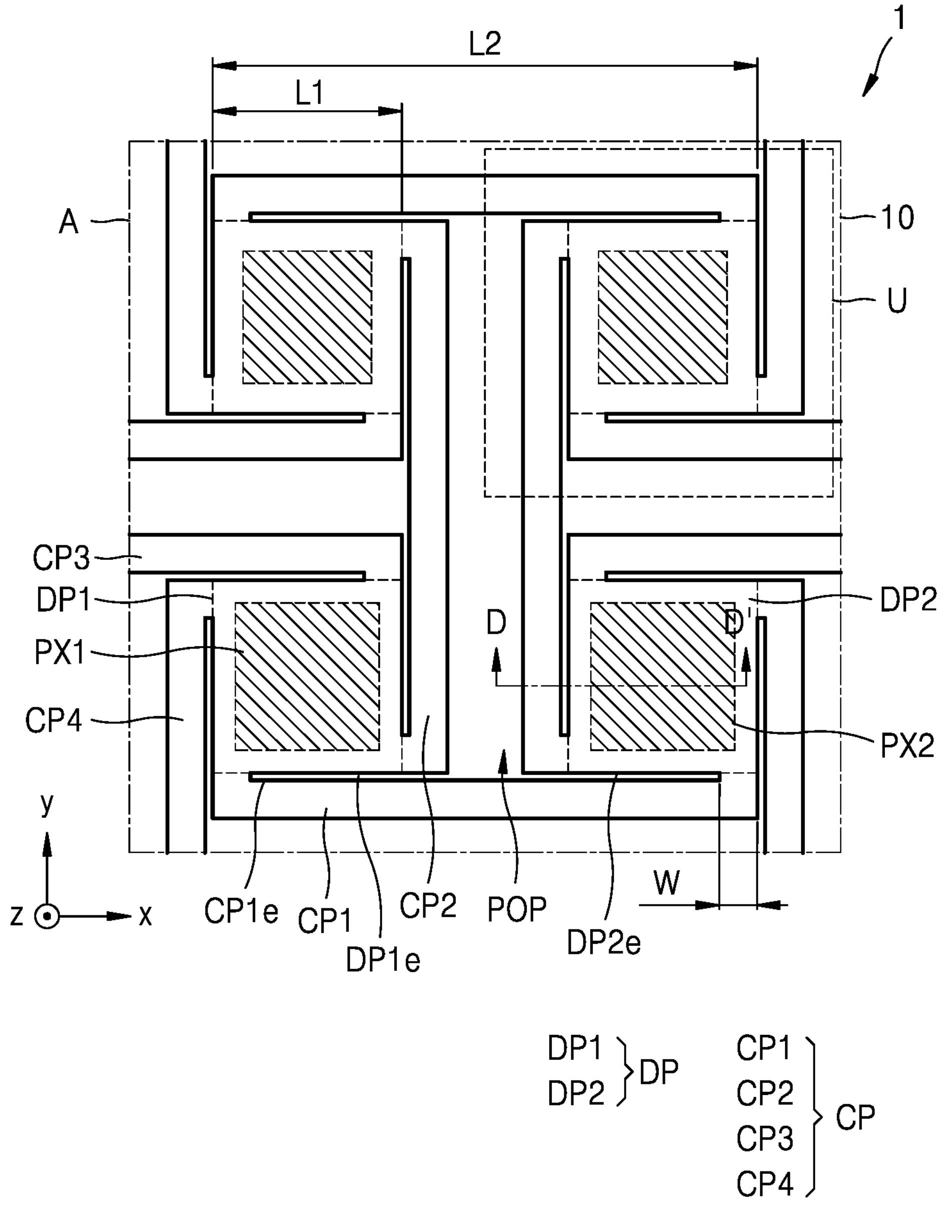
FIG. 7 is a schematic plan view of an embodiment of the display apparatus.

FIG. 7 is a schematic plan view of an embodiment of the display apparatus. FIG. 7 is a modified embodiment of FIG. 4 and is an enlarged view of the region A in FIG. 2.

Referring to FIG. 7, the display panel 10 of the display apparatus 1 may include the display portion DP and the connection portion CP. The display portion DP may include the first display portion DP1 and the second display portion DP2. The first pixel PX1 may be arranged in the first display portion DP1, and the second pixel PX2 may be arranged in the second display portion DP2. The connection portion CP may include a first connection portion CP1, a second connection portion CP2, a third connection portion CP3, and a fourth connection portion CP4.

The plurality of display portions DP may be apart from each other in the first direction (e.g., the +x direction or the −x direction) and/or the second direction (e.g., the +y direction or the −y direction). In an embodiment, the first display portion DP1 and the second display portion DP2 may be apart from each other in the first direction (e.g., the +x direction or the −x direction) and/or the second direction (e.g., the +y direction or the −y direction).

The connection portion CP may extend between the display portions DP adjacent to each other. In an embodiment, each of the display portions DP may be extended to four connection portions CP. Four connection portions CP extended to one display portion DP may extend in different directions, and each of the connection portions CP may be extended to a different display portion DP arranged adjacent to the one display portion DP.

In an embodiment, the first connection portion CP1 may extend from the first display portion DP1 to the second display portion DP2. Accordingly, the first display portion DP1 and the second display portion DP2 may be connected by the first connection portion CP1. The first display portion DP1, the second display portion DP2, and the first connection portion CP1 may be unitary.

The penetration-opening POP may be defined in the display panel 10. The first display portion DP1 and the second display portion DP2 may be apart from each other with the penetration-opening POP therebetween. The penetration-opening POP may pass through the display panel 10. Accordingly, elements of the display panel 10 may not be arranged in the penetration-opening POP.

In an embodiment, at least a portion of the penetration-opening POP may be defined by an edge of the display portions DP and an edge of the connection portions CP. In an embodiment, at least a portion of the penetration-opening POP may be defined by an edge DP1*e* of the first display portion DP1, an edge DP2*e* of the second display portion DP2, and an edge CP1*e* of the first connection portion CP1.

One display portion DP and some of the connection portions CP extending therefrom may be defined as a basic unit U. The basic unit U may be repeatedly arranged in the first direction (e.g., the +x direction or the −x direction) and the second direction (the +y direction or the −y direction), and it may be understood that the display panel 10 (refer to FIG. 2) includes basic units U that are repeatedly arranged and extended to each other. Two basic units U adjacent to each other may be symmetrical to each other. In an embodiment, two basic units U adjacent to each other horizontally in FIG. 7 may be symmetrical to each other horizontally with respect to an axis of symmetry parallel to the second direction (e.g., the +y direction or the −y direction) and disposed therebetween. Similarly, two basic units U adjacent to each other vertically in FIG. 7 may be symmetrical to each other vertically with respect to an axis of symmetry parallel to the first direction (e.g., the +x direction or the −x direction) and disposed therebetween.

In an embodiment, a ratio of a length L1 of the display portion DP to a length L2 of the connection portion CP in the first direction (e.g., the +x direction or the −x direction) may be about 100:1 to about 1:100. In addition, a ratio of a length L1 of the display portion DP to a length L2 of the connection portion CP in the first direction (e.g., the +x direction or the −x direction) and a ratio of a length L1 of the display portion DP to a length L2 of the connection portion CP in the second direction (e.g., the +y direction or the −y direction) may be equal to each other. However, the disclosure is not limited thereto. In an embodiment, a ratio of a length L1 of the display portion DP to a length L2 of the connection portion CP in the first direction (e.g., the +x direction or the −x direction) and a ratio of a length L1 of the display portion DP to a length L2 of the connection portion CP in the second direction (e.g., the +y direction or the −y direction) may be different from each other.

In an embodiment, in the case where a width W of a connection portion in which the connection portion CP is extended to the display portion DP is less than 1 μm, because the width W of the connection portion is too narrow, a portion of a wiring WL (refer to FIG. 8) disposed on the connection portion may be exposed, the width of the wiring WL may be reduced, conductivity may be reduced, and the wiring may be disconnected. Accordingly, the width W of the connection portion in which the connection portion CP is extended to the display portion DP may be 1 μm or more.

As described above, each of the first pixel PX1 and the second pixel PX2 may include a red sub-pixel Pr, a blue sub-pixel Pb, and a green sub-pixel Pg. The red sub-pixel Pr, the blue sub-pixel Pb, and the green sub-pixel Pg may respectively emit red light, blue light, and green light. In an alternative embodiment, each of the first pixel PX1 and the second pixel PX2 may include a red sub-pixel Pr, a blue sub-pixel Pb, a green sub-pixel Pg, and white sub-pixel. The red sub-pixel Pr, the blue sub-pixel Pb, the green sub-pixel Pg, and the white sub-pixel may respectively emit red light, blue light, green light, and white light.

FIG. 8 is a schematic cross-sectional view of an embodiment of a display panel. FIG. 8 is a cross-sectional view of the display panel, taken along line D-D' of FIG. 7.

Referring to FIG. 8, the display panel 10 may include the display portion DP and the connection portion CP. In addition, the penetration-opening POP may be defined in the display panel 10.

The display panel 10 may include the substrate layer 100. The substrate layer 100 may include polymer resin such as polyethersulfone, polyarylate, polyetherimide, polyethylene naphthalate, polyethylene terephthalate, polyphenylene sulfide, polyimide, polycarbonate, cellulose tri acetate, or cellulose acetate propionate.

In an embodiment, the substrate layer 100 may have a single-layered structure. In an embodiment, the substrate layer 100 may be provided in a single structure and provided to be substantially thin. Because the substrate layer 100 is provided to be substantially thin, the flexibility of the display apparatus 1 including the substrate layer 100 may be improved.

A buffer layer 110 may be disposed on the substrate layer 100 of the display portion DP. The buffer layer 110 may not be disposed on the connection portion CP but may be disposed on only the display portion DP. The buffer layer 110 may include an inorganic insulating material such as silicon nitride ($SiN_x$), silicon oxynitride (SiON), and silicon oxide ($SiO_2$), and include a single layer or a multi-layer including inorganic insulating materials.

In an embodiment, the buffer layer 110 may include an end (e.g., a first tip PT1) protruding toward (e.g., toward the connection portion CP) the penetration-opening POP.

The pixel circuit PC may be disposed on the display portion DP. The pixel circuit PC may include a thin-film transistor TFT and a storage capacitor Cst. Although it is shown in FIG. 8 that the pixel circuit PC includes one thin-film transistor and one storage capacitor, the disclosure is not limited thereto. The pixel circuit PC may include a plurality of thin-film transistors and a plurality of storage capacitors.

An inorganic insulating layer IIL and the organic insulating layer OIL may be disposed on the substrate layer 100 of the display portion DP. The inorganic insulating layer IIL may include a first insulating layer 111, a second insulating layer 113, and a third insulating layer 115. The organic insulating layer OIL may include a first organic insulating layer 123 and a second organic insulating layer 125.

The thin-film transistor TFT and the storage capacitor Cst may be disposed on the buffer layer 110. The thin-film transistor TFT may include a semiconductor layer Act, a gate electrode GE, a source electrode SE, and a drain electrode DE. The storage capacitor Cst may include a lower electrode CE1 and an upper electrode CE2.

The semiconductor layer Act may be disposed on the buffer layer 110. The semiconductor layer Act may include polycrystalline silicon. In an alternative embodiment, the semiconductor layer Act may include amorphous silicon, an oxide semiconductor, or an organic semiconductor. The semiconductor layer Act may include a channel region, a drain region, and a source region, the drain region and the source region being on two opposite sides of the channel region.

The gate electrode GE may be disposed over the semiconductor layer Act. The gate electrode GE may overlap a channel region disposed therebelow. The gate electrode GE may include a low-resistance metal material. The gate electrode GE may include a conductive material including molybdenum (Mo), aluminum (Al), copper (Cu), and titanium (Ti) and have a single-layered structure or a multi-layered structure including the above materials.

The first insulating layer 111 may be disposed between the semiconductor layer Act and the gate electrode GE. The first insulating layer 111 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second insulating layer 113 may cover the gate electrode GE. Similar to the first insulating layer 111, the second insulating layer 113 may include an inorganic insulating material including silicon oxide ($SiO_2$), silicon nitride (SiNA), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The upper electrode CE2 of the storage capacitor Cst may be disposed on the second insulating layer 113. The upper electrode CE2 may overlap the gate electrode GE disposed therebelow. In this case, the gate electrode GE and the upper electrode CE2 overlapping each other with the second insulating layer 113 therebetween may constitute the storage capacitor Cst. That is, the gate electrode GE of the thin-film transistor TFT may serve as the lower electrode CE1 of the storage capacitor Cst.

As described above, the storage capacitor Cst may overlap the thin-film transistor TFT. However, the disclosure is not limited thereto. The storage capacitor Cst may be formed not to overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

The third insulating layer 115 may cover the upper electrode CE2. The third insulating layer 115 may include silicon oxide ($SiO_2$), silicon nitride (SiNA), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The third insulating layer 115 may include a single layer or a multi-layer including the inorganic insulating material.

The drain electrode DE and the source electrode SE may each be disposed on the third insulating layer 115. The drain electrode DE and the source electrode SE may each include a material having relatively high conductivity. The drain electrode DE and the source electrode SE may each include a conductive material including molybdenum (Mo), aluminum (Al), copper (Cu), and titanium (Ti) and include a single layer or a multi-layer including the above materials. In an embodiment, the drain electrode DE and the source electrode SE may each have a multi-layered structure of Ti/Al/Ti.

The first organic insulating layer 123 may cover the drain electrode DE and the source electrode SE. The first organic insulating layer 123 may include an organic material. In an embodiment, the first organic insulating layer 123 may include an organic insulating material including a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

The second organic insulating layer 125 may include an organic material. The second organic insulating layer 125 may include an organic insulating material including a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

In an embodiment, a passivation layer 130 may be disposed on the second organic insulating layer 125. The passivation layer 130 may include a single layer or a multi-layer including an inorganic material such as silicon nitride (SiNA) and/or silicon oxide ($SiO_2$).

The passivation layer 130 may be disposed between the organic light-emitting diode OLED and the second organic insulating layer 125. A first electrode 210 of the organic light-emitting diode OLED may be disposed on the passivation layer 130.

In an embodiment, the passivation layer 130 may include an end (e.g., a second tip PT2) protruding toward (e.g., toward the connection portion CP) the penetration-opening POP.

The organic light-emitting diode OLED may be disposed on the passivation layer 130. The organic light-emitting diode OLED may include the first electrode 210, an emission layer 220, and a second electrode 230.

The first electrode 210 may be disposed on the passivation layer 130. The first electrode 210 may be electrically connected to a connection metal CM disposed on the first organic insulating layer 123. In addition, the connection metal CM may be electrically connected to the drain electrode DE or the source electrode SE. Accordingly, the organic light-emitting diode OLED may be electrically connected to the pixel circuit PC.

The first electrode 210 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an alternative embodiment, the first electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or any combinations thereof. In an alternative embodiment, the first electrode 210 may further include a layer on/under the reflective layer, the layer including ITO, IZO, ZnO, or $In_2O_3$.

A pixel-defining layer 180 may be disposed on the first electrode 210, and the pixel-defining layer 180 includes an opening exposing at least a portion of the first electrode 210. The pixel-defining layer 180 may include an organic insulating material and/or an inorganic insulating material. The opening defined in the pixel-defining layer 180 may define an emission area of light emitted from the organic light-emitting diode OLED. In an embodiment, the width of the opening may correspond to the width of the emission area.

Though not shown, a spacer may be disposed on the pixel-defining layer 180. In the method of manufacturing the display panel, a mask sheet may be used. In this case, the mask sheet may enter the inside of the pixel opening of the pixel-defining layer 180, or be closely attached to the pixel-defining layer 180. The spacer may prevent defects from when a portion of the substrate layer 100 and the multi-layer on the substrate layer 100 is damaged or destroyed by the mask sheet while a deposition material is deposited on the substrate layer 100.

The spacer may include an organic material such as polyimide. In an alternative embodiment, the spacer may include an inorganic insulating material such as silicon nitride (SiNA) or silicon oxide ($SiO_2$), or include an organic insulating material and an inorganic insulating material.

In an embodiment, the spacer may include a material that is different from a material of the pixel-defining layer 180. In an alternative embodiment, the spacer may include the same material as that of the material of the pixel-defining layer 180. In this case, the pixel-defining layer 180 and the spacer may be simultaneously formed during a mask process that uses a half-tone mask or the like.

The emission layer 220 may be disposed on at least a portion of the pixel electrode 210 exposed by the pixel-defining layer 180. The emission layer 220 may be disposed in the opening defined in the pixel-defining layer 180. The emission layer 220 may include a polymer organic material or a low-molecular weight organic material which emits light having a preset color.

Though not shown, a first functional layer and a second functional layer may be respectively arranged under and on the emission layer 220. The first functional layer may include, e.g., a hole transport layer ("HTL"), or include an HTL and a hole injection layer ("HIL"). The second functional layer is an element disposed on the emission layer 220 and may be optional. The second functional layer may include an electron transport layer ("ETL") and/or an electron injection layer ("EIL"). The first functional layer and/or the second functional layer may be disposed on only the display portion DP. In an alternative embodiment, the first functional layer and/or the second functional layer may be disposed on the display portion DP and the connection portion CP.

The second electrode 230 may include a conductive material having a relatively low work function. In an embodiment, the second electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or any alloys thereof. In an alternative embodiment, the second electrode 230 may further include a layer on a (semi) transparent layer, the layer including ITO, IZO, ZnO, or $In_2O_3$. The second electrode 230 may be disposed on only the display portion DP. In an alternative embodiment, the second electrode 230 may be disposed on the display portion DP and the connection portion CP.

Though not shown, a capping layer (not shown) may be further disposed on the second electrode 230. The capping layer may include an inorganic material such as lithium fluoride (LiF), and/or an organic material.

The encapsulation layer 40 may be disposed on the organic light-emitting diode OLED. In an embodiment, the encapsulation layer 40 may be disposed on the second electrode 230. In an embodiment, the encapsulation layer 40 may include at least one inorganic layer. In an alternative embodiment, though not shown, the encapsulation layer 40 may include at least one inorganic layer and at least one organic layer.

In an embodiment, it is shown in FIG. 8 that the encapsulation layer 40 includes the first inorganic layer 41 and the second inorganic layer 43 that are sequentially stacked. In FIG. 8, the second inorganic layer 43 is directly disposed on the first inorganic layer 41. Accordingly, the first inorganic layer 41 may be in direct contact with the second inorganic layer 43 on the organic light-emitting diode OLED. However, the disclosure is not limited thereto. In an embodiment, the encapsulation layer 40 may include one inorganic layer, and the inorganic layer may include a single layer or a multi-layer.

The first inorganic layer 41 and the second inorganic layer 43 may each include at least one inorganic material among aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), and silicon nitride ($SiN_x$), and silicon oxynitride (SiON).

Though not shown, the touchscreen layer may be disposed on the encapsulation layer 40, and the optical functional layer may be disposed on the touchscreen layer. The touchscreen layer may obtain coordinate information corresponding to an external input, e.g., a touch event. The optical functional layer may reduce the reflectivity of light (external light) incident toward the display apparatus from outside, and/or improve the color purity of light emitted from the display apparatus. In an embodiment, the optical functional layer may include a retarder and/or a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

In an alternative embodiment, the optical functional layer may include a black matrix and color filters. The color filters may be arranged by taking into account colors of pieces of light emitted respectively from the pixels of the display panel. The color filters may each include red, green, or blue pigment or dye. In an alternative embodiment, the color filters may each further include quantum dots in addition to the pigment or dye. In an alternative embodiment, some of the color filters may not include pigment or dye, and may include scattering particles such as titanium oxide.

In an alternative embodiment, the optical functional layer may include a destructive interference structure. The destructive interference structure may include a first reflection layer and a second reflection layer respectively disposed in different layers. First-reflected light and second-reflected light respectively reflected by the first reflection layer and the second reflection layer may destructively interfere and thus the reflectivity of external light may be reduced.

An adhesive member may be disposed between the touchscreen layer and the optical functional layer. For the adhesive member, a general member known in the art may be employed without limitation. In an embodiment, the adhesive member may be a pressure sensitive adhesive ("PSA").

An opening IIL-OP corresponding to the connection portion CP may be defined in the inorganic insulating layer IIL. The opening IIL-OP may denote a region defined by removing a portion of the inorganic insulating layer IIL. The upper surface (or the upper surface of the buffer layer 110) of the substrate layer 100 may be exposed through the opening IIL-OP. Although the region defined by removing a portion of the inorganic insulating layer IIL is defined as the opening IIL-OP, the inorganic insulating layer IIL may be provided in an island shape corresponding to the display portion DP. The opening IIL-OP may extend from the connection portion CP to the display portion DP. That is, the area of the opening IIL-OP may be the same as or greater than the area of the connection portion CP.

In an embodiment, an organic material layer 121 may be disposed on the substrate layer 100 of the connection portion CP. The organic material layer 121 disposed in the connection portion CP may fill a step difference of the inorganic insulating layer IIL formed due to the opening IIL-OP. The thickness of the organic material layer 121 in a thickness direction of the display apparatus 1 may be approximately the same as the height of the step difference of the inorganic insulating layer IIL formed due to the opening IIL-OP. Because the organic material layer 121 fills the opening IIL-OP of the inorganic insulating layer IIL, the flexibility of the connection portion CP may be improved, and a region in which the wiring WL is to be arranged is planarized maximally, and thus, the reliability of the wiring WL may be improved.

In an embodiment, the wiring WL may be disposed on the organic material layer 121. Though not shown, the wiring WL may be electrically connected to the pixel circuit PC. Through the wiring WL, the pixel circuit PC of the second display portion DP2 may be electrically connected to a pixel circuit (e.g., a pixel circuit of the first display portion) of another display portion adjacent thereto. The wiring WL may include a material having relatively high conductivity. The wiring WL may include a conductive material including molybdenum (Mo), aluminum (Al), copper (Cu), and titanium (Ti) and have a single-layered structure or a multi-layered structure including the above materials. In an embodiment, the wiring WL may have a multi-layered structure of Ti/Al/Ti. In an embodiment, the wiring WL may be formed by the same process as a process of forming the drain electrode DE and/or the source electrode SE of the display portion DP.

In an embodiment, the wiring WL may electrically connect the display portions to each other. In an embodiment, the wiring WL may be a data line, a scan line, a power supply line, or the like. Although it is shown in FIG. 8 that one wiring WL is provided, the disclosure is not limited thereto. In an embodiment, the wiring WL may be provided in plural.

In addition, although it is shown in FIG. 8 that the wiring WL is disposed between the organic material layer 121 and the first organic insulating layer 123, the disclosure is not limited thereto. In an embodiment, the wiring WL may be disposed not only between the organic material layer 121 and the first organic insulating layer 123 but also between the first organic insulating layer 123 and the second organic insulating layer 125.

In an embodiment, the penetration-opening POP may be defined between the display portion DP and the connection portion CP and between the connection portions CP.

In an embodiment, a concave portion 107 may be provided in the rear surface of the substrate layer 100 of the display portion DP. The concave portion 107 provided to the rear surface of the substrate layer 100 of the display portion DP may correspond to a portion in which inorganic pattern layers LAL described later exist.

In an embodiment, the concave portion 107 may overlap at least a portion of the display portion DP. In an embodiment, in the case where the display portion DP includes the first display portion DP1 (refer to FIG. 7) and the second display portion DP2 (refer to FIG. 7), the concave portion 107 may overlap the first display portion DP1 and/or the second display portion DP2.

In an embodiment, the concave portion 107 may overlap the display portion DP, extend along the circumference of the display portion DP, and be provided in a closed loop shape. In an embodiment, the concave portion 107 may overlap the display portion DP, extend along the edge of the display portion DP, and be provided in a closed loop shape.

In an embodiment, a plurality of concave portions 107 may overlap one display portion DP. That is, at least two concave portions 107 may overlap one display portion DP. In an embodiment, the concave portion 107 may include a first concave portion and a second concave portion. The first concave portion and the second concave portion may overlap one display portion DP. The first concave portion and the second concave portion may each overlap the display portion DP, extend along the circumference of the display portion DP, and be provided in a closed loop shape.

In an embodiment, the concave portion 107 may be provided to not only the display portion DP but also the connection portion CP. In an alternative embodiment, the concave portion 107 may not be provided to the display portion DP and may be provided to only the connection portion CP.

In an embodiment, the concave portion 107 may overlap the central portion of the display portion DP. In an alternative embodiment, the concave portion 107 may include a first concave portion and a second concave portion, the first concave portion may extend along the edge of the display portion DP, overlap the display portion DP, and the second concave portion may be disposed on the central portion of the display portion DP.

FIGS. 9 to 25 are schematic cross-sectional views showing an embodiment of a method of manufacturing a display apparatus.

Hereinafter, the method of manufacturing a display apparatus is described with reference to FIGS. 9 to 25.

Figure 9:
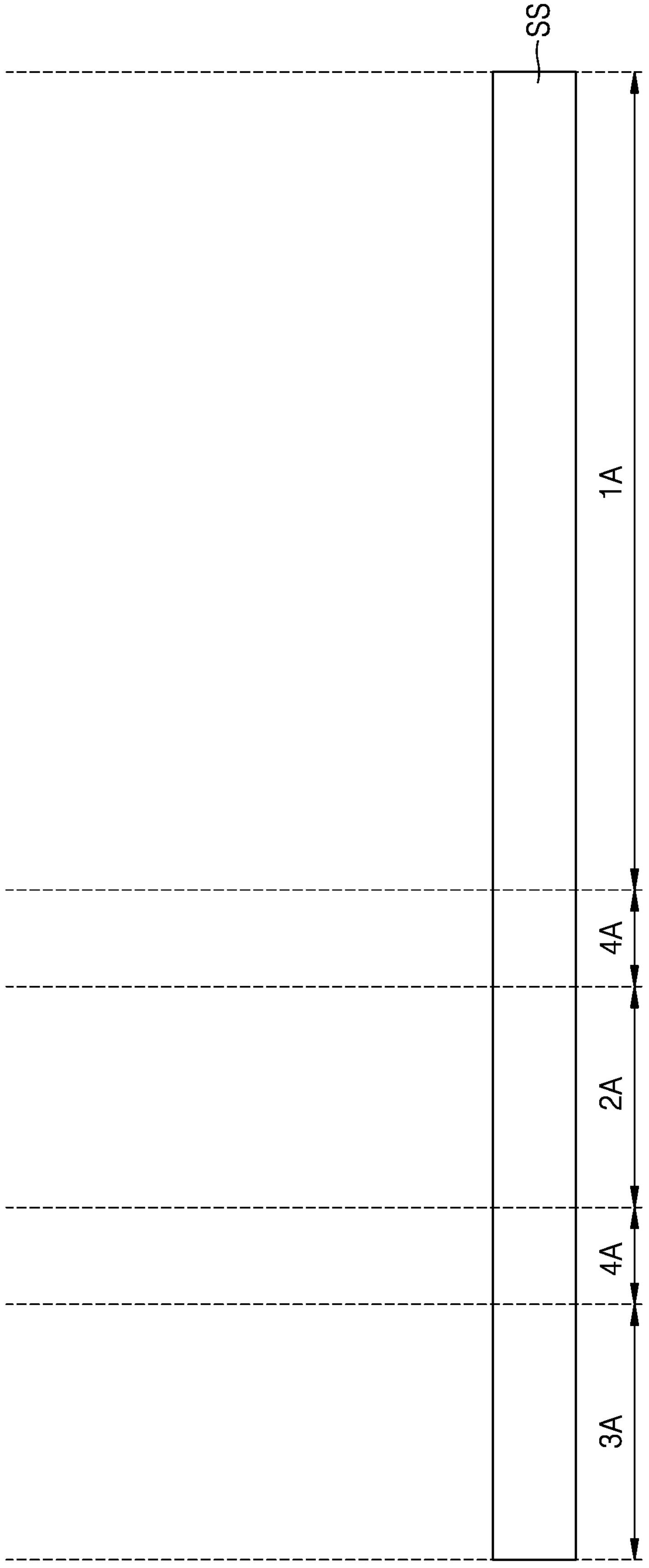
FIGS. 9 to 25 are schematic cross-sectional views showing an embodiment of a method of manufacturing a display apparatus.

Referring to FIG. 9, a carrier substrate SS may include a display area 1A, a connection area 2A, a dummy area 3A, and a cut area 4A. When manufacturing a flexible display apparatus or a bendable display apparatus, it is desired to form the substrate layer 100 to be flexible or bendable. To form the substrate layer 100, the carrier substrate SS may be used. In a process of manufacturing the display apparatus, the carrier substrate SS may support the substrate layer 100 below the substrate layer 100. For this purpose, the carrier substrate SS needs to be rigid. Accordingly, the carrier substrate SS may include glass. Specifically, the carrier substrate SS may include glass including silicon oxide ($SiO_x$). The carrier substrate SS may further include a relatively small amount of impurities. In an embodiment, the impurities may include aluminum (Al), potassium (K), or sodium (Na).

The display area 1A of the carrier substrate SS may correspond to the display portion DP (refer to FIG. 1) of the display panel 10 (or the substrate layer 100) described above. That is, elements formed in the display area 1A of the carrier substrate SS may configure the display portion DP of the display panel 10. However, the carrier substrate SS may be removed.

The connection area 2A of the carrier substrate SS may correspond to the connection portion CP (refer to FIG. 1) of the display panel 10 (or the substrate layer 100) described above. That is, elements formed in the connection area 2A of the carrier substrate SS may configure the connection portion CP of the display panel 10. However, the carrier substrate SS may be removed.

The dummy area 3A and the cut area 4A of the carrier substrate SS may correspond to the penetration-opening POP (refer to FIG. 1) of the display panel 10 (or the substrate layer 100) described above. That is, elements formed in the dummy area 3A and the cut area 4A of the carrier substrate SS are removed to define the penetration-opening POP of the display panel 10.

Figure 10:
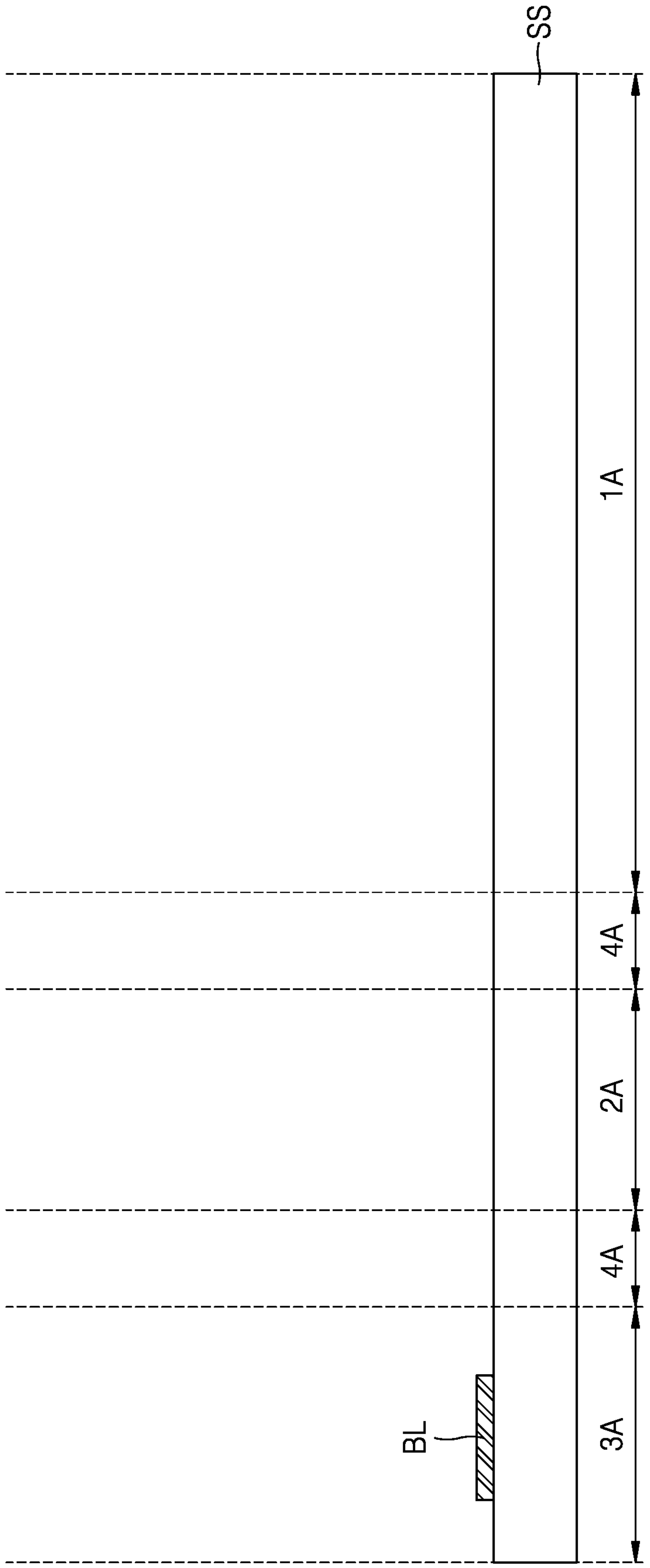

Referring to FIG. 10, a blocking layer BL may be formed in the dummy area 3A of the carrier substrate SS. The blocking layer BL may include a material capable of blocking a laser beam used in an operation of attaching/detaching the substrate layer 100 described below. In an embodiment, the blocking layer BL may include at least one of amorphous silicon (a-Si), polycrystalline silicon (poly-Si), crystalline silicon, ZnO, and IZO.

The dummy area 3A in which the blocking layer BL is formed may be a portion removed in a later process. In other words, it may be understood that the portion in which the blocking layer BL is formed is a portion in which the substrate layer 100 of the display apparatus is not formed.

Figure 11:
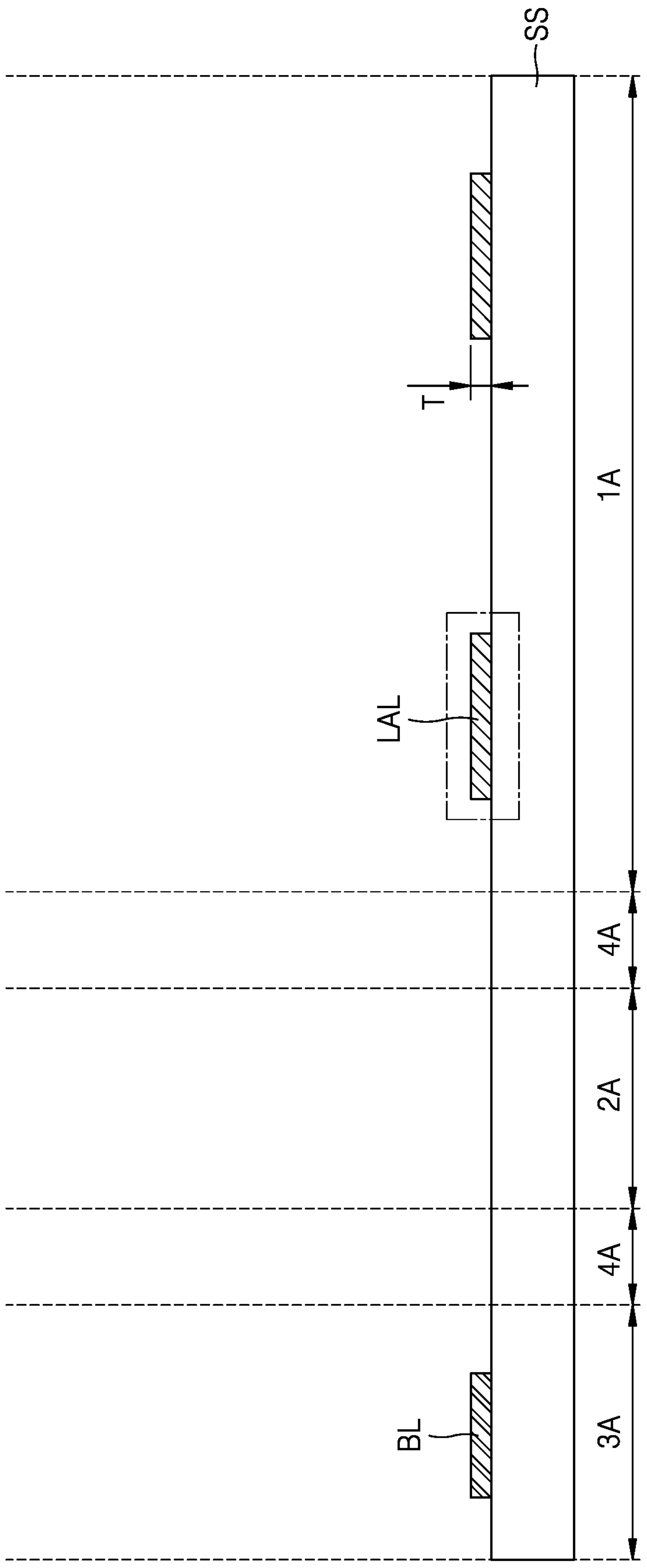

Referring to FIG. 11, after the blocking layer BL is formed in the dummy area 3A of the carrier substrate SS, the inorganic pattern layers LAL may be formed in the display area 1A or the connection area 2A of the carrier substrate SS. Although it is shown in FIG. 11 that the inorganic pattern layer LAL is formed only in the display area 1A, the disclosure is not limited thereto. The inorganic pattern layer LAL may be formed in also the connection area 2A.

In an embodiment, the inorganic pattern layer LAL may be an inorganic layer including silicon oxide. However, the disclosure is not limited thereto. In an embodiment, the inorganic pattern layer LAL may be an inorganic layer including silicon nitride or silicon oxynitride. The inorganic pattern layer LAL may be formed through plasma-enhanced chemical vapor deposition ("PECVD"), chemical vapor deposition ("CVD"), or atomic layer deposition ("ALD"). Because the inorganic pattern layer LAL is formed by the deposition methods, the inorganic pattern layer LAL may have less or reduced impurities than the carrier substrate SS.

In an embodiment, a thickness T of the inorganic pattern layer LAL in the thickness direction of the carrier substrate SS may be about 100 angstroms (Å) to about 5000 Å. The inorganic pattern layer LAL confines a gas generated during a laser release process. In the case where the thickness T of the inorganic pattern layer LAL is less than 100 Å, the thickness of the inorganic pattern layer LAL is too small and a gas moves on the inorganic pattern layer LAL. Accordingly, it may be difficult for the inorganic pattern layer LAL to play a role of confining the gas. In contrast, in the case where the thickness T of the inorganic pattern layer LAL exceeds 5000 Å, the thickness of the inorganic pattern layer LAL is too great, which may cause problems in the carrier substrate SS and make subsequent processes difficult.

Figure 12:
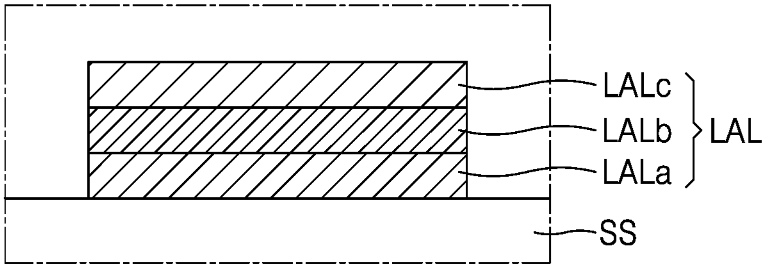
Figure 13:
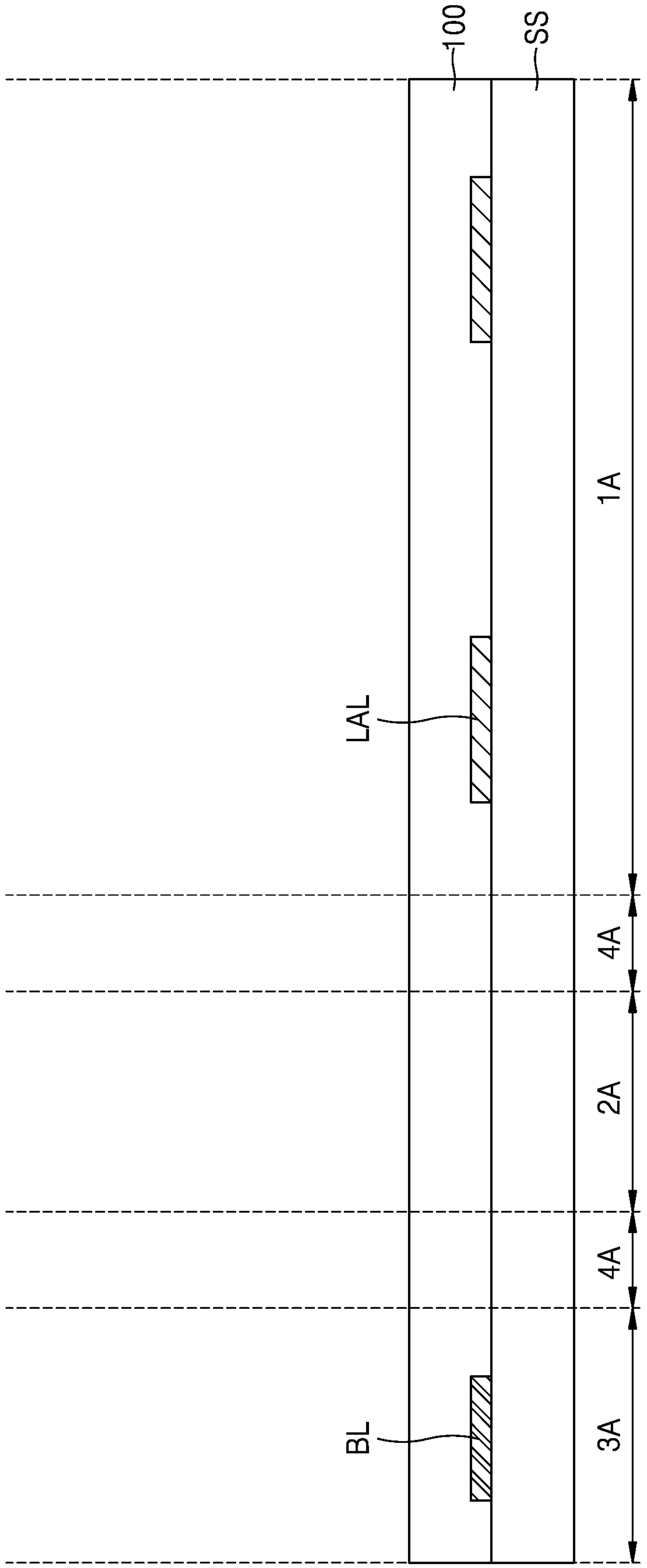

FIG. 12 is an enlarged view of the inorganic pattern layer of FIG. 11.

Referring to FIGS. 11 and 12, the inorganic pattern layers LAL are formed in the display area 1A and/or the connection area 2A of the carrier substrate SS, and then the inorganic pattern layer LAL may be plasma-treated using a nitrous oxide ($N_2O$) gas. The plasma treatment of the inorganic pattern layer LAL may be performed before the inorganic pattern layer LAL is patterned or after the inorganic pattern layer LAL is patterned.

Specifically, a relatively high frequency may be applied to nitrous oxide gas to generate plasma, and the upper surface of the inorganic pattern layer LAL may be plasma-treated using the plasma. When performing plasma treatment using nitrous oxide gas as described above, the flow rate of nitrous oxide gas may be about 20,000 standard cubic centimeters per minute (sccm) to about 100,000 sccm, for example, and the duration of the plasma treatment using nitrous oxide gas may be about 2 seconds to about 180 seconds. In addition, power may be about 5,000 watts (W) to about 10,000 W, for example. When performing plasma treatment using nitrous oxide gas, pressure may be applied. In an embodiment, the pressure may be about 500 millitorr (m Torr) to about 1,000 m Torr.

Because plasma treatment is performed using nitrous oxide gas, the contents of some of the elements of the inorganic pattern layer (LAL) may be different. That is, because the inorganic pattern layer LAL shown in FIG. 12 is plasma-treated using nitrous oxide gas, the inorganic pattern layer LAL may be the inorganic pattern layer LAL with different contents of the elements of the inorganic pattern layer LAL.

In an embodiment, because the inorganic pattern layer LAL is plasma-treated using nitrous oxide gas, the oxygen content per unit volume in the plasma-treated inorganic pattern layer LAL may be different depending on the position within the plasma-treated inorganic pattern layer LAL. Specifically, the oxygen content per unit volume may increase in a direction away from the carrier substrate SS, e.g., from the rear surface of the plasma-treated inorganic pattern layer LAL to the upper surface of the plasma-treated inorganic pattern layer LAL. The oxygen content per unit volume in a third portion LALc of the inorganic pattern layer LAL in the direction away from the carrier substrate SS may be greater than the oxygen content per unit volume in a first portion LALa of the inorganic pattern layer LAL closer to the carrier substrate SS. In this case, The oxygen content per unit volume in a second portion LALb between the third portion LALc and the first portion LALa may increase from the rear surface of the second portion LALb in the direction of the carrier substrate SS to the upper surface of the second portion LALb.

Because the inorganic pattern layer LAL is plasma-treated using nitrous oxide gas, the hydrogen content per unit volume in the plasma-treated inorganic pattern layer LAL may be different depending on the position within the plasma-treated inorganic pattern layer LAL. Specifically, the hydrogen content per unit volume may be reduced in a direction away from the carrier substrate SS, e.g., from the rear surface of the plasma-treated inorganic pattern layer LAL to the upper surface of the plasma-treated inorganic pattern layer LAL. The hydrogen content per unit volume in the third portion LALc of the inorganic pattern layer LAL in the direction opposite to the carrier substrate SS may be less than the content of hydrogen per unit volume in the first portion LALa of the inorganic pattern layer LAL closer to the carrier substrate SS. In this case, the hydrogen content per unit volume in the second portion LALb between the third portion LALc and the first portion LALa may be reduced from the rear surface of the second portion LALb in the direction of the carrier substrate SS to the upper surface of the second portion LALb.

Because plasma treatment using nitrous oxide gas supplies oxygen to the inorganic pattern layer LAL before plasma treatment, the oxygen content per unit volume in the plasma-treated inorganic pattern layer LAL may become greater than the oxygen content per unit volume in the inorganic pattern layer LAL before the plasma treatment. In addition, the oxygen content per unit volume in the plasma-treated inorganic pattern layer LAL may become less than the oxygen content per unit volume in the inorganic pattern layer LAL before the plasma treatment. Accordingly, because the number of hydroxyl group included in the inorganic pattern layer LAL before the plasma treatment is reduced, the plasma-treated inorganic pattern layer LAL may have fewer hydroxyl groups than the number of hydroxyl groups of the inorganic pattern layer LAL before plasma treatment.

FIGS. 26A to 32 are views for explaining an embodiment of the shape of an inorganic pattern layer used in a method of manufacturing a display apparatus.

Referring to FIGS. 26A to 32, the display area 1A may include a first display area 1Aa and a second display area 1Ab. The connection area 2A may be arranged between the first display area 1Aa and the second display area 1Ab to connect the first display area 1Aa and the second display area 1Ab to each other. The dummy area 3A and the cut area 4A may be arranged outside the display area 1A and the connection area 2A. In this case, the display area 1A may correspond to the display portion DP (refer to FIG. 1) of the display panel 10 (or the substrate layer 100). The connection area 2A may correspond to the connection portion CP (refer to FIG. 1) of the display panel 10 (or the substrate layer 100) described above. The dummy area 3A and the cut area 4A may correspond to the penetration-opening POP (refer to FIG. 1) of the display panel 10 (or the substrate layer 100) described above. In addition, as described below, the inorganic pattern layer LAL may be removed, and the concave portion 107 (refer to FIG. 8) may be formed in the rear surface of the substrate layer 100. Accordingly, the shape of the inorganic pattern layer LAL may correspond to the shape of the concave portion 107. In addition, the position of the inorganic pattern layer LAL may correspond to the position of the concave portion 107.

Figure 26A:
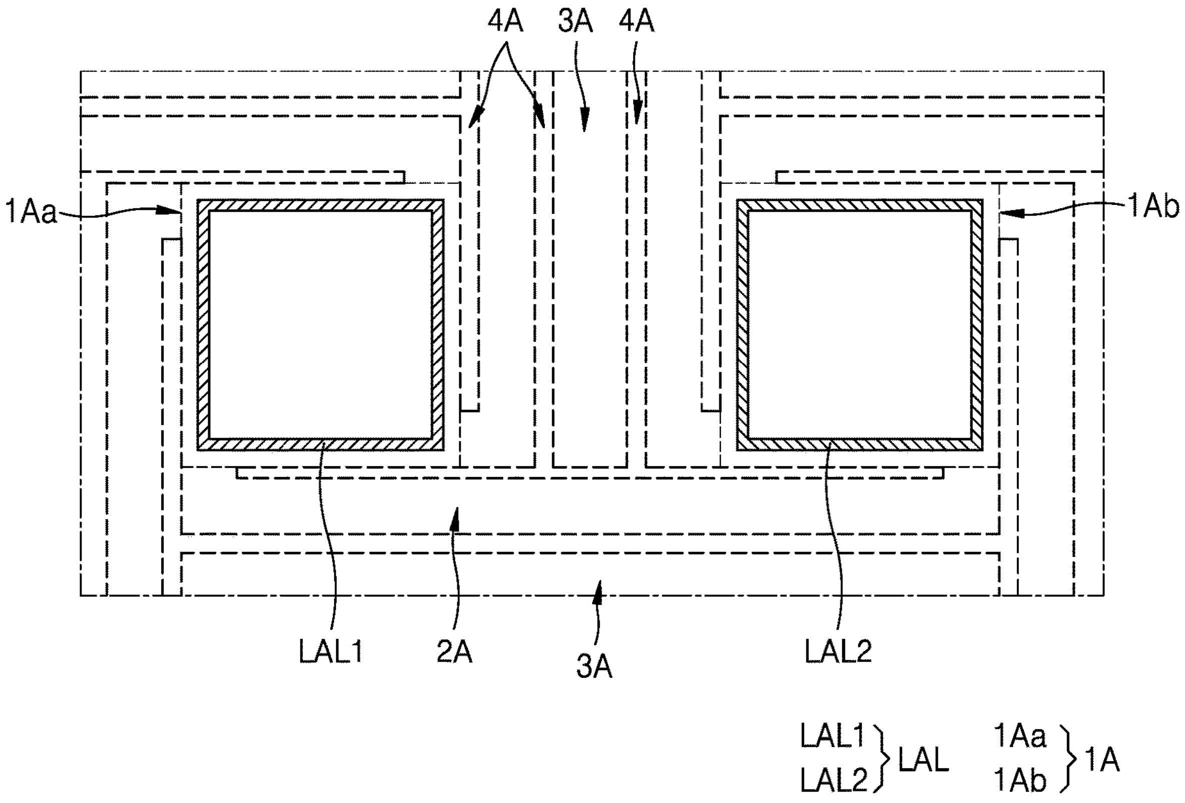
FIGS. 26A to 32 are views for explaining an embodiment of the shape of an inorganic pattern layer used in a method of manufacturing a display apparatus.

Referring to FIG. 26A, the inorganic pattern layers LAL may overlap the display area 1A. The inorganic pattern layers LAL may include a first inorganic pattern layer LAL1 and a second inorganic pattern layer LAL2. The first inorganic pattern layer LAL1 and the second inorganic pattern layer LAL2 may overlap the display area 1A, extend the circumference of the display area 1A, and be provided in a closed loop shape. Specifically, the first inorganic pattern layer LAL1 may overlap the first display area 1Aa, extend along the circumference of the first display area 1Aa, and be provided in a closed loop shape. In addition, the second inorganic pattern layer LAL2 may overlap the second display area 1Ab, extend along the circumference of the second display area 1Ab, and be provided in a closed loop shape.

Figure 26B:
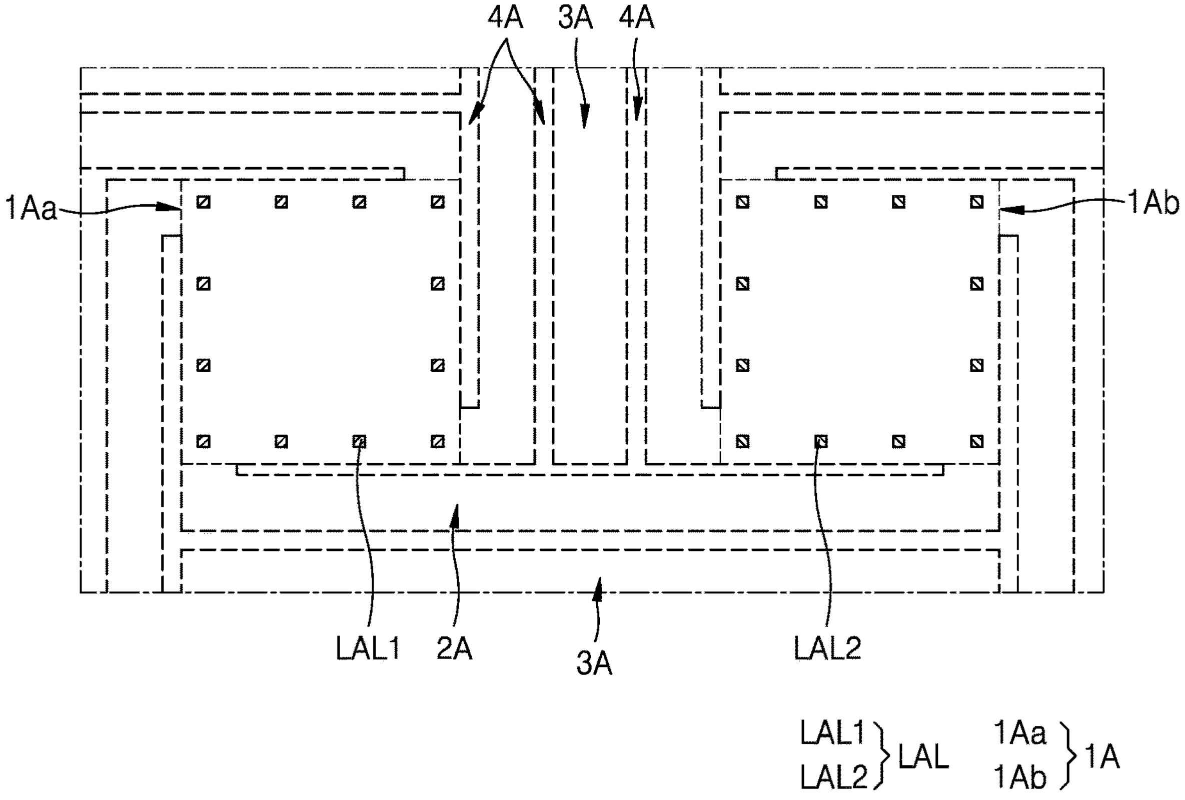

Referring to FIG. 26B, the inorganic pattern layers LAL may include the first inorganic pattern layer LAL1 and the second inorganic pattern layer LAL2. The first inorganic pattern layer LAL1 and the second inorganic pattern layer LAL2 may each include a plurality of patterns.

The first inorganic pattern layer LAL1 including the plurality of patterns may overlap the first display area 1Aa. The plurality of patterns of the first inorganic pattern layer LAL1 may be arranged along the circumference of the first display area 1Aa.

The second inorganic pattern layer LAL2 including the plurality of patterns may overlap the second display area 1Ab. The plurality of patterns of the second inorganic pattern layer LAL2 may be arranged along the circumference of the second display area 1Ab.

Figure 26C:
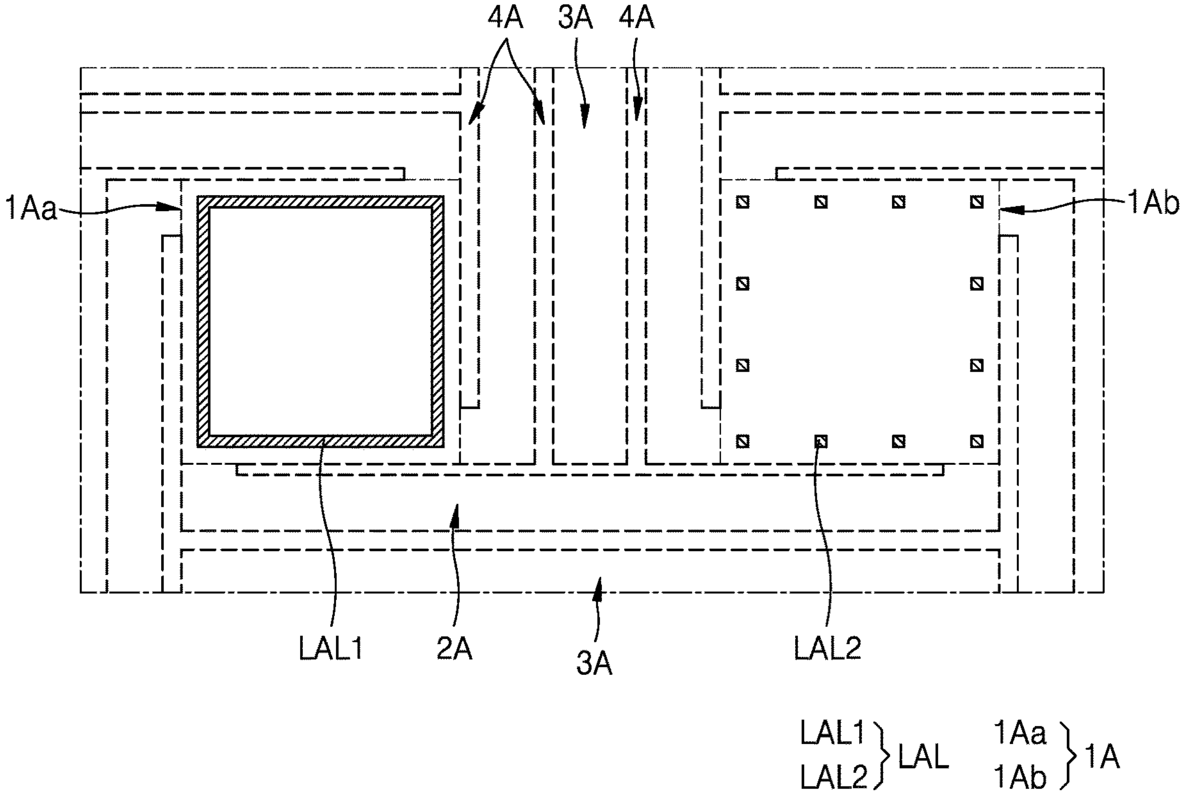

Referring to FIG. 26C, the inorganic pattern layers LAL may include the first inorganic pattern layer LAL1 and the second inorganic pattern layer LAL2. The second inorganic pattern layer LAL2 may include a plurality of patterns. The first inorganic pattern layer LAL1 may overlap the first display area 1Aa, extend along the circumference of the first display area 1Aa, and be provided in a closed loop shape. The second inorganic pattern layer LAL2 including the plurality of patterns may overlap the second display area 1Ab. The plurality of patterns of the second inorganic pattern layer LAL2 may be arranged along the circumference of the second display area 1Ab. Though not shown, the opposite case may also be possible.

Figure 27A:
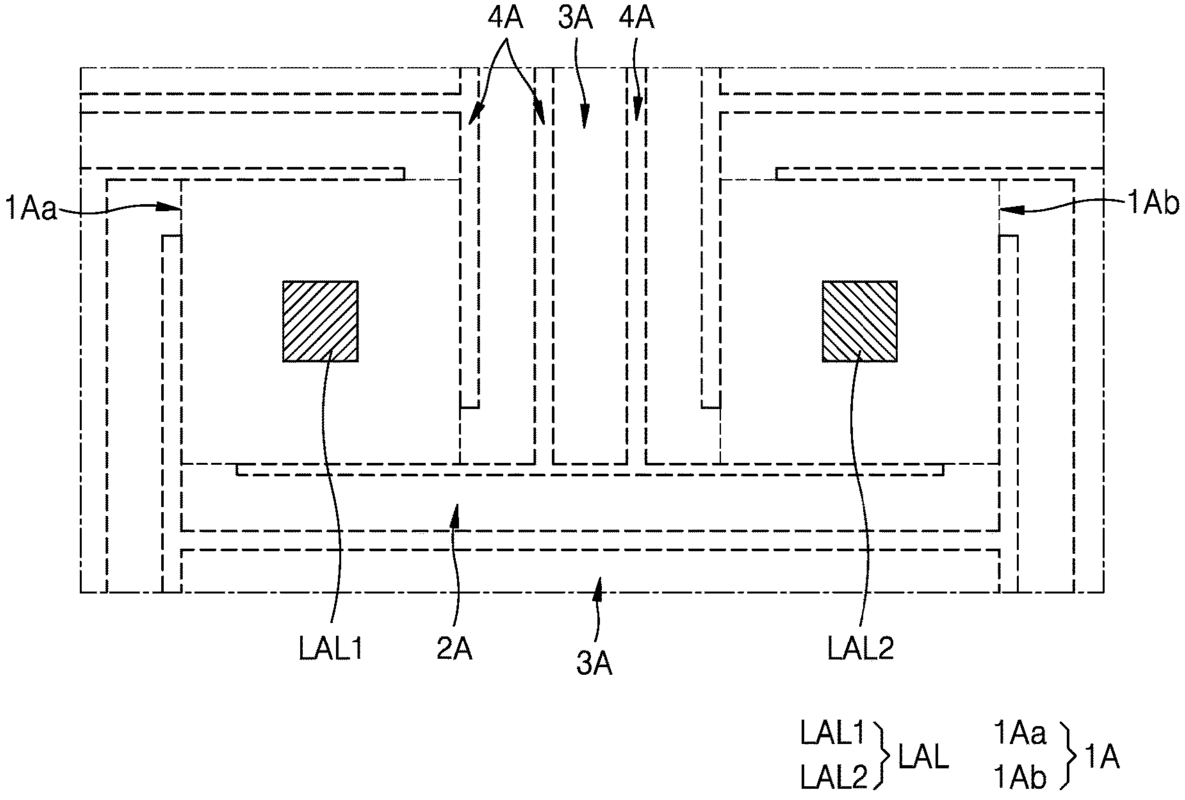

Referring to FIG. 27A, the inorganic pattern layers LAL may overlap the display area 1A. The inorganic pattern layers LAL may include a first inorganic pattern layer LAL1 and a second inorganic pattern layer LAL2. The first inorganic pattern layer LAL1 and the second inorganic pattern layer LAL2 may each overlap the central portion of the display area 1A. Specifically, the first inorganic pattern layer LAL1 may overlap the central portion of the first display area 1Aa. In an embodiment, the first inorganic pattern layer LAL1 may be arranged in the central portion of the first display area 1Aa. In addition, the second inorganic pattern layer LAL2 may overlap the central portion of the second display area 1Ab. In an embodiment, the second inorganic pattern layer LAL2 may be arranged in the central portion of the second display area 1Ab.

Figure 27B:
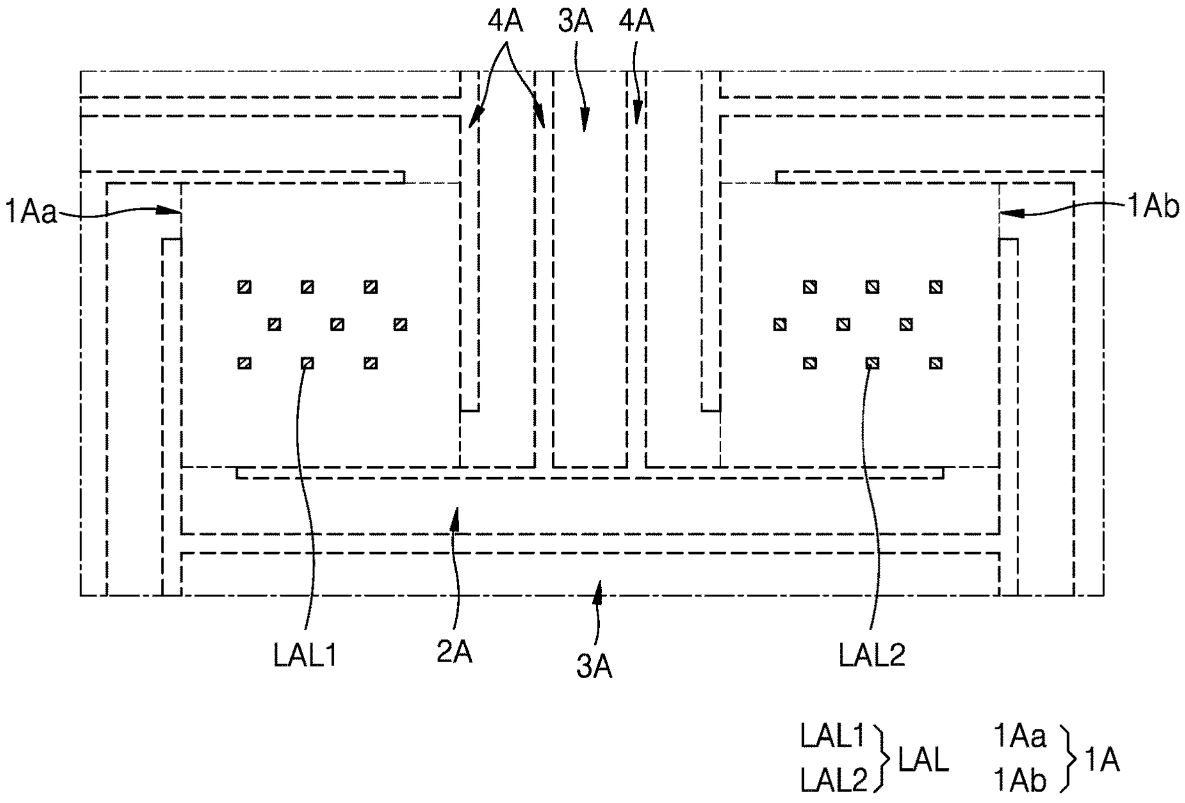

Referring to FIG. 27B, the inorganic pattern layers LAL may include the first inorganic pattern layer LAL1 and the second inorganic pattern layer LAL2. The first inorganic pattern layer LAL1 and the second inorganic pattern layer LAL2 may each include a plurality of patterns.

The first inorganic pattern layer LAL1 including the plurality of patterns may overlap the central portion of the first display area 1Aa. In an embodiment, the first inorganic pattern layer LAL1 including the plurality of patterns may be arranged around the central portion of the first display area 1Aa.

In addition, the second inorganic pattern layer LAL2 including the plurality of patterns may overlap the central portion of the second display area 1Ab. In an embodiment, the second inorganic pattern layer LAL2 including the plurality of patterns may be arranged around the central portion of the second display area 1Ab.

Figure 27C:
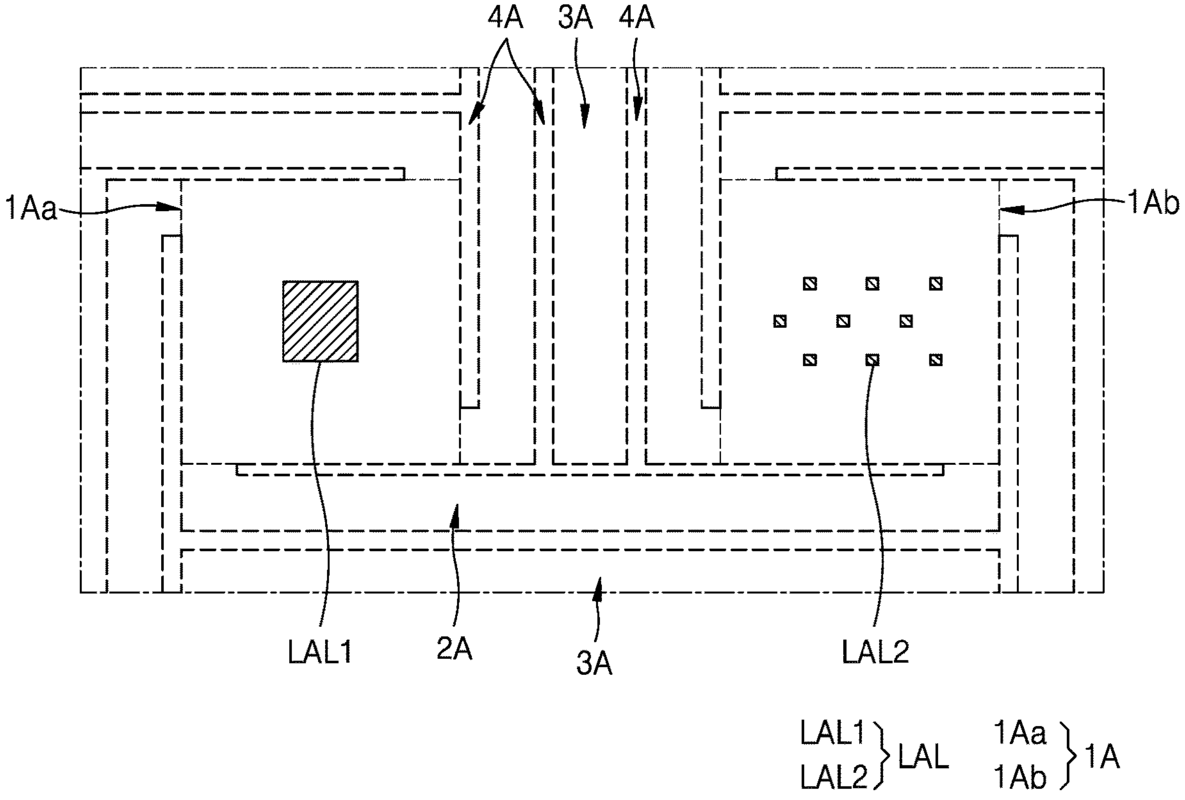

Referring to FIG. 27C, the inorganic pattern layers LAL may include the first inorganic pattern layer LAL1 and the second inorganic pattern layer LAL2. The second inorganic pattern layer LAL2 may include a plurality of patterns. The first inorganic pattern layer LAL1 may overlap the central portion of the first display area 1Aa. In an embodiment, the first inorganic pattern layer LAL1 may be arranged in the central portion of the first display area 1Aa.

The second inorganic pattern layer LAL2 including the plurality of patterns may overlap the central portion of the second display area 1Ab. In an embodiment, the second inorganic pattern layer LAL2 including the plurality of patterns may be arranged around the central portion of the second display area 1Ab. Though not shown, the opposite case may also be possible.

Figure 28A:
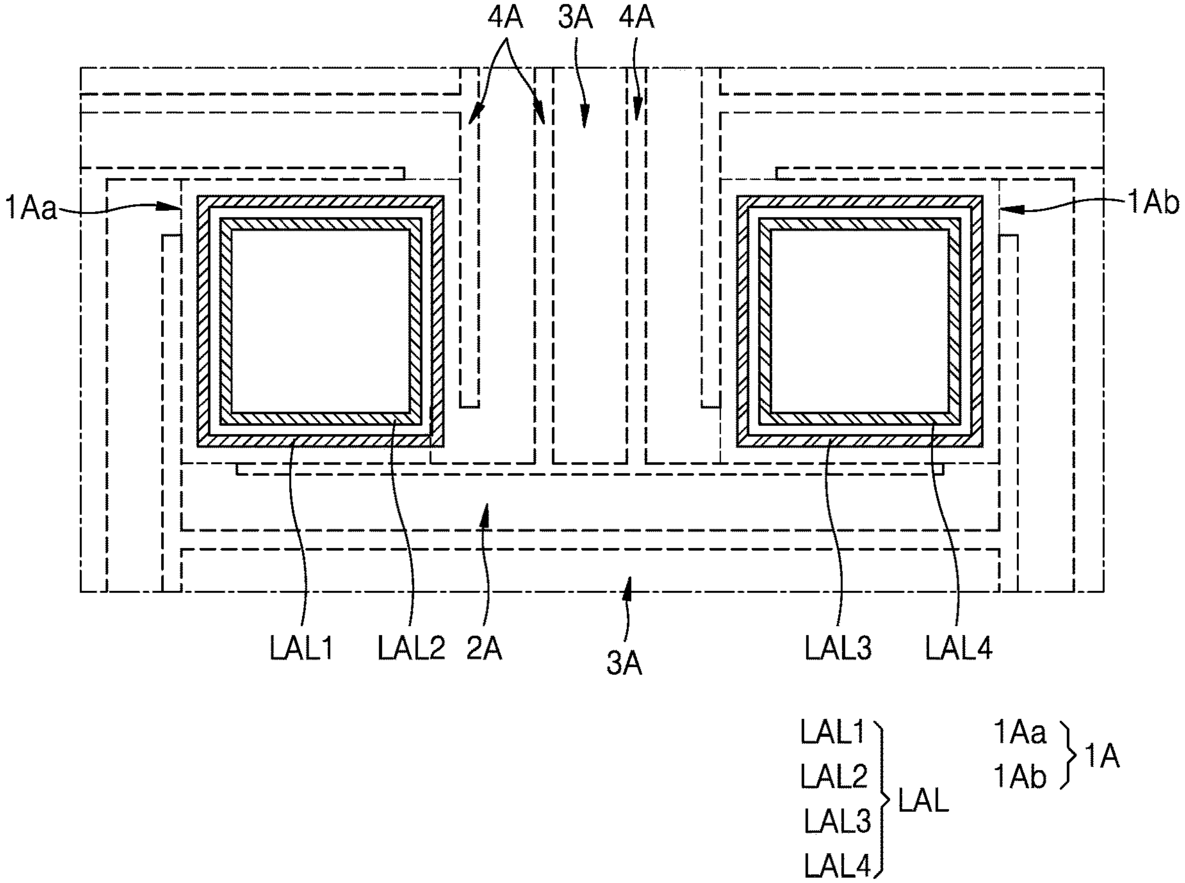

Referring to FIG. 28A, the inorganic pattern layers LAL may overlap the display area 1A. The inorganic pattern layer LAL may include a first inorganic pattern layer LAL1, a second inorganic pattern layer LAL2, a third inorganic pattern layer LAL3, and a fourth inorganic pattern layer LAL4. The first inorganic pattern layer LAL1, the second inorganic pattern layer LAL2, the third inorganic pattern layer LAL3, and the fourth inorganic pattern layer LAL4 may overlap the display area 1A.

First, the first inorganic pattern layer LAL1 may overlap the first display area 1Aa, extend along the circumference of the first display area 1Aa, and be provided in a closed loop shape. The second inorganic pattern layer LAL2 may overlap the first display area 1Aa, extend along the circumference of the first display area 1Aa, and be provided in a closed loop shape. The second inorganic pattern layer LAL2 may be arranged inside the first inorganic pattern layer LAL1. The first inorganic pattern layer LAL1 may be arranged along the circumference of the second inorganic pattern layer LAL2.

The third inorganic pattern layer LAL3 may overlap the second display area 1Ab, extend along the circumference of the second display area 1Ab, and be provided in a closed loop shape. The fourth inorganic pattern layer LAL4 may overlap the second display area 1Ab, extend along the circumference of the second display area 1Ab, and be provided in a closed loop shape. The fourth inorganic pattern layer LAL4 may be arranged inside the third inorganic pattern layer LAL3. The third inorganic pattern layer LAL3 may be arranged along the circumference of the fourth inorganic pattern layer LAL4.

Figure 28B:
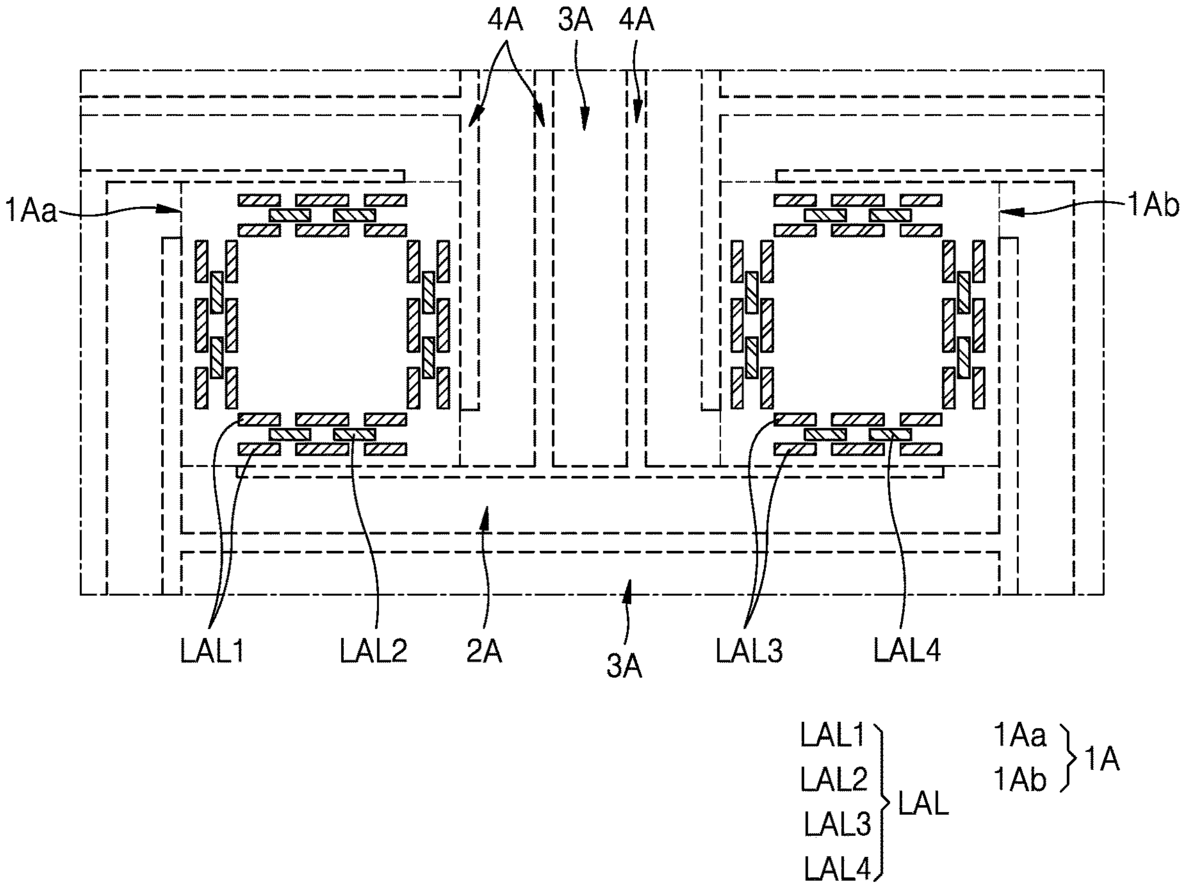

Referring to FIG. 28B, the inorganic pattern layer LAL may include the first inorganic pattern layer LAL1, the second inorganic pattern layer LAL2, the third inorganic pattern layer LAL3, and the fourth inorganic pattern layer LAL4. The first inorganic pattern layer LAL1, the second inorganic pattern layer LAL2, the third inorganic pattern layer LAL3, and the fourth inorganic pattern layer LAL4 may each include a plurality of patterns.

First, the first inorganic pattern layer LAL1 including the plurality of patterns may overlap the first display area 1Aa. The plurality of patterns of the first inorganic pattern layer LAL1 may be arranged along the circumference of the first display area 1Aa. The second inorganic pattern layer LAL2 including the plurality of patterns may overlap the first display area 1Aa. The plurality of patterns of the second inorganic pattern layer LAL2 may be arranged along the circumference of the first display area 1Aa. In addition, again, the plurality of patterns of the first inorganic pattern layer LAL1 may be arranged along the circumference of the first display area 1Aa. That is, the second inorganic pattern layer LAL2 including the plurality of patterns may be provided inside the first inorganic pattern layer LAL1 including the plurality of patterns, and again, the first inorganic pattern layer LAL1 including the plurality of patterns may be provided inside the second inorganic pattern layer LAL2 including the plurality of patterns. The plurality of patterns of the first inorganic pattern layer LAL1 and the plurality of patterns of the second inorganic pattern layer LAL2 may be arranged in different rows and/or different columns. That is, the plurality of patterns of the first inorganic pattern layer LAL1 and the plurality of patterns of the second inorganic pattern layer LAL2 may be provided in zigzag patterns.

In addition, the third inorganic pattern layer LAL3 including the plurality of patterns may overlap the second display area 1Ab. The plurality of patterns of the third inorganic pattern layer LAL3 may be arranged along the circumference of the second display area 1Ab. The fourth inorganic pattern layer LAL4 including the plurality of patterns may overlap the second display area 1Ab. The plurality of patterns of the fourth inorganic pattern layer LAL4 may be arranged along the circumference of the second display area 1Ab. In addition, again, the plurality of patterns of the third inorganic pattern layer LAL3 may be arranged along the circumference of the second display area 1Ab. That is, the fourth inorganic pattern layer LAL4 including the plurality of patterns may be provided inside the third inorganic pattern layer LAL3 including the plurality of patterns, and again, the third inorganic pattern layer LAL3 including the plurality of patterns may be provided inside the fourth inorganic pattern layer LAL4 including the plurality of patterns. The plurality of patterns of the third inorganic pattern layer LAL3 and the plurality of patterns of the fourth inorganic pattern layer LAL4 may be arranged in different rows and/or different columns. That is, the plurality of patterns of the third inorganic pattern layer LAL3 and the plurality of patterns of the fourth inorganic pattern layer LAL4 may be provided in zigzag patterns.

Figure 28C:
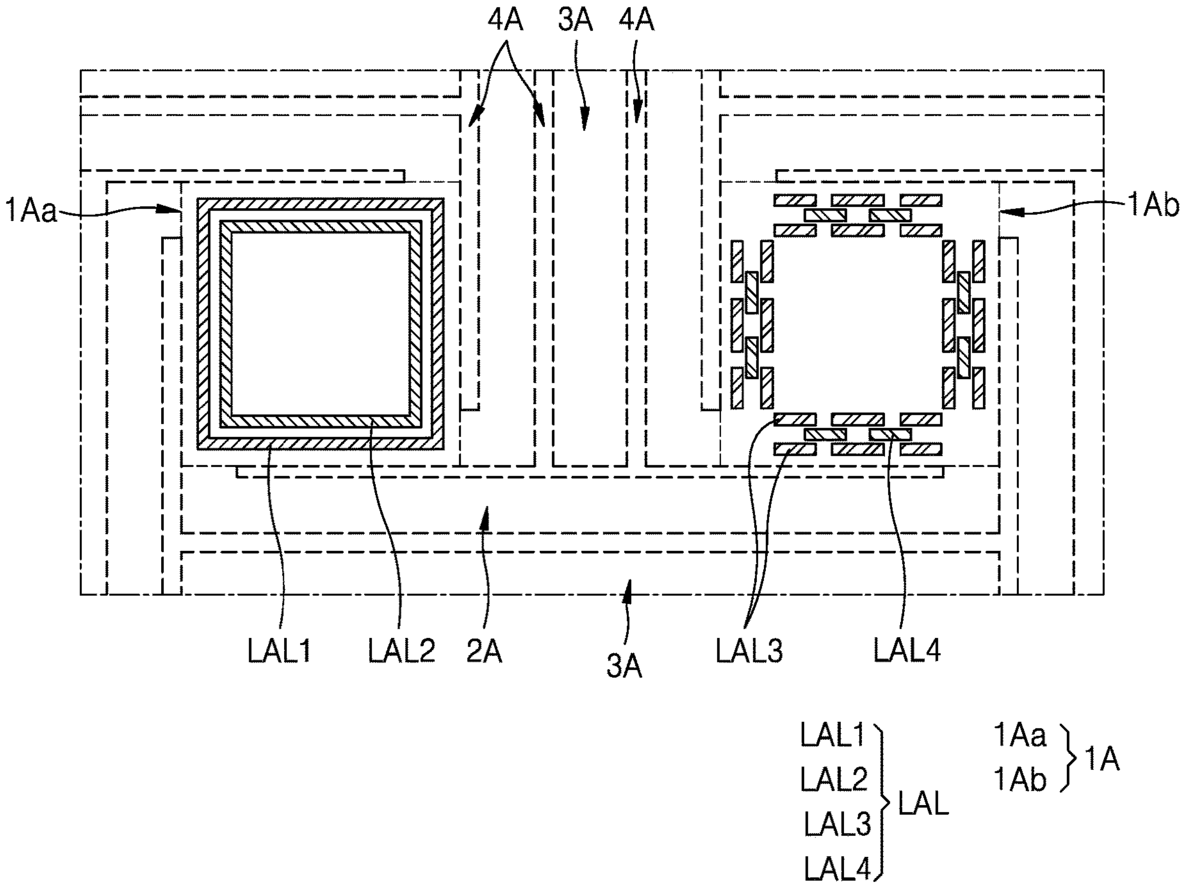

Referring to FIG. 28C, the inorganic pattern layer LAL may include the first inorganic pattern layer LAL1, the second inorganic pattern layer LAL2, the third inorganic pattern layer LAL3, and the fourth inorganic pattern layer LAL4. The third inorganic pattern layer LAL3 and the fourth inorganic pattern layer LAL4 may each include a plurality of patterns.

First, the first inorganic pattern layer LAL1 may overlap the first display area 1Aa, extend along the circumference of the first display area 1Aa, and be provided in a closed loop shape. The second inorganic pattern layer LAL2 may overlap the first display area 1Aa, extend along the circumference of the first display area 1Aa, and be provided in a closed loop shape. The second inorganic pattern layer LAL2 may be arranged inside the first inorganic pattern layer LAL1. The first inorganic pattern layer LAL1 may be arranged along the circumference of the second inorganic pattern layer LAL2.

The third inorganic pattern layer LAL3 including the plurality of patterns may overlap the second display area 1Ab. The plurality of patterns of the third inorganic pattern layer LAL3 may be arranged along the circumference of the second display area 1Ab. The fourth inorganic pattern layer LAL4 including the plurality of patterns may overlap the second display area 1Ab. The plurality of patterns of the fourth inorganic pattern layer LAL4 may be arranged along the circumference of the second display area 1Ab. In addition, again, the plurality of patterns of the third inorganic pattern layer LAL3 may be arranged along the circumference of the second display area 1Ab. That is, the fourth inorganic pattern layer LAL4 including the plurality of patterns may be provided inside the third inorganic pattern layer LAL3 including the plurality of patterns, and again, the third inorganic pattern layer LAL3 including the plurality of patterns may be provided inside the fourth inorganic pattern layer LAL4 including the plurality of patterns. Though not shown, the opposite case may also be possible.

Figure 29A:
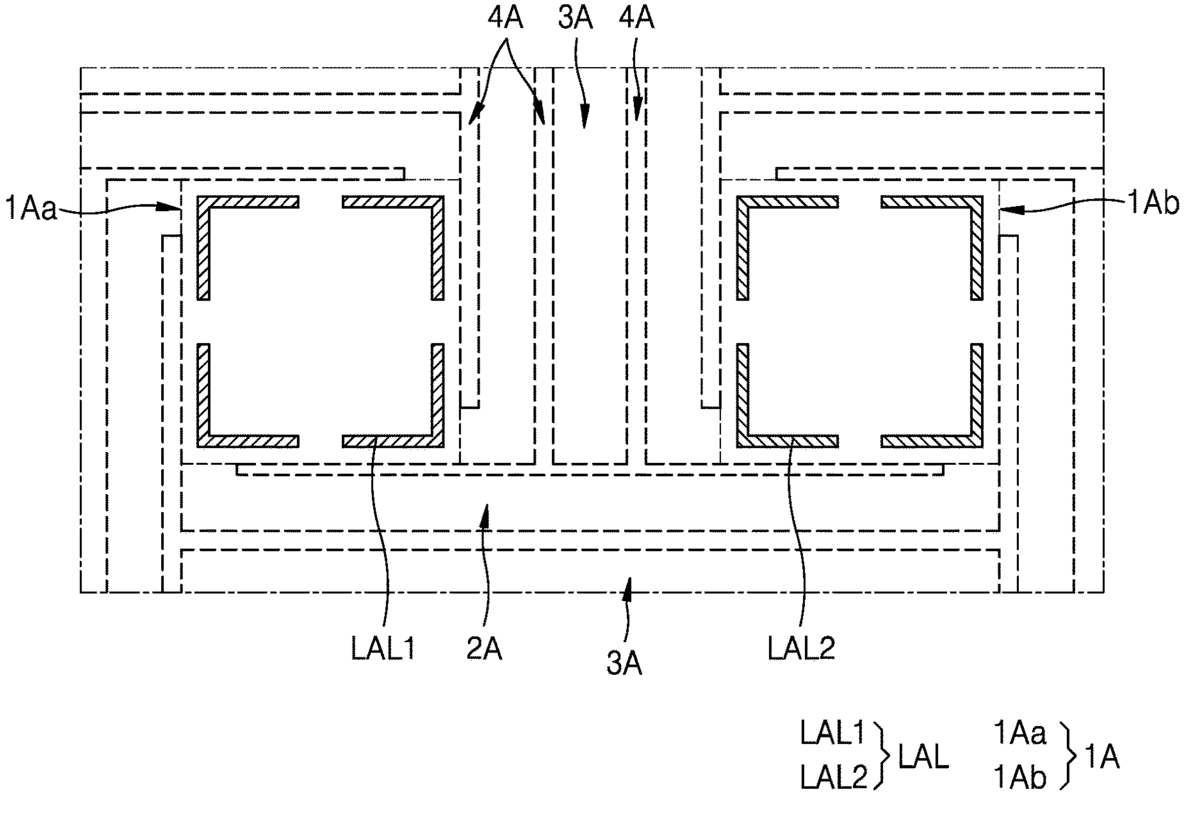

Referring to FIG. 29A, the inorganic pattern layers LAL may overlap the display area 1A. The inorganic pattern layers LAL may include a first inorganic pattern layer LAL1 and a second inorganic pattern layer LAL2. The first inorganic pattern layer LAL1 and the second inorganic pattern layer LAL2 may each include four patterns. However, the disclosure is not limited thereto. The first inorganic pattern layer LAL1 and the second inorganic pattern layer LAL2 may each include, two, three, or five or more patterns.

The first inorganic pattern layer LAL1 including four patterns may overlap the first display area 1Aa. Four patterns of the first inorganic pattern layer LAL1 may be arranged along the circumference of the first display area 1Aa. An opening may be defined between four patterns of the first inorganic pattern layer LAL1.

The second inorganic pattern layer LAL2 including four patterns may overlap the second display area 1Ab. Four patterns of the second inorganic pattern layer LAL2 may be arranged along the circumference of the second display area 1Ab. An opening may be defined between four patterns of the second inorganic pattern layer LAL2. Gas may move through an opening defined between four patterns of the second inorganic pattern layer LAL2.

Figure 29B:
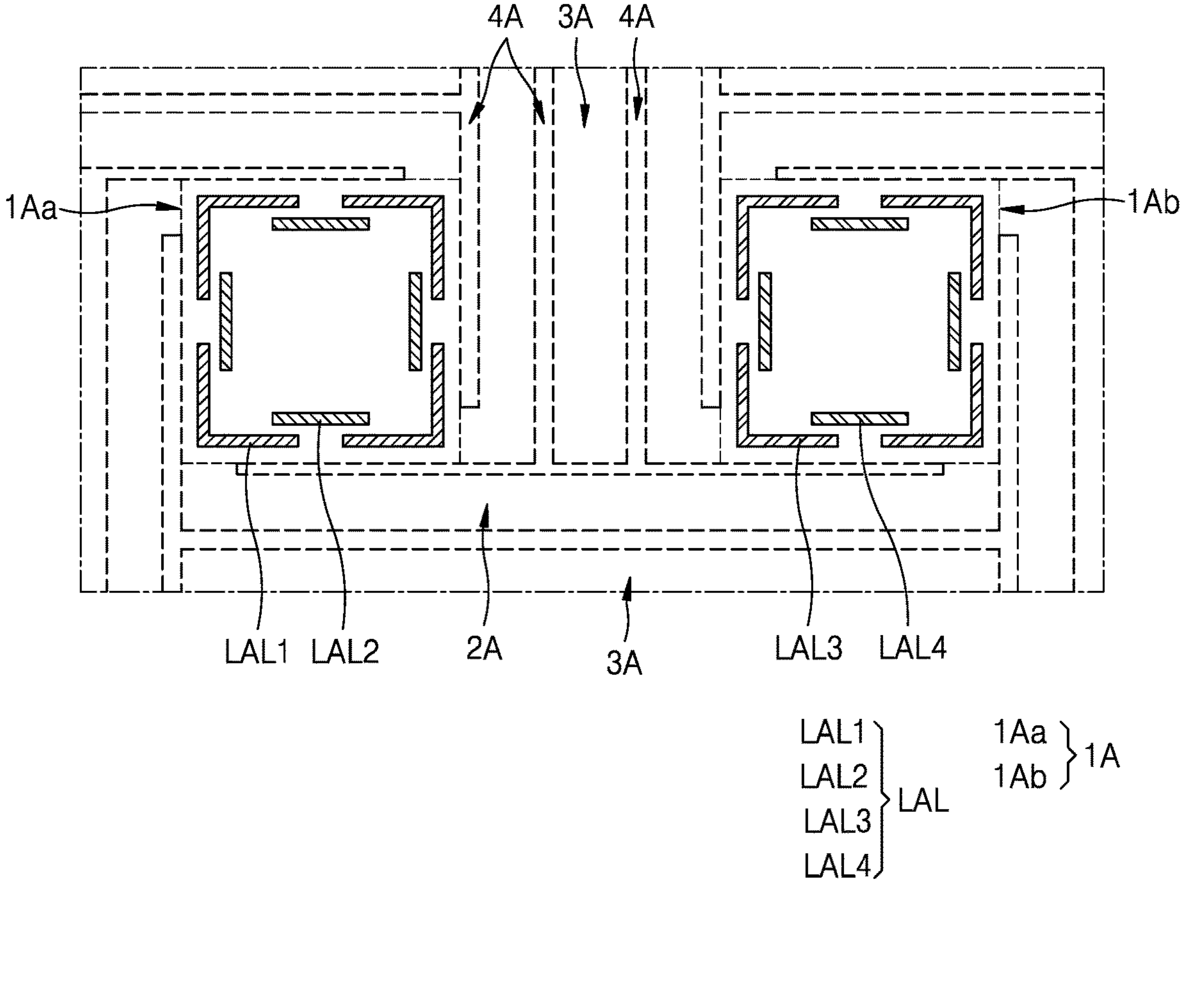

Referring to FIG. 29B, the inorganic pattern layer LAL may include the first inorganic pattern layer LAL1, the second inorganic pattern layer LAL2, the third inorganic pattern layer LAL3, and the fourth inorganic pattern layer LAL4. The first inorganic pattern layer LAL1, the second inorganic pattern layer LAL2, the third inorganic pattern layer LAL3, and the fourth inorganic pattern layer LAL4 may each include four patterns. However, the disclosure is not limited thereto. The first inorganic pattern layer LAL1, the second inorganic pattern layer LAL2, the third inorganic pattern layer LAL3, and the fourth inorganic pattern layer LAL4 may each include two, three, or five or more patterns.

The first inorganic pattern layer LAL1 including four patterns may overlap the first display area 1Aa. Four patterns of the first inorganic pattern layer LAL1 may be arranged along the circumference of the first display area 1Aa. An opening may be defined between four patterns of the first inorganic pattern layer LAL1. Gas may move through an opening defined between four patterns of the first inorganic pattern layer LAL1.

The second inorganic pattern layer LAL2 including four patterns may overlap the first display area 1Aa. Four patterns of the second inorganic pattern layer LAL2 may be arranged along the circumference of the first display area 1Aa. The second inorganic pattern layer LAL2 may be arranged inside the first inorganic pattern layer LAL1. Each of the four patterns of the second inorganic pattern layer LAL2 may be arranged to correspond to an opening defined between four patterns of the first inorganic pattern layer LAL1. That is, each of the four patterns of the second inorganic pattern layer LAL2 may be arranged on a place apart in the first direction and the second direction from the opening defined between four patterns of the first inorganic pattern layer LAL1. In this case, because a flow of gas occurring in a process of releasing a laser beam may be controlled, an efficiency of the laser release process may be improved.

The third inorganic pattern layer LAL3 including four patterns may overlap the second display area 1Ab. Four patterns of the third inorganic pattern layer LAL3 may be arranged along the circumference of the second display area 1Ab. An opening may be defined between four patterns of the third inorganic pattern layer LAL3.

The fourth inorganic pattern layer LAL4 including four patterns may overlap the second display area 1Ab. Four patterns of the fourth inorganic pattern layer LAL4 may be arranged along the circumference of the second display area 1Ab. The fourth inorganic pattern layer LAL4 may be arranged inside the third inorganic pattern layer LAL3. Each of the four patterns of the fourth inorganic pattern layer LAL4 may be arranged to correspond to an opening defined between four patterns of the third inorganic pattern layer LAL3. That is, each of the four patterns of the fourth inorganic pattern layer LAL4 may be arranged on a place apart in the first direction and the second direction from the opening defined between four patterns of the third inorganic pattern layer LAL3. In this case, because a flow of gas occurring in a process of attaching/detaching a laser beam may be controlled, an efficiency of the laser attaching/detaching process may be improved.

Figure 29C:
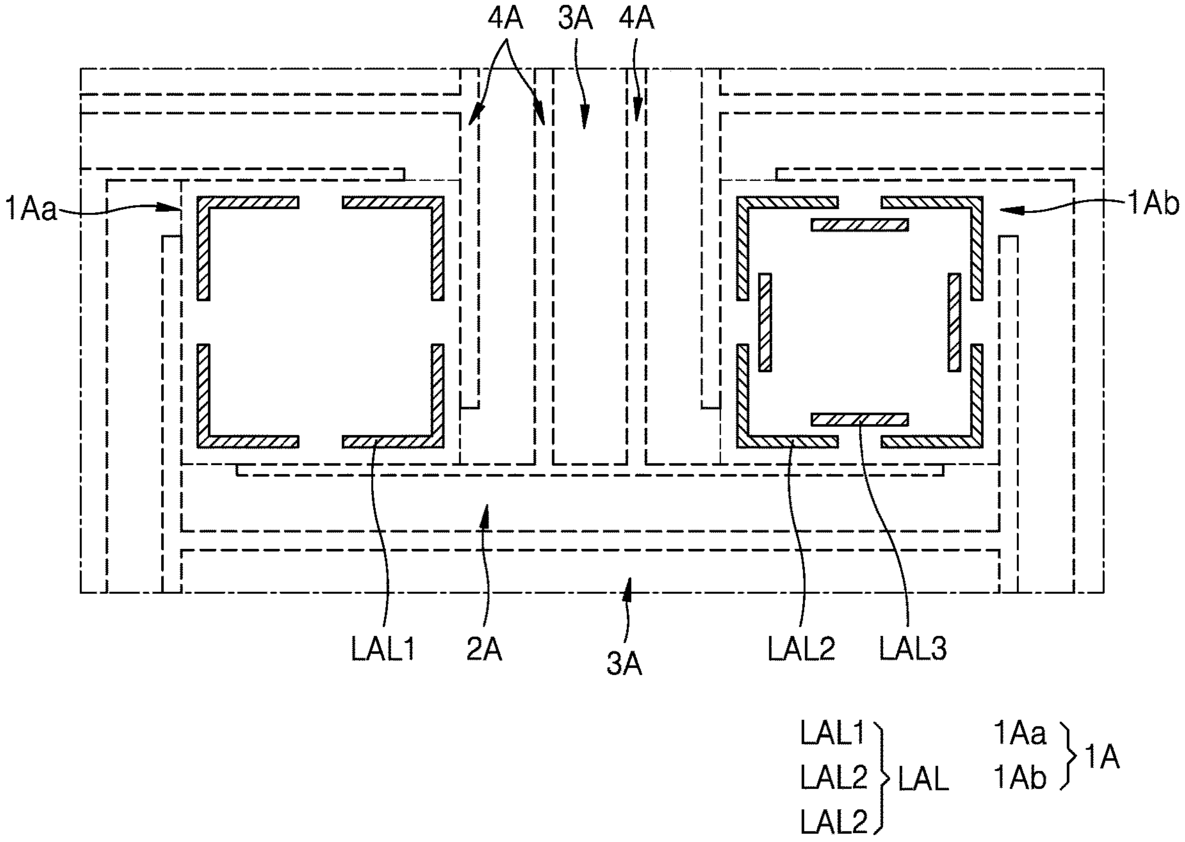

Referring to FIG. 29C, the inorganic pattern layers LAL may overlap the display area 1A. The inorganic pattern layer LAL may include the first inorganic pattern layer LAL1, the second inorganic pattern layer LAL2, and the third inorganic pattern layer LAL3. The first inorganic pattern layer LAL1, the second inorganic pattern layer LAL2, and the third inorganic pattern layer LAL3 may each include four patterns. However, the disclosure is not limited thereto. The first inorganic pattern layer LAL1, the second inorganic pattern layer LAL2, and the third inorganic pattern layer LAL3 may each include two, three, or five or more patterns.

The first inorganic pattern layer LAL1 including four patterns may overlap the first display area 1Aa. Four patterns of the first inorganic pattern layer LAL1 may be arranged along the circumference of the first display area 1Aa. An opening may be defined between four patterns of the first inorganic pattern layer LAL1.

The second inorganic pattern layer LAL2 including four patterns may overlap the second display area 1Ab. Four patterns of the second inorganic pattern layer LAL2 may be arranged along the circumference of the second display area 1Ab. An opening may be defined between four patterns of the second inorganic pattern layer LAL2.

The third inorganic pattern layer LAL3 including four patterns may overlap the second display area 1Ab. Four patterns of the third inorganic pattern layer LAL3 may be arranged along the circumference of the second display area 1Ab. The third inorganic pattern layer LAL3 may be arranged inside the second inorganic pattern layer LAL2. Each of the four patterns of the third inorganic pattern layer LAL3 may be arranged to correspond to an opening defined between four patterns of the second inorganic pattern layer LAL2. That is, each of the four patterns of the third inorganic pattern layer LAL3 may be arranged on a place apart in the first direction and the second direction from the opening defined between four patterns of the second inorganic pattern layer LAL2. In this case, because a flow of gas occurring in a process of attaching/detaching a laser beam may be controlled, an efficiency of the laser attaching/detaching process may be improved.

Figure 30A:
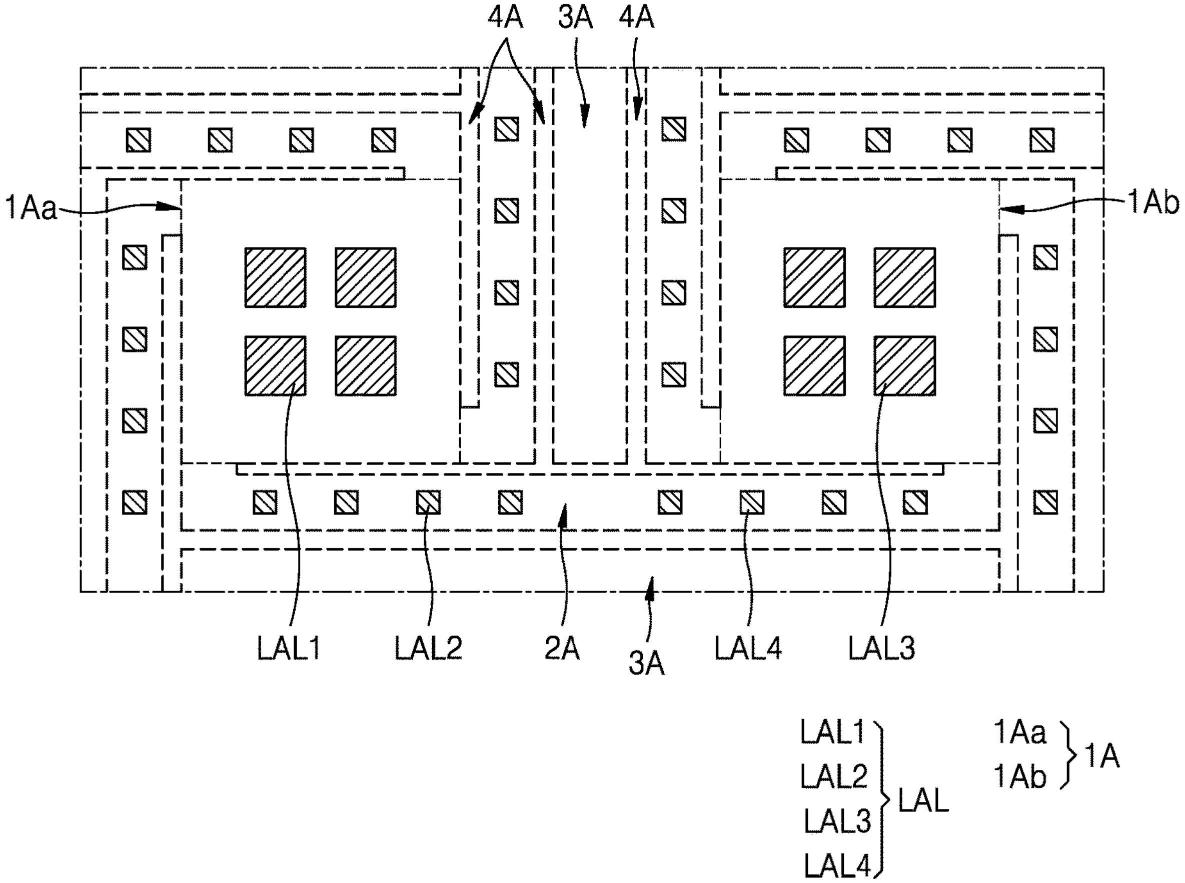

Referring to FIG. 30A, the inorganic pattern layers LAL may overlap the display area 1A and the connection area 2A. The inorganic pattern layer LAL may include the first inorganic pattern layer LAL1, the second inorganic pattern layer LAL2, the third inorganic pattern layer LAL3, and the fourth inorganic pattern layer LAL4. The first inorganic pattern layer LAL1 and the third inorganic pattern layer LAL3 may each overlap the display area 1A, and the second inorganic pattern layer LAL2 and the fourth inorganic pattern layer LAL4 may overlap the connection area 2A. The first inorganic pattern layer LAL1, the second inorganic pattern layer LAL2, the third inorganic pattern layer LAL3, and the fourth inorganic pattern layer LAL4 may each include a plurality of patterns.

The first inorganic pattern layer LAL1 including the plurality of patterns may overlap the first display area 1Aa. The second inorganic pattern layer LAL2 including the plurality of patterns may overlap the connection area 2A adjacent to the first display area 1Aa. In this case, the area of one pattern of the first inorganic pattern layer LAL1 may be greater than the area of one pattern of the second inorganic pattern layer LAL2. However, the disclosure is not limited thereto.

The third inorganic pattern layer LAL3 including the plurality of patterns may overlap the second display area 1Ab. The fourth inorganic pattern layer LAL4 including the plurality of patterns may overlap the connection area 2A adjacent to the second display area 1Ab. In this case, the area of one third inorganic pattern layer LAL3 may be greater than the area of one fourth inorganic pattern layer LAL4. However, the disclosure is not limited thereto.

Figure 30B:
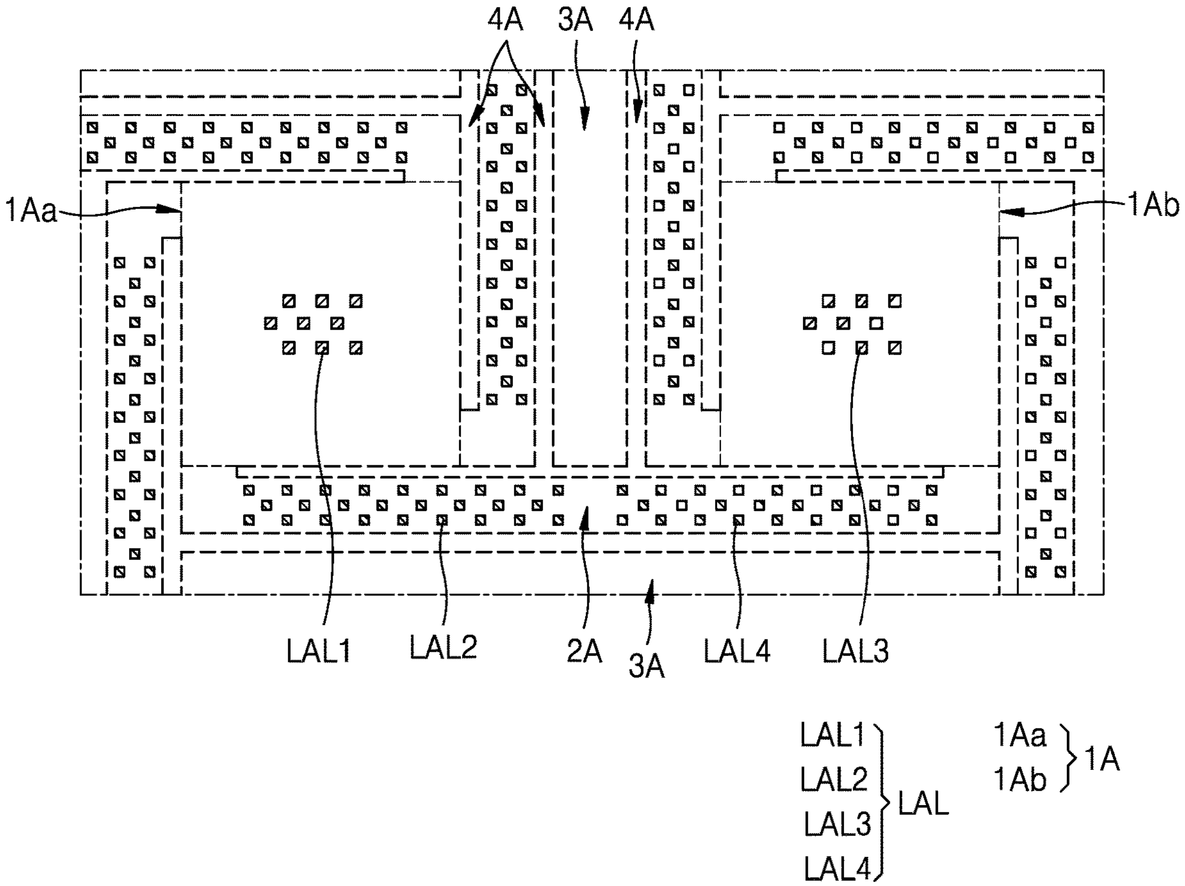

Referring to FIG. 30B, the inorganic pattern layers LAL may overlap the display area 1A and the connection area 2A. The inorganic pattern layer LAL may include a first inorganic pattern layer LAL1, a second inorganic pattern layer LAL2, a third inorganic pattern layer LAL3, and a fourth inorganic pattern layer LAL4. The first inorganic pattern layer LAL1 and the third inorganic pattern layer LAL3 may each overlap the display area 1A, and the second inorganic pattern layer LAL2 and the fourth inorganic pattern layer LAL4 may overlap the connection area 2A. The first inorganic pattern layer LAL1, the second inorganic pattern layer LAL2, the third inorganic pattern layer LAL3, and the fourth inorganic pattern layer LAL4 may each include a plurality of patterns.

The first inorganic pattern layer LAL1 including the plurality of patterns may overlap the first display area 1Aa. The plurality of patterns of the first inorganic pattern layer LAL1 may be alternately arranged in a zigzag shape with each other.

The second inorganic pattern layer LAL2 including the plurality of patterns may overlap the connection area 2A adjacent to the first display area 1Aa. The plurality of patterns of the second inorganic pattern layer LAL2 may be alternately arranged in a zigzag shape with each other.

The third inorganic pattern layer LAL3 including the plurality of patterns may overlap the second display area 1Ab. The plurality of patterns of the third inorganic pattern layer LAL3 may be alternately arranged in a zigzag shape with each other.

The fourth inorganic pattern layer LAL4 including the plurality of patterns may overlap the connection area 2A adjacent to the second display area 1Ab. The plurality of patterns of the fourth inorganic pattern layer LAL4 may be alternately arranged in a zigzag shape with each other.

Figure 30C:
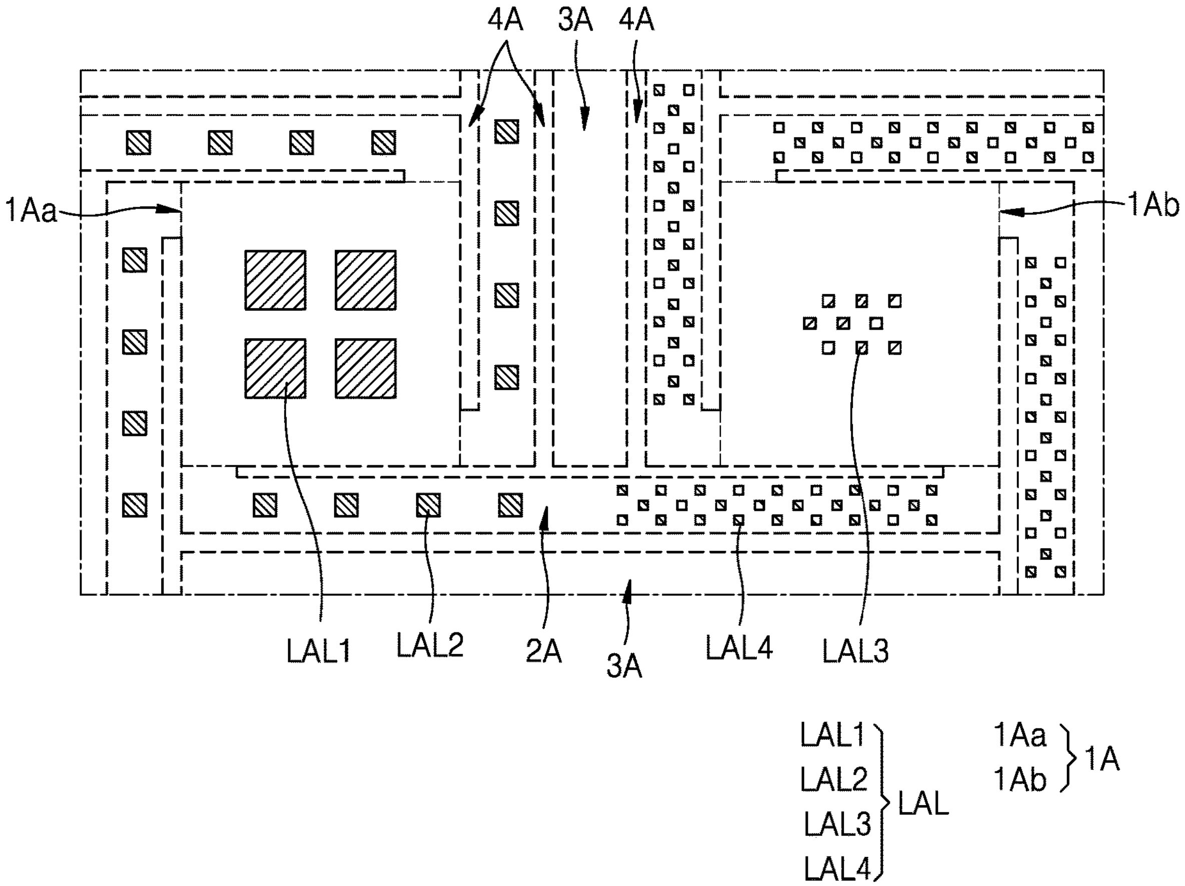

Referring to FIG. 30C, the inorganic pattern layers LAL may overlap the display area 1A and the connection area 2A. The inorganic pattern layer LAL may include a first inorganic pattern layer LAL1, a second inorganic pattern layer LAL2, a third inorganic pattern layer LAL3, and a fourth inorganic pattern layer LAL4. The first inorganic pattern layer LAL1 and the third inorganic pattern layer LAL3 may each overlap the display area 1A, and the second inorganic pattern layer LAL2 and the fourth inorganic pattern layer LAL4 may overlap the connection area 2A. The first inorganic pattern layer LAL1, the second inorganic pattern layer LAL2, the third inorganic pattern layer LAL3, and the fourth inorganic pattern layer LAL4 may each include a plurality of patterns.

The first inorganic pattern layer LAL1 including the plurality of patterns may overlap the first display area 1Aa. The second inorganic pattern layer LAL2 including the plurality of patterns may overlap the connection area 2A adjacent to the first display area 1Aa. In this case, the area of one pattern of the first inorganic pattern layer LAL1 may be greater than the area of one pattern of the second inorganic pattern layer LAL2. However, the disclosure is not limited thereto.

The third inorganic pattern layer LAL3 including the plurality of patterns may overlap the second display area 1Ab. The plurality of patterns of the third inorganic pattern layer LAL3 may be alternately arranged in a zigzag shape with each other.

The fourth inorganic pattern layer LAL4 including the plurality of patterns may overlap the connection area 2A adjacent to the second display area 1Ab. The plurality of patterns of the fourth inorganic pattern layer LAL4 may be alternately arranged in a zigzag shape with each other.

In an embodiment, the area of one pattern of the first inorganic pattern layer LAL1 may be greater than the area of one pattern of the third inorganic pattern layer LAL3. In addition, the area of one pattern of the second inorganic pattern layer LAL2 may be greater than the area of one pattern of the fourth inorganic pattern layer LAL4.

Figure 31A:
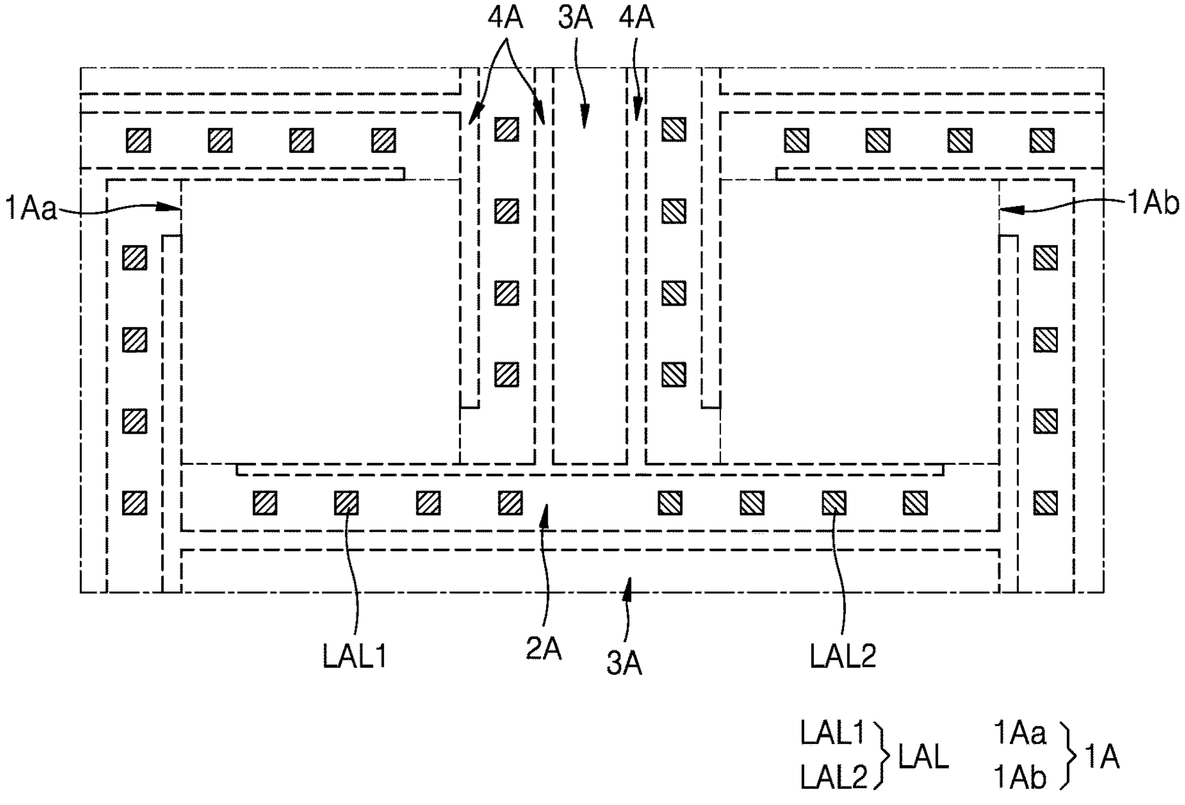

Referring to FIG. 31A, the inorganic pattern layers LAL may overlap the connection area 2A. Specifically, the inorganic pattern layers LAL may not overlap the display area 1A and may overlap the connection area 2A. The inorganic pattern layers LAL may include the first inorganic pattern layer LAL1 and the second inorganic pattern layer LAL2. The first inorganic pattern layer LAL1 and the second inorganic pattern layer LAL2 may each include a plurality of patterns.

The first inorganic pattern layer LAL1 including the plurality of patterns may overlap the connection area 2A adjacent to the first display area 1Aa. The first inorganic pattern layer LAL1 including the plurality of patterns may not overlap the first display area 1Aa.

The second inorganic pattern layer LAL2 including the plurality of patterns may overlap the connection area 2A adjacent to the second display area 1Ab. The second inorganic pattern layer LAL2 including the plurality of patterns may not overlap the second display area 1Ab.

Figure 31B:
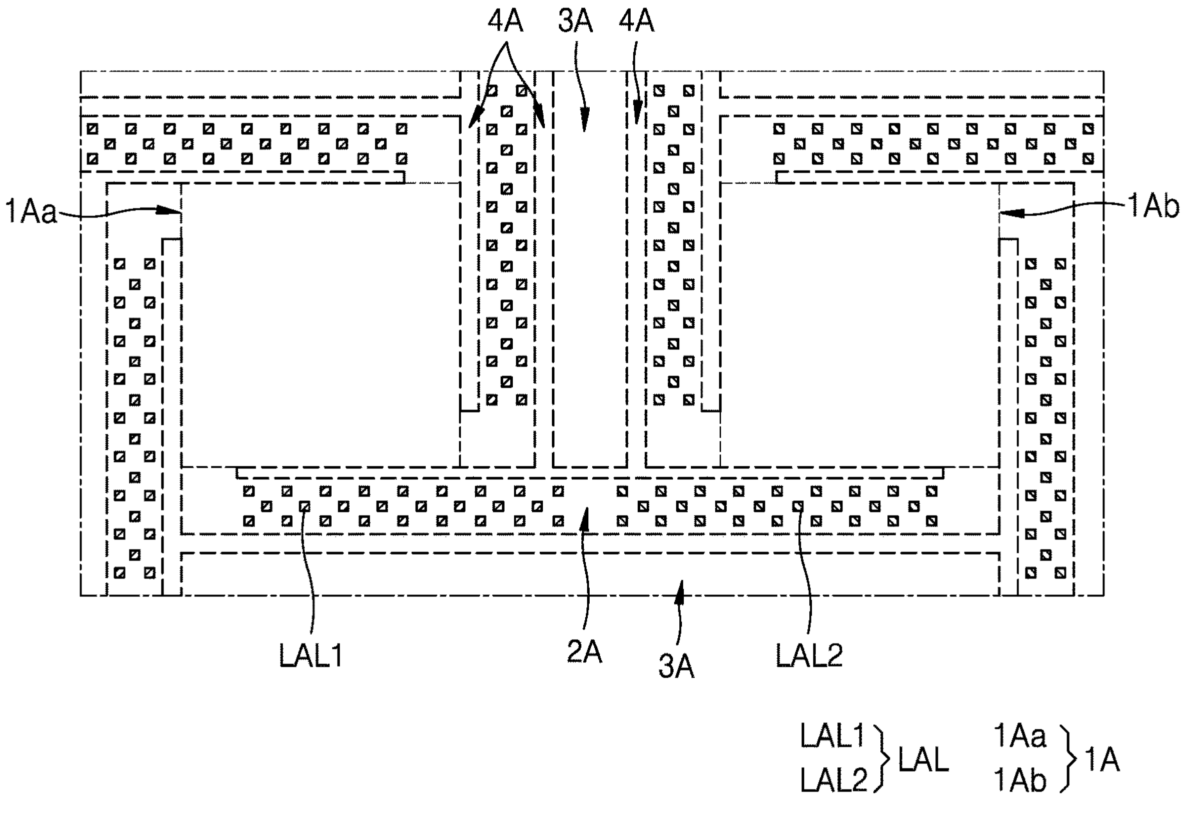

Referring to FIG. 31B, the inorganic pattern layers LAL may overlap the connection area 2A. Specifically, the inorganic pattern layers LAL may not overlap the display area 1A and may overlap the connection area 2A. The inorganic pattern layers LAL may include the first inorganic pattern layer LAL1 and the second inorganic pattern layer LAL2. The first inorganic pattern layer LAL1 and the second inorganic pattern layer LAL2 may each include a plurality of patterns.

The first inorganic pattern layer LAL1 including the plurality of patterns may overlap the connection area 2A adjacent to the first display area 1Aa. The plurality of patterns of the first inorganic pattern layer LAL1 may be alternately arranged in a zigzag shape with each other. The first inorganic pattern layer LAL1 including the plurality of patterns may not overlap the first display area 1Aa.

The second inorganic pattern layer LAL2 including the plurality of patterns may overlap the connection area 2A adjacent to the second display area 1Ab. The plurality of patterns of the second inorganic pattern layer LAL2 may be alternately arranged in a zigzag shape with each other. The second inorganic pattern layer LAL2 including the plurality of patterns may not overlap the second display area 1Ab.

Figure 31C:
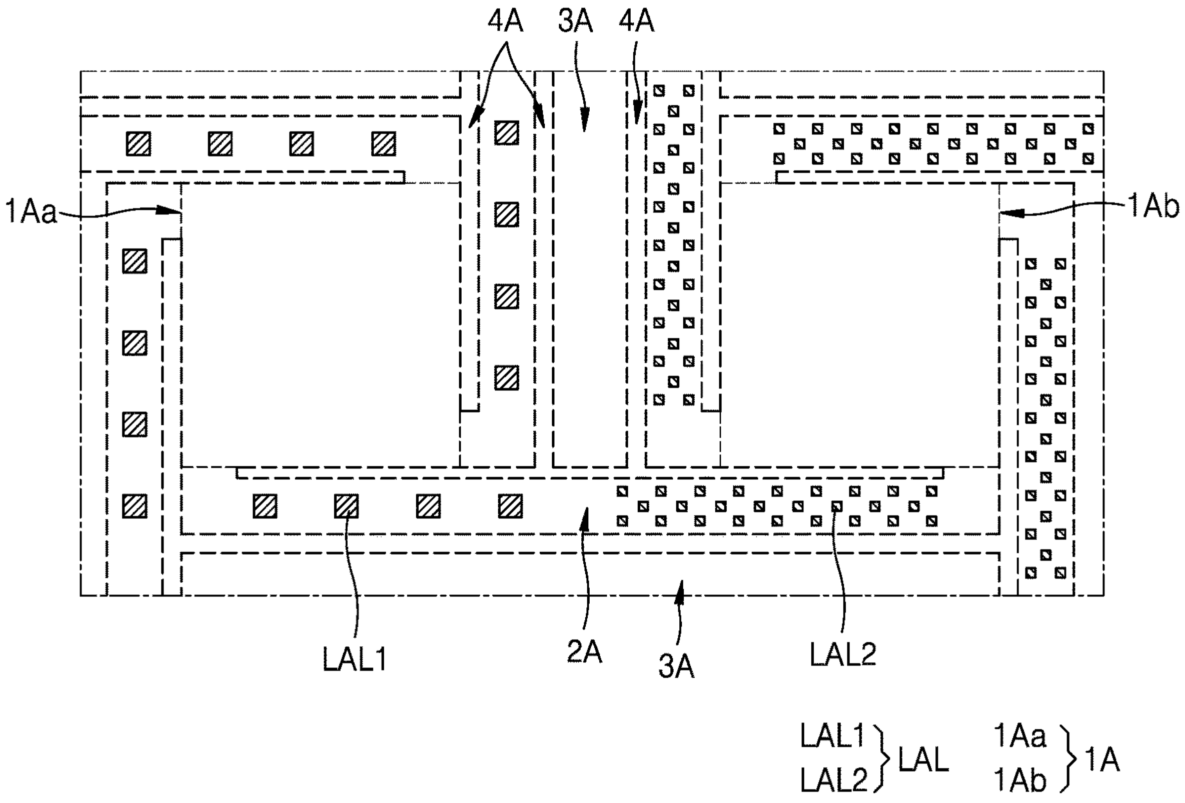

Referring to FIG. 31C, the inorganic pattern layers LAL may overlap the connection area 2A. Specifically, the inorganic pattern layers LAL may not overlap the display area 1A and may overlap the connection area 2A. The inorganic pattern layers LAL may include the first inorganic pattern layer LAL1 and the second inorganic pattern layer LAL2. The first inorganic pattern layer LAL1 and the second inorganic pattern layer LAL2 may each include a plurality of patterns.

The first inorganic pattern layer LAL1 including the plurality of patterns may overlap the connection area 2A adjacent to the first display area 1Aa. The first inorganic pattern layer LAL1 including the plurality of patterns may not overlap the first display area 1Aa.

The second inorganic pattern layer LAL2 including the plurality of patterns may overlap the connection area 2A adjacent to the first display area 1Aa. The plurality of patterns of the second inorganic pattern layer LAL2 may be alternately arranged in a zigzag shape with each other. The second inorganic pattern layer LAL2 including the plurality of patterns may not overlap the second display area 1Ab.

In an embodiment, the area of one pattern of the first inorganic pattern layer LAL1 may be greater than the area of one pattern of the second inorganic pattern layer LAL2.

Figure 32:
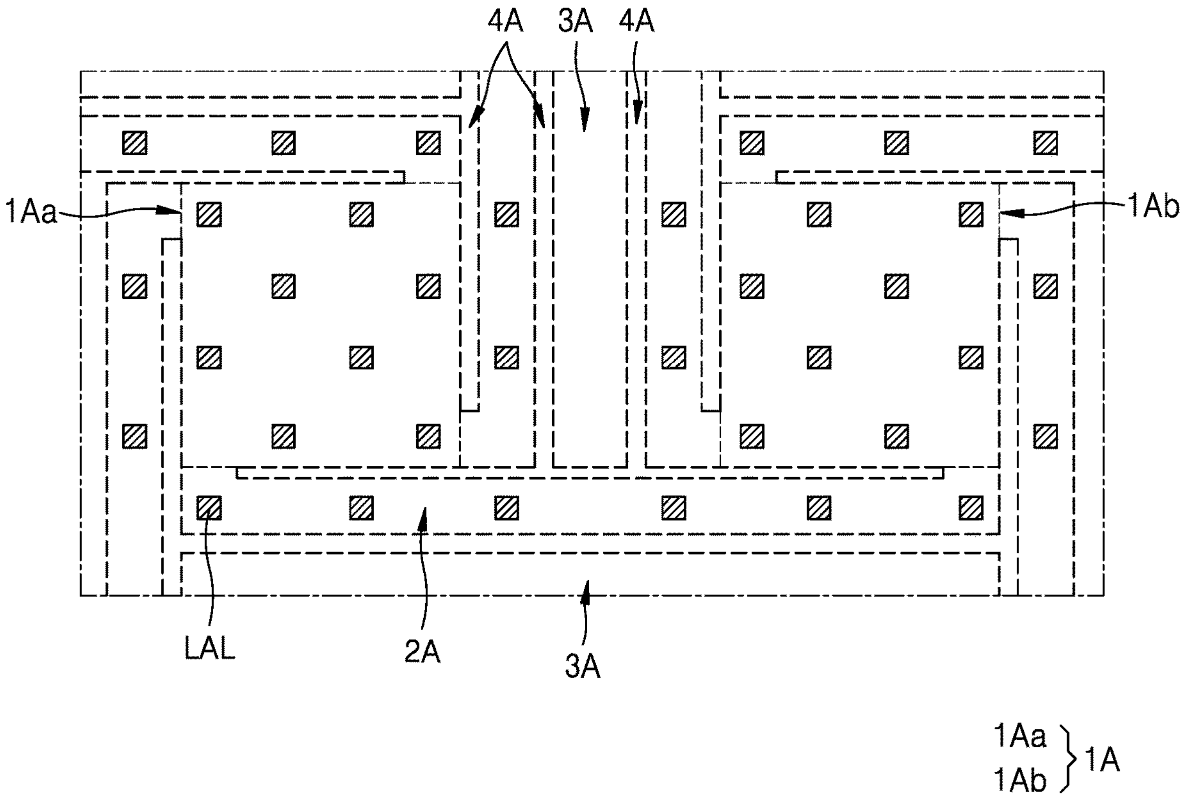

Referring to FIG. 32, the inorganic pattern layers LAL may overlap the display area 1A and the connection area 2A. Specifically, the inorganic pattern layers LAL may be regularly arranged to overlap the display area 1A and the connection area 2A.

Referring back to FIG. 13, the inorganic pattern layers LAL are formed on the carrier substrate SS in the display area 1A and/or the connection area 2A, and then the substrate layer 100 may be formed on an entirety of the display area 1A, the connection area 2A, the dummy area 3A, and the cut area 4A. In an embodiment, the substrate layer 100 may cover the blocking layer BL and the inorganic pattern layers LAL. In addition, as described above, the substrate layer 100 may include polymer resin.

Figure 14:
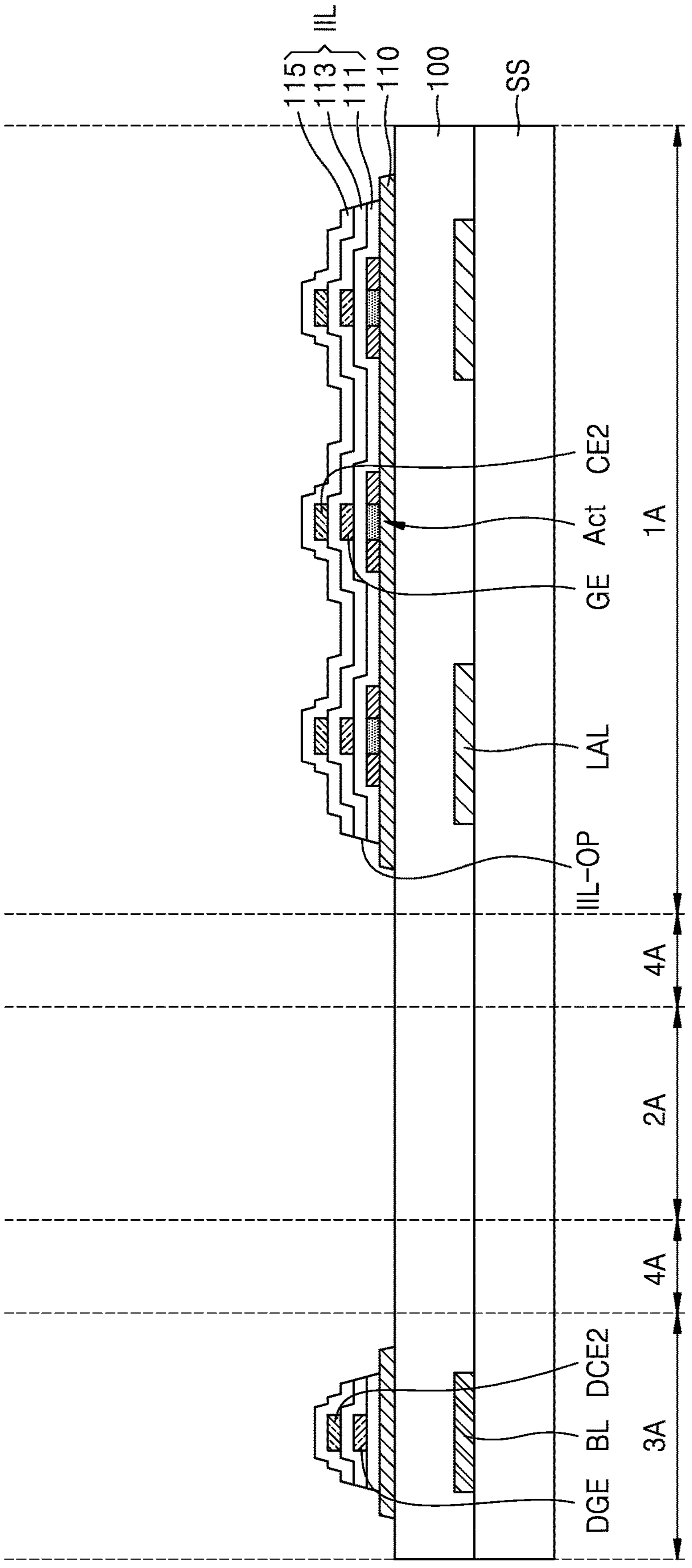

Referring to FIG. 14, the buffer layer 110 may be formed on the substrate layer 100 in the display area 1A and the dummy area 3A. The semiconductor layer Act may be formed on the buffer layer 110. In addition, the first insulating layer 111 may be formed on the semiconductor layer Act in the display area 1A and the buffer layer 110 in the dummy area 3A.

The gate electrode GE may be formed on the first insulating layer 111 in the display area 1A, and a dummy gate electrode DGE may be formed on the first insulating layer 111 in the dummy area 3A. In addition, the second insulating layer 113 may be formed on the gate electrode GE and the dummy gate electrode DGE. In an embodiment, the gate electrode GE and the dummy gate electrode DGE may be disposed in the same layer and may include the same material as each other.

The upper electrode CE2 may be formed on the second insulating layer 113 in the display area 1A, and a dummy upper electrode DCE2 may be formed on the second insulating layer 113 in the dummy area 3A. In addition, the third insulating layer 115 may be formed on the upper electrode CE2 and the dummy upper electrode DCE2. In an embodiment, the upper electrode CE2 and the dummy upper electrode DCE2 may be disposed in the same layer and may include the same material as each other.

As described with reference to FIG. 8, the first insulating layer 111, the second insulating layer 113, and the third insulating layer 115 may constitute the inorganic insulating layer IIL. That is, the inorganic insulating layer IIL may include the first insulating layer 111, the second insulating layer 113, and the third insulating layer 115. In addition, the opening IIL-OP corresponding to the connection area 2A may be defined in the inorganic insulating layer IIL. The opening IIL-OP may denote a region defined by removing a portion of the inorganic insulating layer IIL. The upper surface of the substrate layer 100 may be exposed through the opening IIL-OP.

Figure 15:
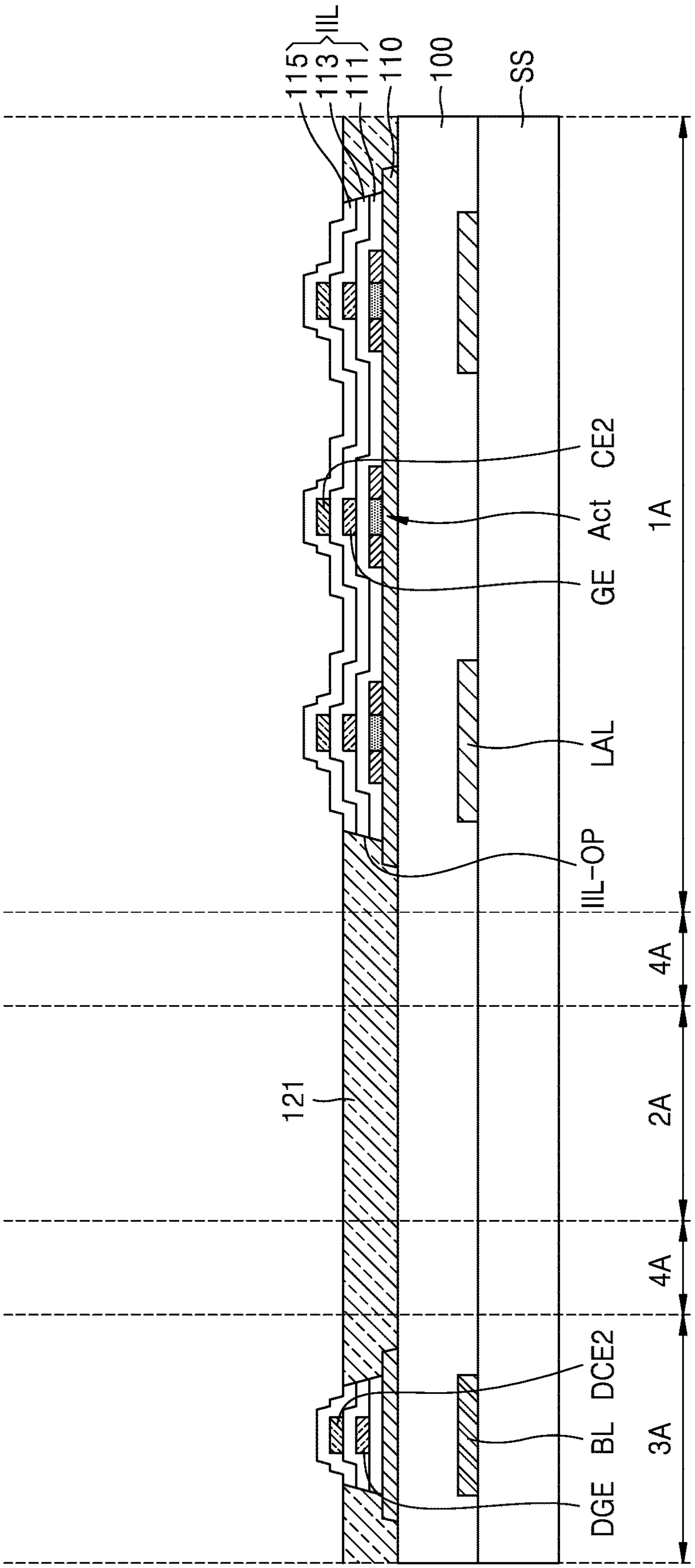

Referring to FIG. 15, an organic material layer 121 may be formed in a portion other than a portion where the inorganic insulating layer IIL is formed. The organic material layer 121 may be formed in the connection area 2A and the cut area 4A. In addition, the organic material layer 121 may be formed in also a portion of the display area 1A and a portion of the dummy area 3A. The organic material layer 121 may fill a step difference of the inorganic insulating layer IIL formed due to the opening IIL-OP.

Figure 16:
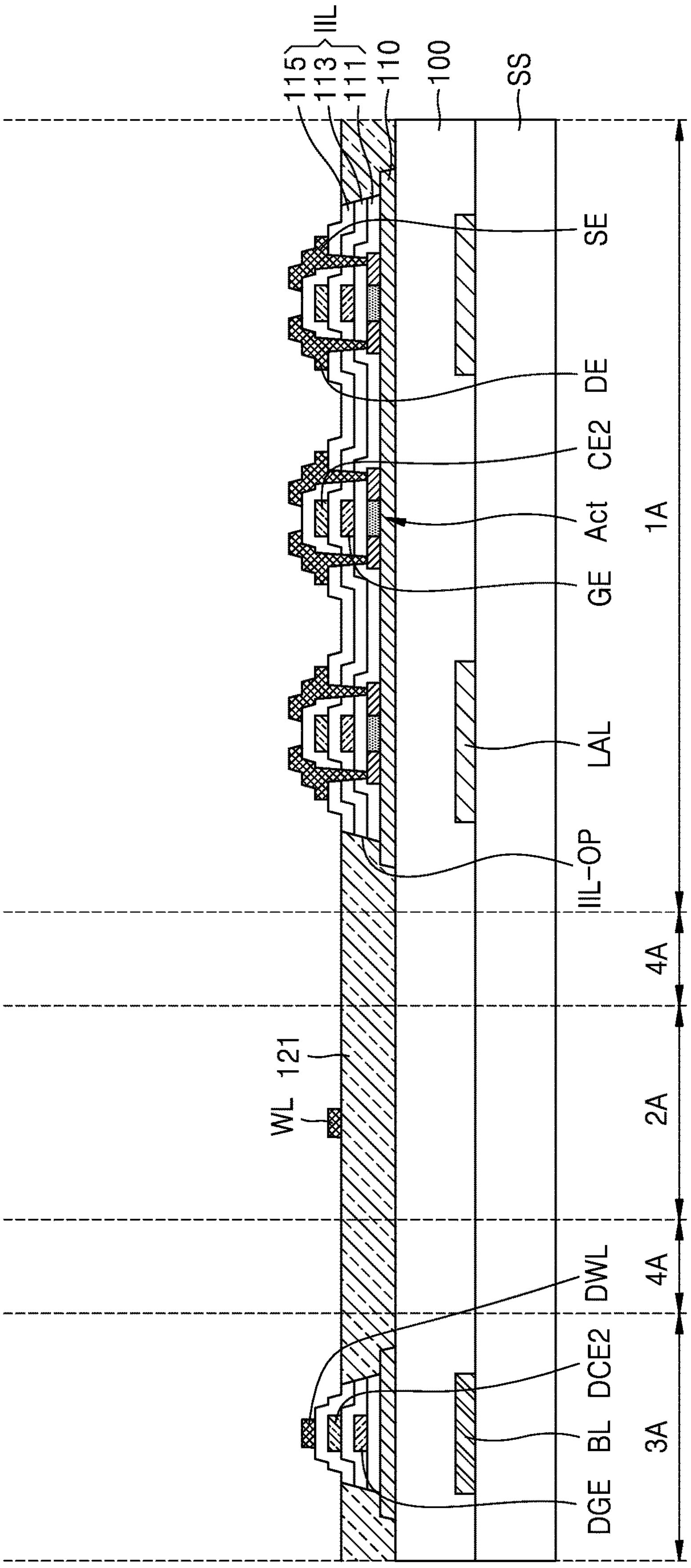

Referring to FIG. 16, the drain electrode DE or the source electrode SE may be formed in the display area 1A. In addition, the wiring WL may be formed in the connection area 2A, and a dummy wiring DWL may be formed in the dummy area 3A. The drain electrode DE, the source electrode SE, the wiring WL, and the dummy wiring DWL may be formed during the same process.

Figure 17:
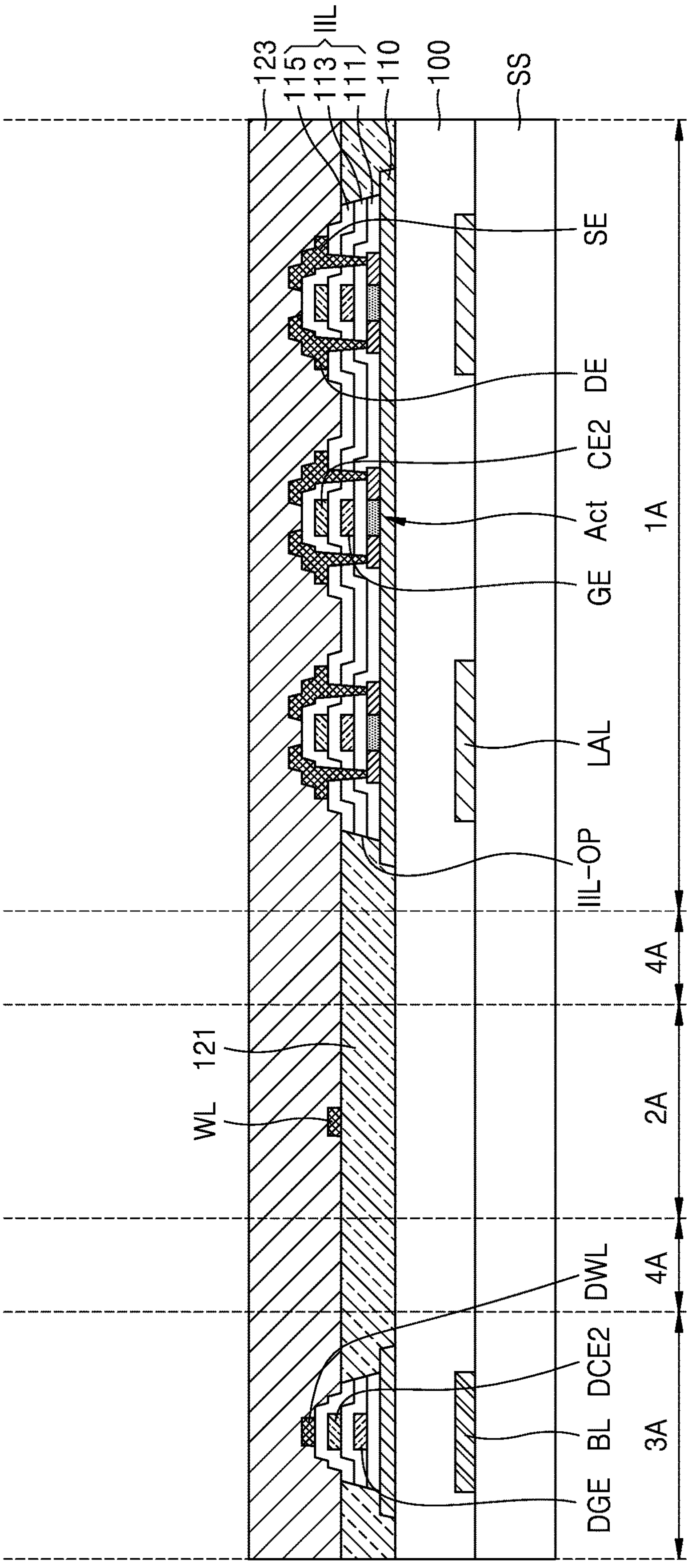
Figure 18:
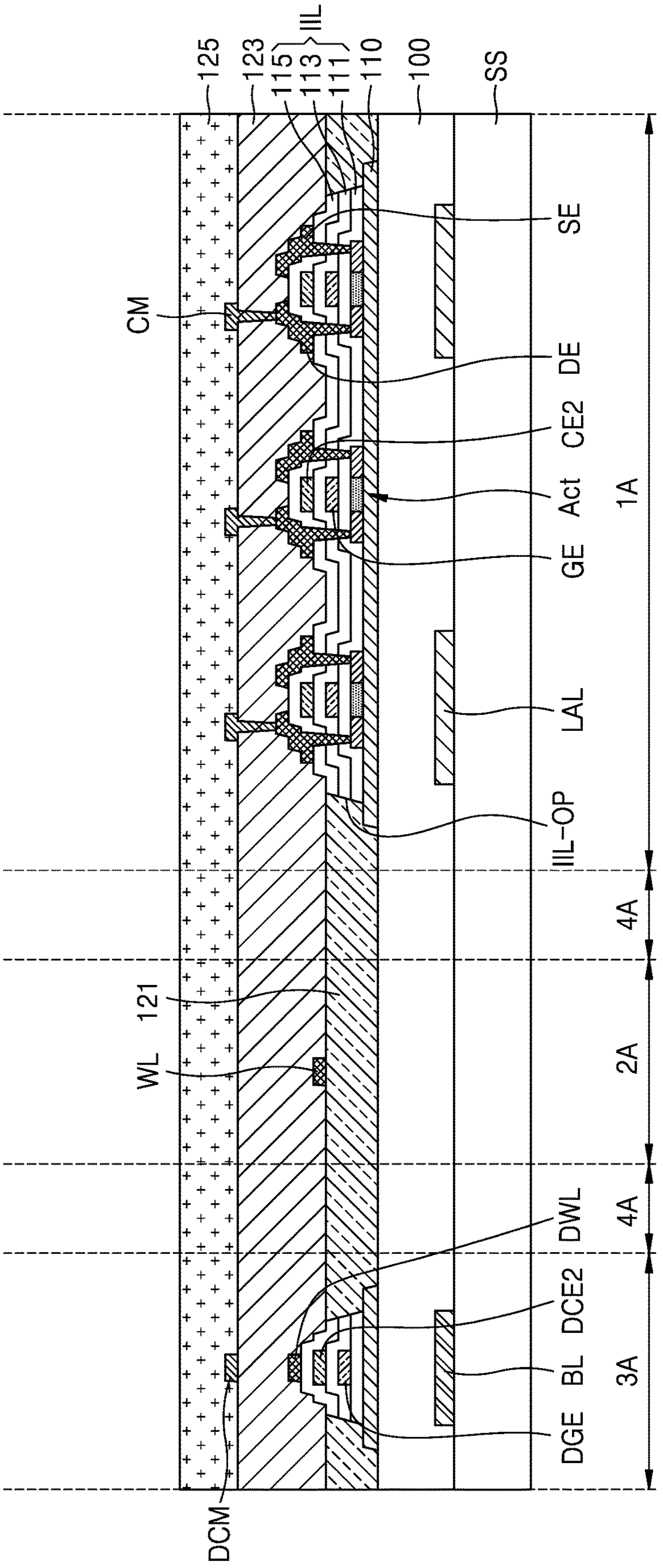

Referring to FIG. 17, the first organic insulating layer 123 may be formed in an entirety of the display area 1A, the connection area 2A, the dummy area 3A, and the cut area 4A. In addition, referring to FIG. 18, the connection metal CM may be formed on the first organic insulating layer 123 in the display area 1A, and a dummy connection metal DCM may be formed on the first organic insulating layer 123 in the dummy area 3A. The connection metal CM and the dummy connection metal DCM may be formed during the same process. Then, the second organic insulating layer 125 may be formed in an entirety of the display area 1A, the connection area 2A, the dummy area 3A, and the cut area 4A. Although not shown, a protective layer may be formed on the dummy connection metal DCM in the dummy area 3A.

Figure 19:
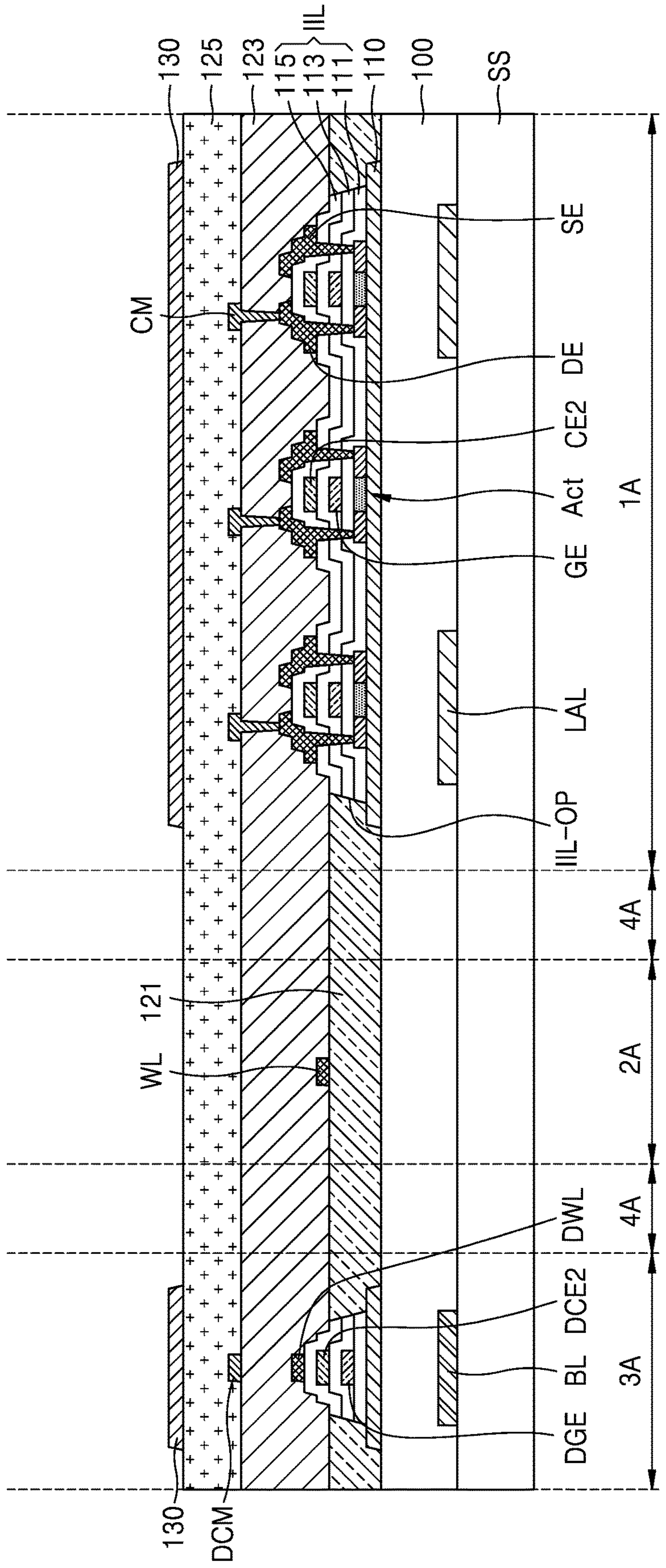

Referring to FIG. 19, the passivation layer 130 may be formed on the second organic insulating layer 125 in the display area 1A and the dummy area 3A. The passivation layer 130 may include a single layer or a multi-layer including an inorganic material such as silicon nitride ($SiN_x$) and/or silicon oxide ($SiO_2$).

Figure 20:
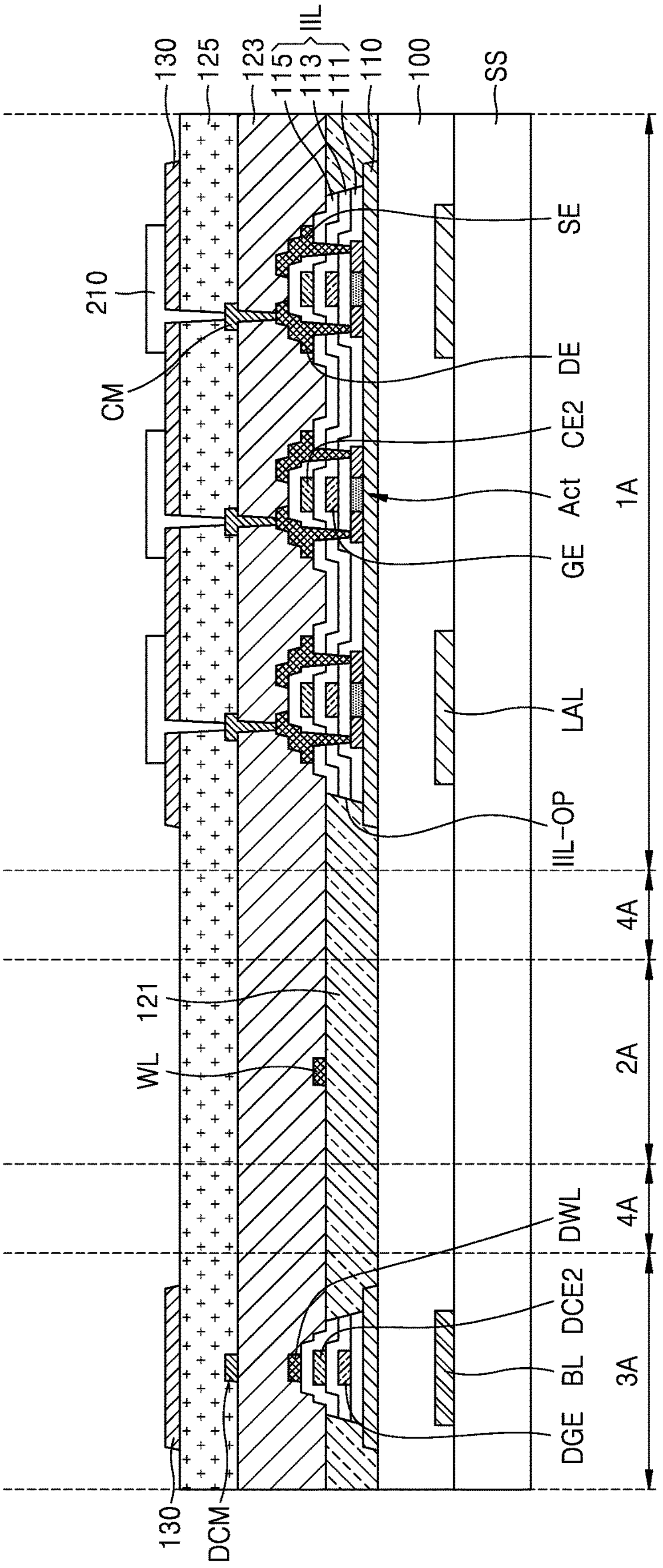
Figure 21:
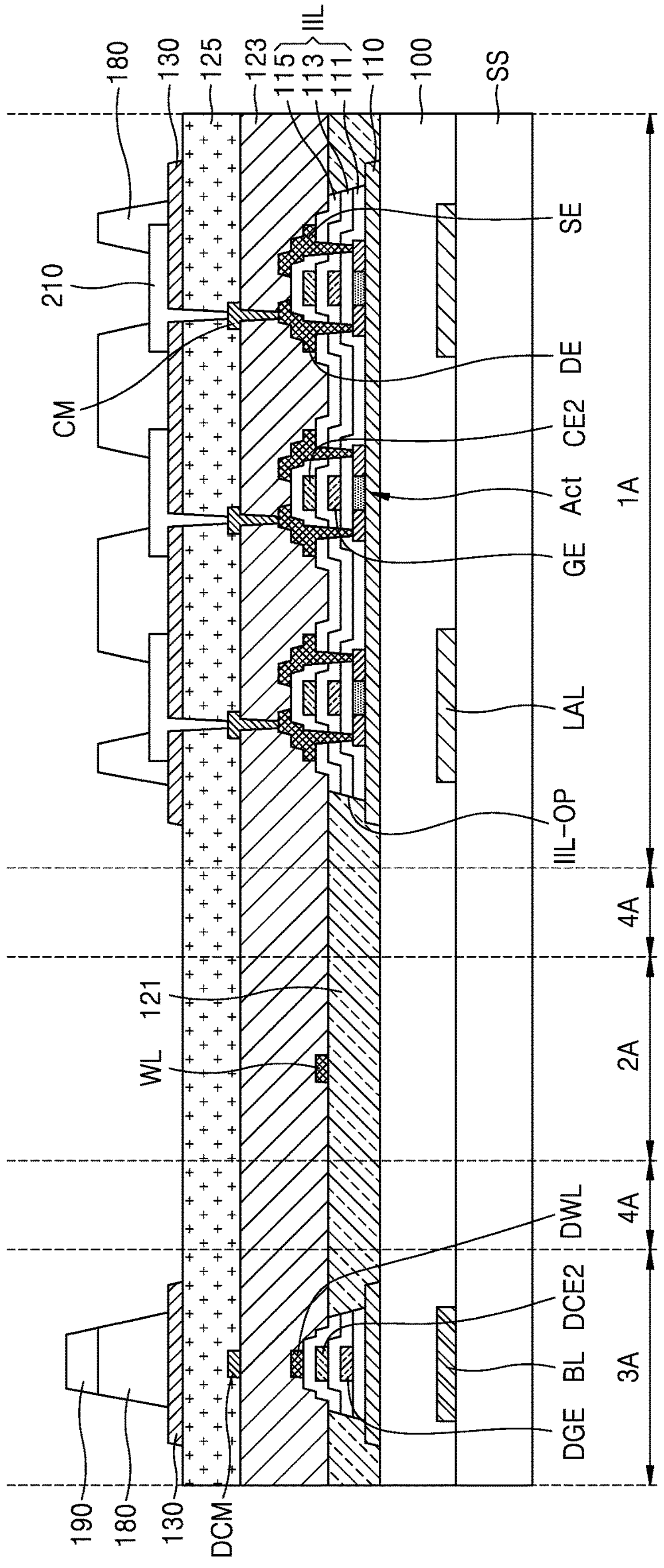

Referring to FIG. 20, the first electrode 210 may be formed on the passivation layer 130 in the display area 1A. Referring to FIG. 21, the pixel-defining layer 180 may be formed in the display area 1A and the dummy area 3A. The pixel-defining layer 180 formed in the display area 1A may expose at least a portion of the first electrode 210. In addition, a spacer 190 may be formed on the pixel-defining layer 180 in the dummy area 3A. Although not shown, the spacer 190 may be formed on also the pixel-defining layer 180 in the display area 1A.

The spacer 190 may include an organic material such as polyimide. In an alternative embodiment, the spacer 190 may include an inorganic insulating material such as silicon nitride ($SiN_x$) or silicon oxide ($SiO_2$), or include an organic insulating material and an inorganic insulating material.

In an embodiment, the spacer 190 may include a different material from a material of the pixel-defining layer 180. In an alternative embodiment, the spacer 190 includes the same material as a material of the pixel-defining layer 180. In this case, the pixel-defining layer 180 and the spacer 190 may be simultaneously formed during a mask process that uses a half-tone mask or the like.

Figure 22:
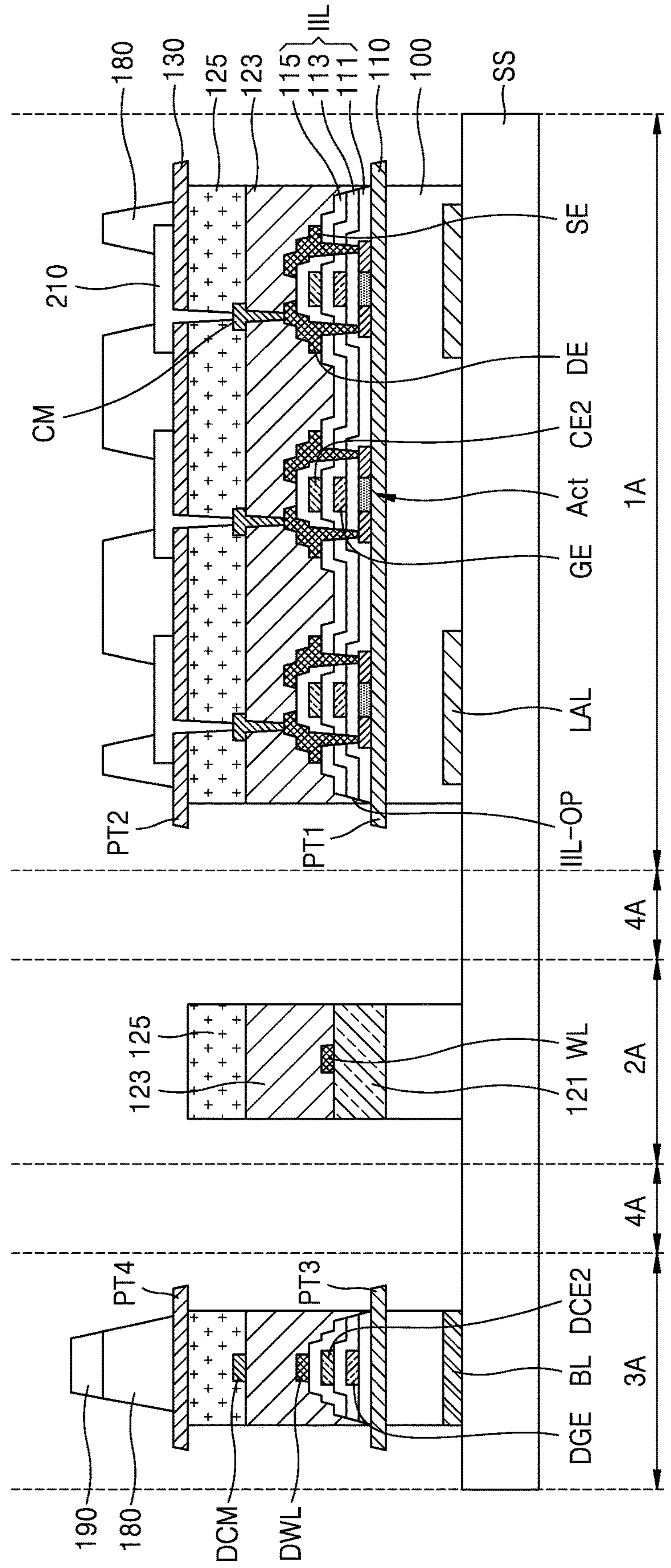

Referring to FIG. 22, at least a portion of the substrate layer 100, the organic material layer 121, the first organic insulating layer 123, and the second organic insulating layer 125 overlapping the cut area 4A may be removed. In other words, at least a portion of the substrate layer 100, the organic material layer 121, the first organic insulating layer 123, and the second organic insulating layer 125 in the cut area 4A may be removed. At least a portion of the substrate layer 100, the organic material layer 121, the first organic insulating layer 123, and the second organic insulating layer 125 may be removed through a dry etching process. Through this, the carrier substrate SS in the cut area 4A may be exposed.

In addition, at least a portion of the substrate layer 100, the organic material layer 121, the first organic insulating layer 123, and the second organic insulating layer 125 overlapping the display area 1A, the connection area 2A, and the dummy area 3A may be removed together. In other words, at least a portion of the substrate layer 100, the organic material layer 121, the first organic insulating layer 123, and the second organic insulating layer 125 in the display area 1A, the connection area 2A, and the dummy area 3A may be removed together. At least a portion of the substrate layer 100, the organic material layer 121, the first organic insulating layer 123, and the second organic insulating layer 125 may be removed through a dry etching process.

In an embodiment, while at least a portion of the substrate layer 100, the organic material layer 121, the first organic insulating layer 123, and the second organic insulating layer 125 in the display area 1A (or the cut area 4A) is removed, an end (e.g., the first tip PT1) protruding toward the cut area 4A may be formed on the buffer layer 110 in the display area 1A. In addition, while at least a portion of the substrate layer 100, the organic material layer 121, the first organic insulating layer 123, and the second organic insulating layer 125 in the display area 1A (or the cut area 4A) is removed, an end (e.g., the second tip PT2) protruding toward the cut area 4A may be formed on the passivation layer 130 in the display area 1A.

In addition, while at least a portion of the substrate layer 100, the organic material layer 121, the first organic insulating layer 123, and the second organic insulating layer 125 in the dummy area 3A (or the cut area 4A) is removed, an end (e.g., a third tip PT3) protruding toward the cut area 4A may be formed on the buffer layer 110 in the dummy area 3A. In addition, while at least a portion of the substrate layer 100, the organic material layer 121, the first organic insulating layer 123, and the second organic insulating layer 125 in the dummy area 3A (or the cut area 4A) is removed, an end (e.g., a fourth tip PT4) protruding toward the cut area 4A may be formed on the passivation layer 130 in the dummy area 3A.

Figure 23:
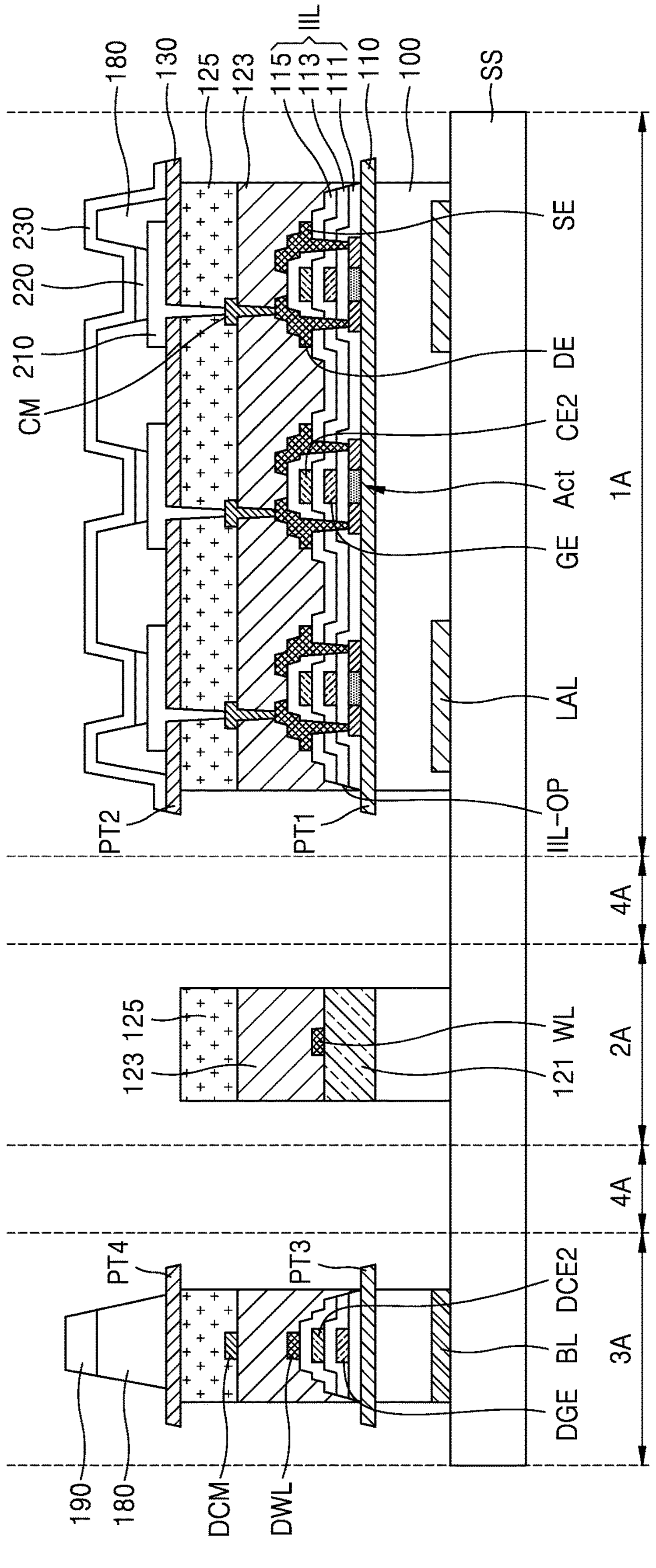

Referring to FIG. 23, the emission layer 220 may be formed on the first electrode 210 in the display area 1A, and the second electrode 230 may be formed on the emission layer 220. Although not shown, the first functional layer and the second functional layer may be formed under and on the emission layer 220. In addition, although not shown, the first functional layer, the second functional layer, and/or the second electrode 230 may be formed in not only the display area 1A but also an entirety of the connection area 2A, the dummy area 3A, and/or the cut area 4A. In an embodiment, the first functional layer, the second functional layer, and/or the second electrode 230 may be formed in the display area 1A and the connection area 2A. In an alternative embodiment, the first functional layer, the second functional layer, and/or the second electrode 230 may be formed in the display area 1A, the connection area 2A, the dummy area 3A, and/or the cut area 4A.

Figure 24:
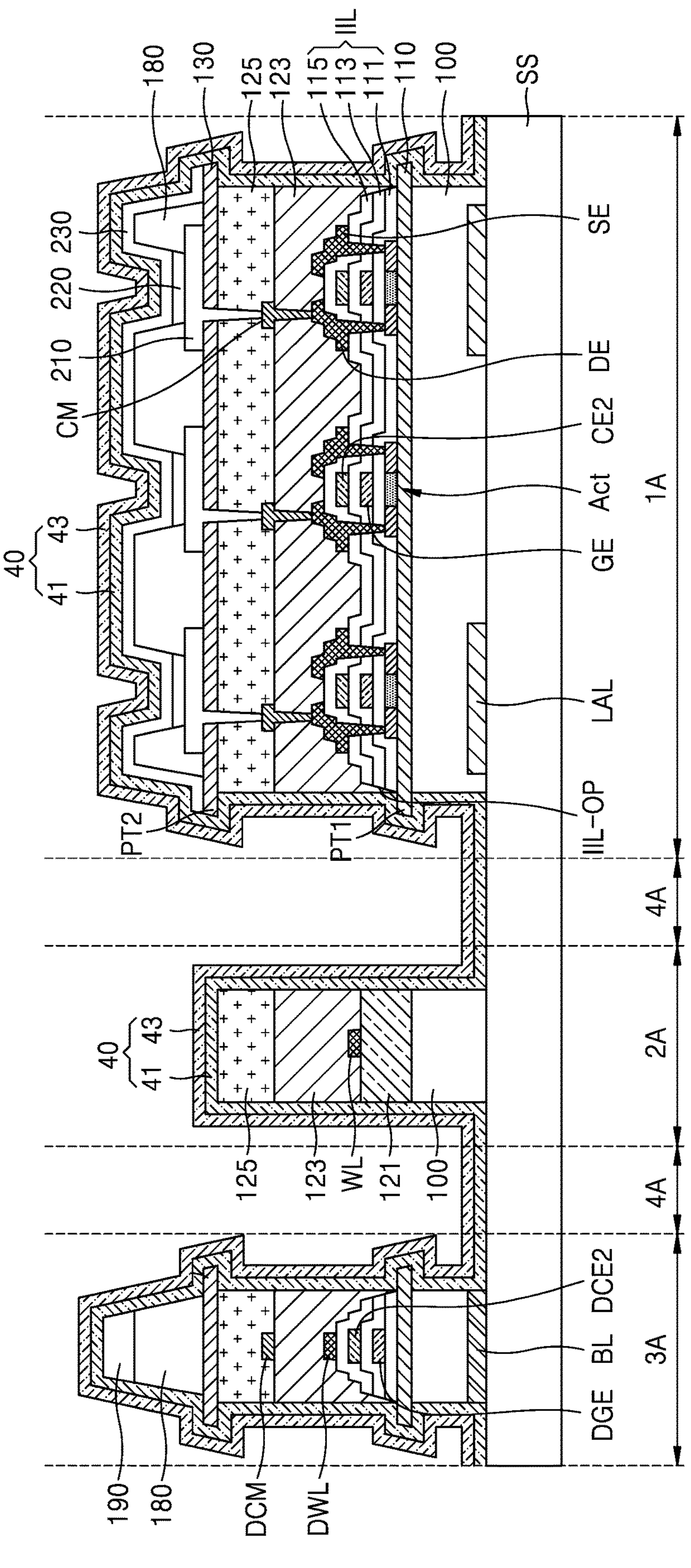

Referring to FIG. 24, the encapsulation layer 40 may be formed in an entirety of the display area 1A, the connection area 2A, the dummy area 3A, and the cut area 4A. As described above, the encapsulation layer 40 may include at least one inorganic layer. In an alternative embodiment, though not shown, the encapsulation layer 40 may include at least one inorganic layer and at least one organic layer.

In an embodiment, the encapsulation layer 40 may include the first inorganic layer 41 and the second inorganic layer 43. Both the first inorganic layer 41 and the second inorganic layer 43 may include an inorganic material.

Figure 25:
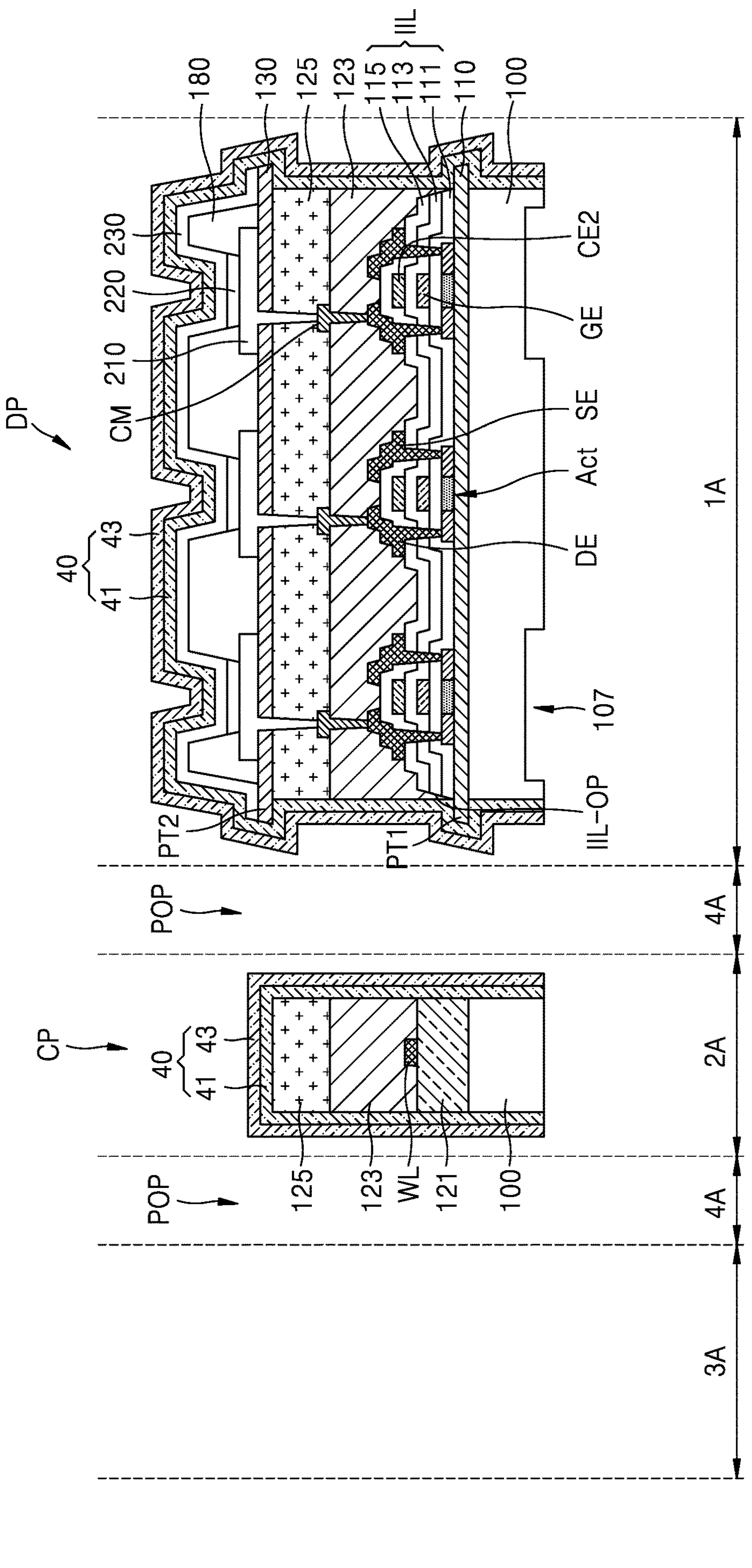

Referring to FIG. 25, the substrate layer 100 may be detached from the carrier substrate SS. In an embodiment, the substrate layer 100 may be detached from the carrier substrate SS according to a laser release method of irradiating a laser beam to the substrate layer 100. The laser beam may be irradiated in a direction from the rear surface of the carrier substrate SS to the upper surface of the carrier substrate SS. Accordingly, the laser beam may be irradiated to the rear surface of the substrate layer 100 facing the upper surface of the carrier substrate SS. As the laser beam, an excimer laser beam having a wavelength of about 308 nanometer (nm), and a solid-state ultra-violet ("UV") laser beam having a wavelength of about 343 nm or a wavelength of about 355 nm may be used, for example.

In an embodiment, because the blocking layer BL is disposed on the carrier substrate SS in the dummy area 3A, the substrate layer 100 in the dummy area 3A may not be detached from the carrier substrate SS. Accordingly, the display panel may not include elements arranged in the dummy area 3A.

In addition, in an embodiment, the inorganic pattern layer LAL may include a material having relatively low adhesive force. Accordingly, in an operation of separating the substrate layer 100, the substrate layer 100 may be separated from the inorganic pattern layer LAL. In this case, the concave portion 107 in which the inorganic pattern layer LAL is disposed may be formed in the rear surface of the substrate layer 100.

During an operation of separating the substrate layer 100 from the carrier substrate SS by irradiating a laser beam to the rear surface of the carrier substrate SS, gas may occur while the substrate layer 100 is decomposed. There was a case where the encapsulation layer 40 is de-filmed due to the pressure of the occurred gas. Specifically, there was a case where stress due to the pressure of gas occurring while the substrate layer 100 is decomposed is transferred up to the encapsulation layer 40 and the encapsulation layer 40 de-film.

In the case where the substrate layer 100 includes a double layer, stress due to the pressure of gas is dispersed to the double layer of the substrate layer 100 and the encapsulation layer 40 may be prevented from de-filming. However, in the case where the substrate layer 100 includes a double layer, the thickness of the substrate layer 100 is too thick and a transformation rate of the substrate layer 100 in a vertical direction may be reduced.

It is preferable that the substrate layer 100 is completely detached from the carrier substrate SS during the operation of separating the substrate layer 100 from the carrier substrate SS by irradiating a laser beam to the rear surface of the carrier substrate SS, but there may be a portion of the substrate layer 100 not detached from the carrier substrate SS due to scratches, foreign substance, or the like. In this case, a portion of the substrate layer 100 not detached should be detached from the carrier substrate SS using the pressure of gas occurring while the substrate layer 100 is decomposed due to a laser beam. The gas occurring while the substrate layer 100 is decomposed may escape into the cut area 4A and the pressure of the gas is too low, so that the substrate layer 100 that is not detached from the carrier substrate SS may remain.

In the case where power (or energy density) of the laser beam is increased to facilitate the substrate layer 100 from being detached from the carrier substrate SS, the decomposition rate of the substrate layer 100 may increase, and the pressure due to the gas occurring while the substrate layer 100 is decomposed increases and a delamination defect rate of the encapsulation layer 40 may increase.

In contrast, in the case where power (or energy density) of the laser beam is reduced, there may be a portion of the substrate layer 100 that is not decomposed, and stress may be concentrated to the portion of the substrate layer 100 that is not decomposed, and thus, a defect may occur in the wiring WL or a delamination defect rate of the encapsulation layer 40 may increase.

Accordingly, it is desired to detach the substrate layer 100 from the carrier substrate SS at relatively low power (or energy density) by adjusting an interface adhesive characteristic between the carrier substrate SS and the substrate layer 100.

In an embodiment, the gas occurring while the substrate layer 100 is decomposed escapes into the cut area 4A is prevented by forming the inorganic pattern layer LAL between the carrier substrate SS and the substrate layer 100. Accordingly, a portion of the substrate layer 100 that is not decomposed may be decomposed using the pressure of the gas occurring while the substrate layer 100 is decomposed. Through this, the substrate layer 100 may be easily detached from the carrier substrate SS.

Specifically, in the case where the inorganic pattern layer LAL extending along the circumference of the display area 1A and having a closed loop shape is formed between the carrier substrate SS and the substrate layer 100, the gas occurring while the substrate layer 100 is decomposed may not escape into the cut area 4A and be confined inside the inorganic pattern layer LAL. Because the gas occurring while the substrate layer 100 is decomposed does not escape into the cut area 4A and is confined inside the inorganic pattern layer LAL, the pressure of the gas inside the inorganic pattern layer LAL may increase and a portion of the substrate layer 100 that is not decomposed is decomposed due to the pressure of the gas, and thus, non-detachment defects may be prevented from occurring.

In addition, because the inorganic pattern layer LAL includes a material having relatively low adhesive force with the substrate layer 100, the substrate layer 100 may be easily detached from the inorganic pattern layer LAL. While the substrate layer 100 is easily detached from the inorganic pattern layer LAL, the concave portion 107 may be formed in a portion in which the inorganic pattern layer LAL is disposed (or provided). In an embodiment, the concave portion 107 may be formed in a position in which the inorganic pattern layer LAL is formed. In addition, the shape of the concave portion 107 may correspond to the shape of the inorganic pattern layer LAL.

In an embodiment having the above configuration, the display apparatus with improved flexibility may be implemented. However, the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A method of manufacturing a display apparatus, the method comprising:

preparing a carrier substrate including a display area, a connection area, a dummy area, and a cut area;

forming inorganic pattern layers in the display area or the connection area of the carrier substrate;

forming a substrate layer on the inorganic pattern layers;

forming a first insulating layer on the substrate layer;

removing the first insulating layer and the substrate layer arranged in the cut area; and separating the substrate layer from the carrier substrate, wherein the inorganic pattern layers overlap at least one of the display area and the connection area.

2. The method of claim 1, wherein the inorganic pattern layers include a first inorganic pattern layer, and the first inorganic pattern layer overlaps the display area, extends along a circumference of the display area, and is provided in a closed loop shape.

3. The method of claim 1, wherein at least two of the inorganic pattern layers overlap the display area.

4. The method of claim 1, further comprising, between the forming the inorganic pattern layers and the forming the substrate layer, plasma-treating the inorganic pattern layers.

5. The method of claim 1, further comprising, between the preparing the carrier substrate and the forming the inorganic pattern layers, forming a blocking layer in the dummy area of the carrier substrate.

6. The method of claim 1, further comprising, between the forming the first insulating layer and the removing the first insulating layer and the substrate layer arranged in the cut area:

forming a first electrode on the first insulating layer in the display area; and forming a pixel-defining layer in a portion of the display area and a portion of the dummy area.

7. The method of claim 6, further comprising, after the removing the first insulating layer and the substrate layer arranged in the cut area:

forming an emission layer on the first electrode; and forming a second electrode on the emission layer.

8. The method of claim 7, further comprising, after the forming the second electrode on the emission layer, forming an encapsulation layer on the second electrode.

9. The method of claim 8, wherein the encapsulation layer is formed in an entirety of the display area, the connection area, the dummy area, and the cut area, and the encapsulation layer includes a first inorganic layer and a second inorganic layer.

10. The method of claim 1, wherein the separating the substrate layer includes irradiating a laser beam to a rear surface of the carrier substrate and separating the substrate layer from the carrier substrate, and in the separating the substrate layer, the substrate layer is separated from an inorganic pattern layer of the inorganic pattern layers.

11. A display apparatus including a display panel in which a penetration-opening is defined, the display apparatus comprising:

a substrate layer including a first display portion, a second display portion, and a connection portion extending to the first display portion and the second display portion;

a pixel disposed on the first display portion; and a wiring disposed on the connection portion, wherein concave portions are provided in a rear surface of the substrate layer, and the concave portions overlap at least one of the first display portion, the second display portion, and the connection portion, wherein the concave portions include a first concave portion, and the first concave portion overlaps the first display portion, extends along a circumference of the first display portion.

12. The display apparatus of claim 11, wherein the first concave portion is provided in a closed loop shape.

13. The display apparatus of claim 11, wherein at least two of the concave portions overlap the first display portion.

14. The display apparatus of claim 11, further comprising a first insulating layer disposed on the substrate layer of the first display portion and including a first tip protruding toward the penetration-opening.

15. The display apparatus of claim 14, further comprising:

a second insulating layer disposed on the first insulating layer; and a third insulating layer disposed on the second insulating layer and including a second tip protruding toward the penetration-opening.

16. The display apparatus of claim 11, further comprising an encapsulation layer disposed on the first display portion, the second display portion, and the connection portion.

17. The display apparatus of claim 16, wherein the encapsulation layer includes a first inorganic layer and a second inorganic layer.

18. A display apparatus including a display panel in which a penetration-opening is defined, the display apparatus comprising:

a substrate layer including a first display portion, a second display portion, and a connection portion extending to the first display portion and the second display portion;

a pixel disposed on the first display portion; and a wiring disposed on the connection portion, wherein concave portions are provided in a rear surface of the substrate layer, and the concave portions overlap at least one of the first display portion, the second display portion, and the connection portion, wherein the concave portions include a first concave portion and a second concave portion, the first concave portion overlaps the first display portion, and extends along a circumference of the first display portion, and the second concave portion overlaps the first display portion, and extends along the circumference of the first display portion.

* * * * *